(12) United States Patent
Gladwin et al.

(10) Patent No.: US 9,819,447 B2
(45) Date of Patent: Nov. 14, 2017

(54) STORING A DATA STREAM IN A SET OF STORAGE DEVICES

(71) Applicant: International Business Machines Corporation, Armonk, NY (US)

(72) Inventors: S. Christopher Gladwin, Chicago, IL (US); Timothy W. Markison, Mesa, AZ (US); Greg Dhuse, Chicago, IL (US); Thomas Franklin Shirley, Jr., Wauwatosa, WI (US); Wesley Leggette, Chicago, IL (US); Jason K. Resch, Chicago, IL (US); Gary W. Grube, Barrington Hills, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/017,991

(22) Filed: Feb. 8, 2016

(65) Prior Publication Data

US 2016/0156433 A1 Jun. 2, 2016

Related U.S. Application Data

(63) Continuation of application No. 13/919,673, filed on Jun. 17, 2013, now Pat. No. 9,258,177.
(Continued)

(51) Int. Cl.
*G06F 11/00* (2006.01)
*H04L 1/00* (2006.01)
(Continued)

(52) U.S. Cl.
CPC ............ *H04L 1/0076* (2013.01); *G06F 3/064* (2013.01); *G06F 3/067* (2013.01); *G06F 3/0619* (2013.01);
(Continued)

(58) Field of Classification Search
CPC ............ G06F 11/1076; G06F 11/2053; G06F 3/0619; G06F 3/064; G06F 3/067;
(Continued)

(56) References Cited

U.S. PATENT DOCUMENTS

2002/0166079 A1* 11/2002 Ulrich .................. G06F 9/5083
714/6.12
2009/0094318 A1* 4/2009 Gladwin ............. H04L 67/1097
709/203

(Continued)

*Primary Examiner* — Yair Leibovich
(74) *Attorney, Agent, or Firm* — Garlick & Markison; Timothy W. Markison

(57) ABSTRACT

A method includes generating, by execution units, a plurality of sets of a decode threshold number of encoded data slices from data streams. A first execution unit produces a first encoded data slice for each set of the plurality of sets of the decode threshold number of encoded data slices from a first data stream. The method further includes generating, by at least some of the execution units, a plurality of sets of partially encoded data slices from the plurality of a sets of a decode number of encoded data slices. When partially encoded data slices are processed, the processed partially encoded data slices represent redundancy encoded data slices. The decode threshold number of encoded data slices combined with the redundancy encoded data slices forms a full set of encoded data slices. The method further includes sending the partially encoded data slices to other execution units for storage therein.

16 Claims, 53 Drawing Sheets

Related U.S. Application Data

(60) Provisional application No. 61/679,000, filed on Aug. 2, 2012.

(51) Int. Cl.

| | | |
|---|---|---|
| *G06F 11/20* | (2006.01) | |
| *H04L 29/08* | (2006.01) | |
| *G06F 11/10* | (2006.01) | |
| *H03M 13/05* | (2006.01) | |
| *G06F 3/06* | (2006.01) | |
| *H04L 29/14* | (2006.01) | |
| *H03M 13/00* | (2006.01) | |

(52) U.S. Cl.
CPC ...... *G06F 11/1076* (2013.01); *G06F 11/2053* (2013.01); *H03M 13/05* (2013.01); *H04L 67/1097* (2013.01); *H03M 13/611* (2013.01); *H04L 69/40* (2013.01)

(58) Field of Classification Search
CPC ... H04L 1/0076; H04L 67/1097; H04L 69/40; H04L 29/08549; H03M 13/05; H03M 13/611
USPC .......................................................... 714/6.2

See application file for complete search history.

(56) References Cited

U.S. PATENT DOCUMENTS

| | | | |
|---|---|---|---|
| 2010/0268692 A1* | 10/2010 | Resch ................ | G06F 11/1044 707/687 |
| 2011/0029524 A1* | 2/2011 | Baptist ............... | G06F 11/1076 707/737 |
| 2011/0078080 A1* | 3/2011 | Grube ................ | G06F 11/1076 705/44 |
| 2011/0182424 A1* | 7/2011 | Grube ................ | G06F 11/1076 380/43 |
| 2012/0137095 A1* | 5/2012 | Grube ................ | G06F 12/0638 711/162 |
| 2013/0013960 A1* | 1/2013 | Gladwin ............. | G06F 11/1084 714/6.3 |
| 2013/0086450 A1* | 4/2013 | Grube ................ | H03M 13/616 714/763 |
| 2013/0151581 A1* | 6/2013 | Leggette ............. | H04L 67/10 709/201 |
| 2013/0232378 A1* | 9/2013 | Resch ................. | G06F 21/64 714/6.24 |
| 2013/0238932 A1* | 9/2013 | Resch ................. | G06F 21/64 714/20 |
| 2014/0026017 A1* | 1/2014 | Grube ................ | G06F 17/30194 714/770 |
| 2014/0040417 A1* | 2/2014 | Gladwin ............. | G06F 11/2053 709/214 |
| 2014/0331085 A1* | 11/2014 | Dhuse ................ | G06F 11/1076 714/6.24 |
| 2014/0331100 A1* | 11/2014 | Dhuse ................ | G06F 21/64 714/752 |
| 2014/0337684 A1* | 11/2014 | Resch ................. | G06F 11/10 714/763 |
| 2016/0342464 A1* | 11/2016 | Motwani ............ | G06F 11/1044 |

* cited by examiner

DST allocation info 242 | data partition info 320: ⓦ data ID; No. of partitions; Addr. info for each partition; format conversion indication

| | task execution info 322 | | | intermediate result info 324 | | |
|---|---|---|---|---|---|---|
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 &<br>1_5 | R1-1_1 - R1-1_z &<br>R1-5_1 - R1-5_z | 1_2, 2_2, 3_2, 4_2, & 5_2 | R1-6 | DST unit 2 | DST unit 2 | DST units 2-6 |
| 1_7 | after 1_2 &<br>1_5 | R1-2_1 - R1-2_z &<br>R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

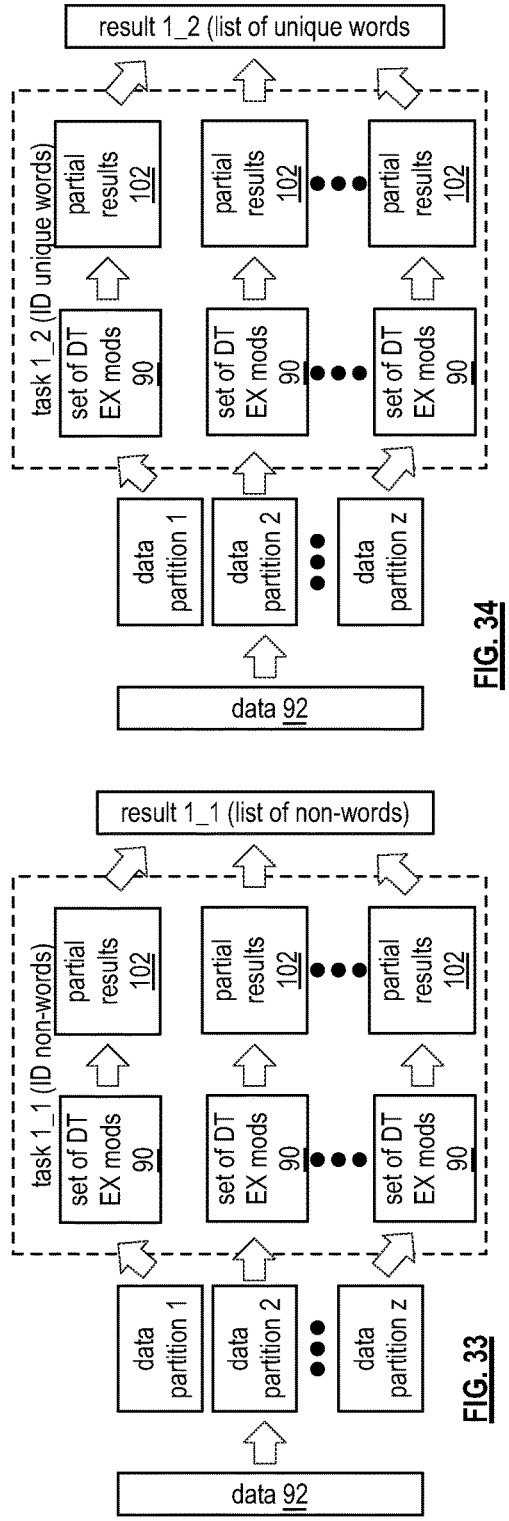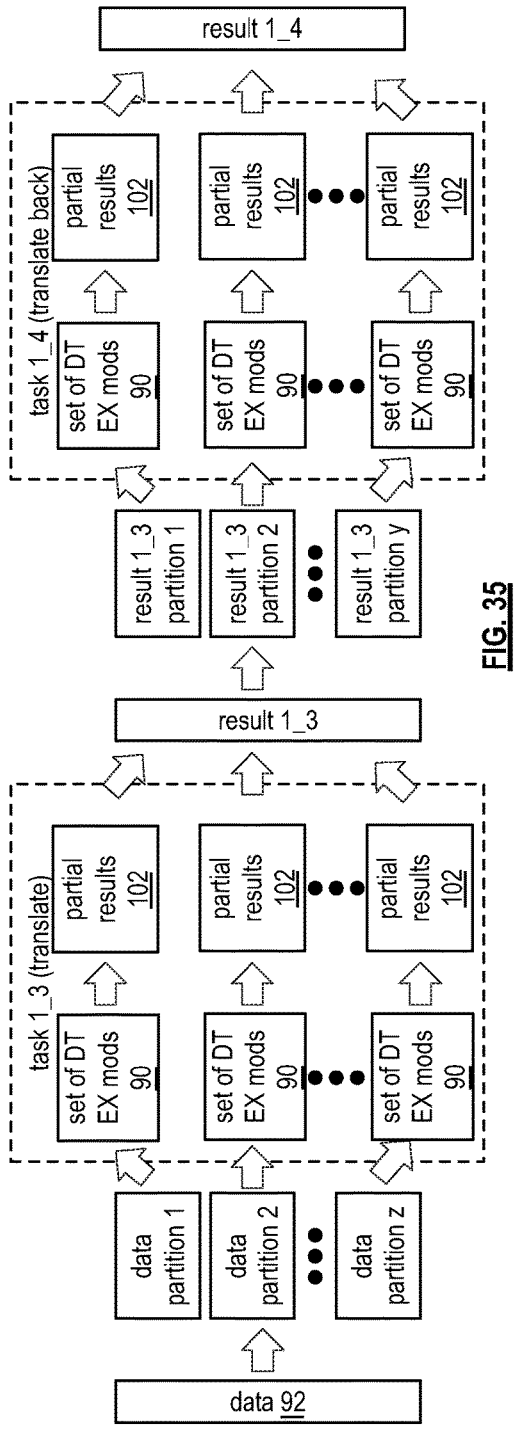

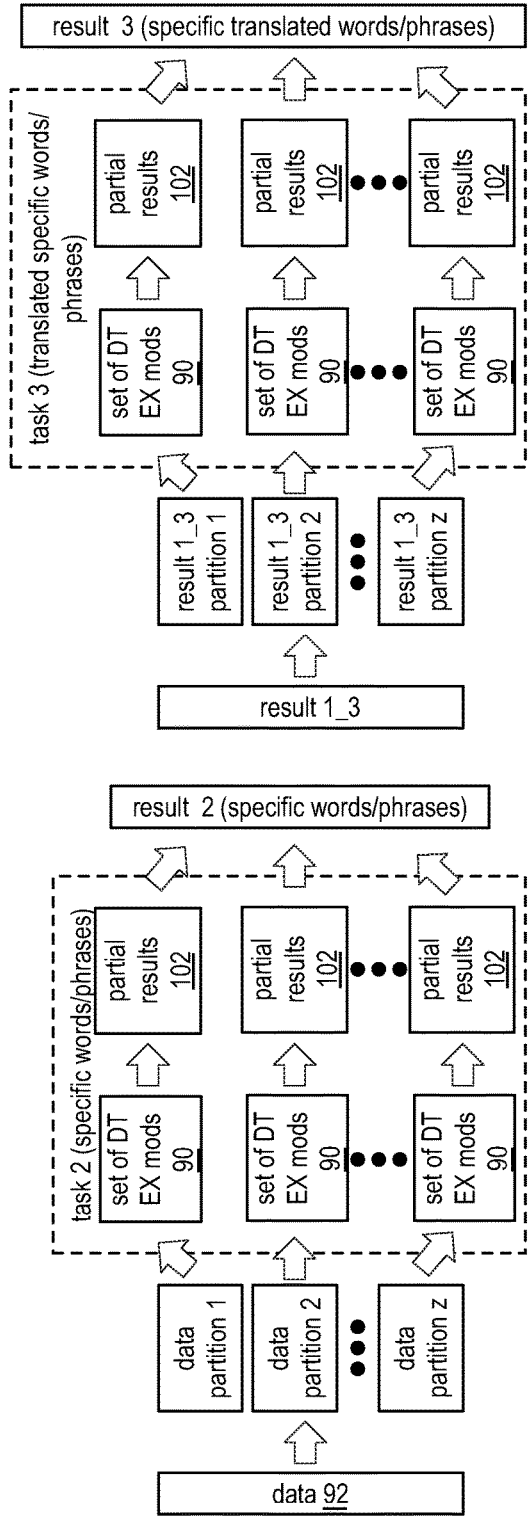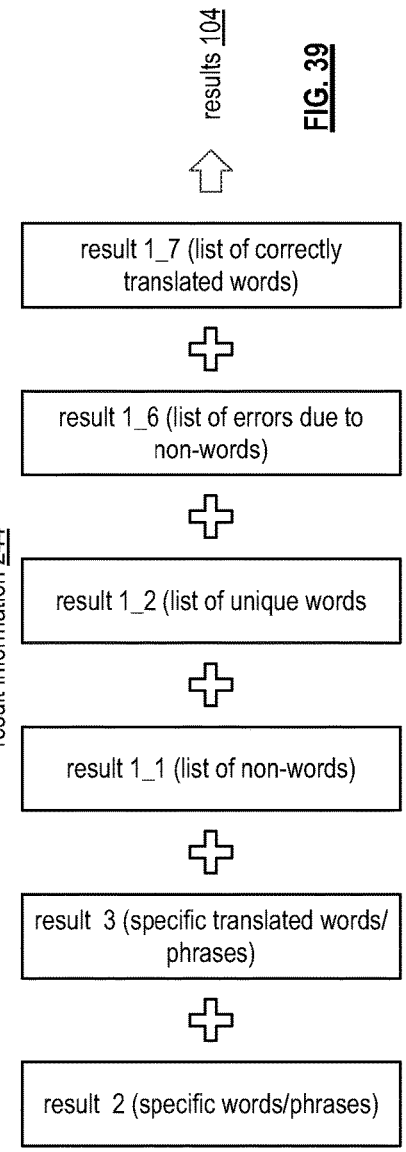

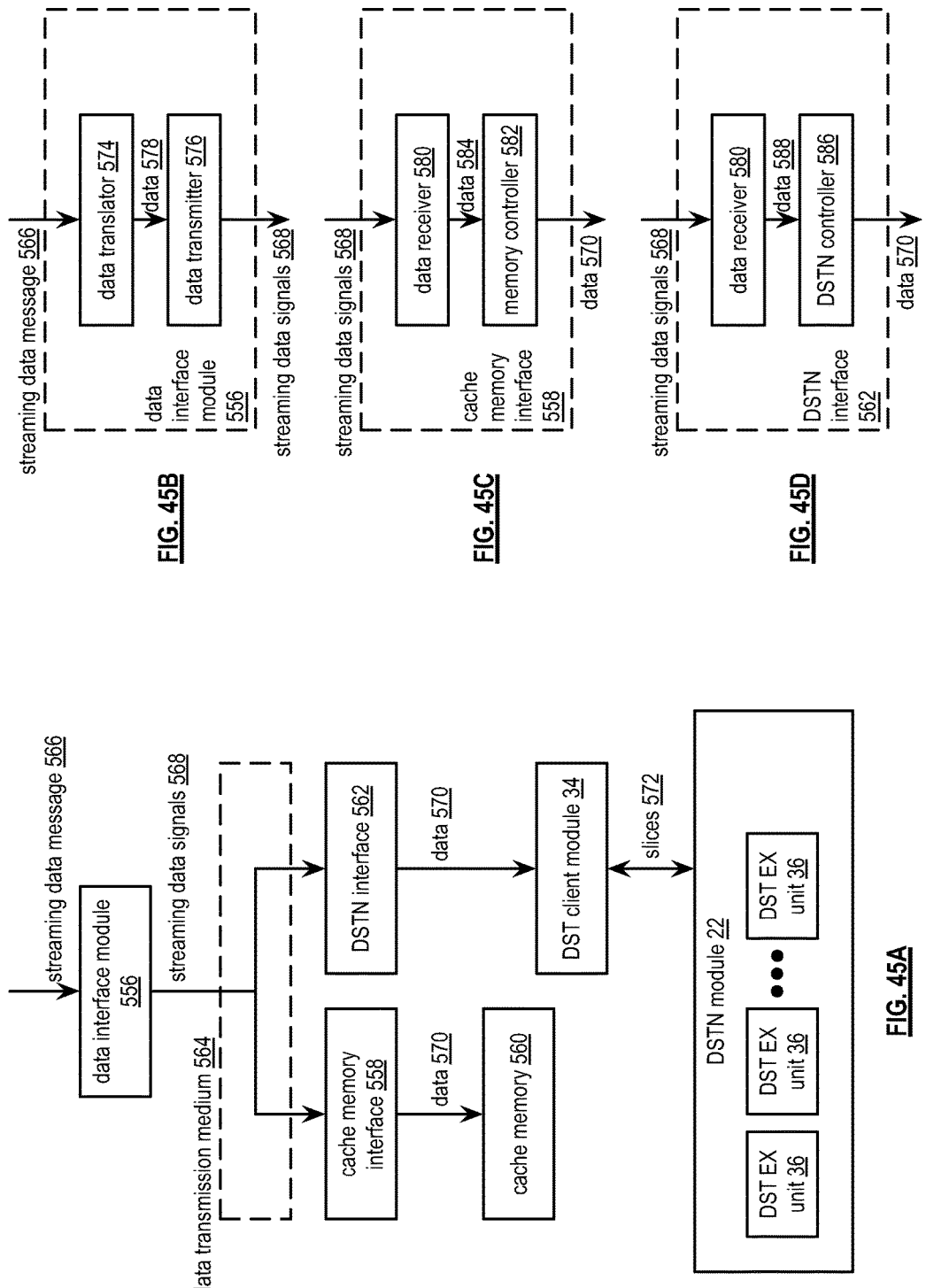

US 9,819,447 B2

STORING A DATA STREAM IN A SET OF STORAGE DEVICES

CROSS REFERENCE TO RELATED PATENTS

The present U.S. Utility patent application claims priority pursuant to 35 U.S.C. §120 as a continuation of U.S. Utility application Ser. No. 13/919,673, entitled "STORING A DATA STREAM IN A SET OF STORAGE DEVICES", filed Jun. 17, 2013, which claims priority pursuant to 35 U.S.C. §119(e) to U.S. Provisional Application No. 61/679,000, entitled "PERFORMANCE OPTIMIZATION OF A DISTRIBUTED STORAGE AND TASK NETWORK", filed Aug. 2, 2012, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc., on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 45A is a schematic block diagram of another embodiment of a distributed computing system in accordance with the present invention;

FIG. 45B is a schematic block diagram of an embodiment of a data interface module in accordance with the present invention;

FIG. 45C is a schematic block diagram of an embodiment of a cache memory interface in accordance with the present invention;

FIG. 45D is a schematic block diagram of an embodiment of a distributed storage and task network (DSTN) interface in accordance with the present invention;

DETAILED DESCRIPTION OF THE INVENTION

Figure 1:
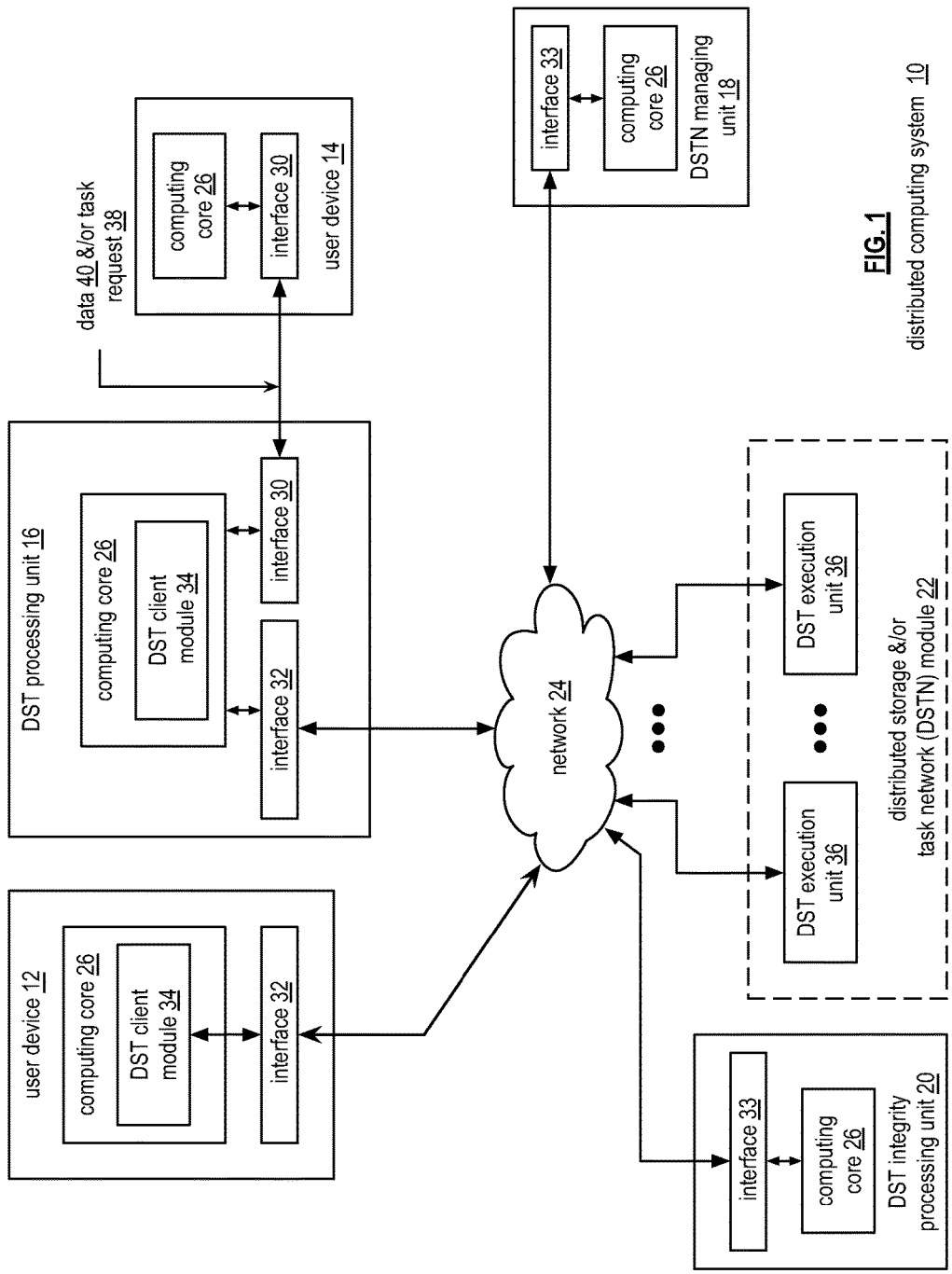
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26, and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/ deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
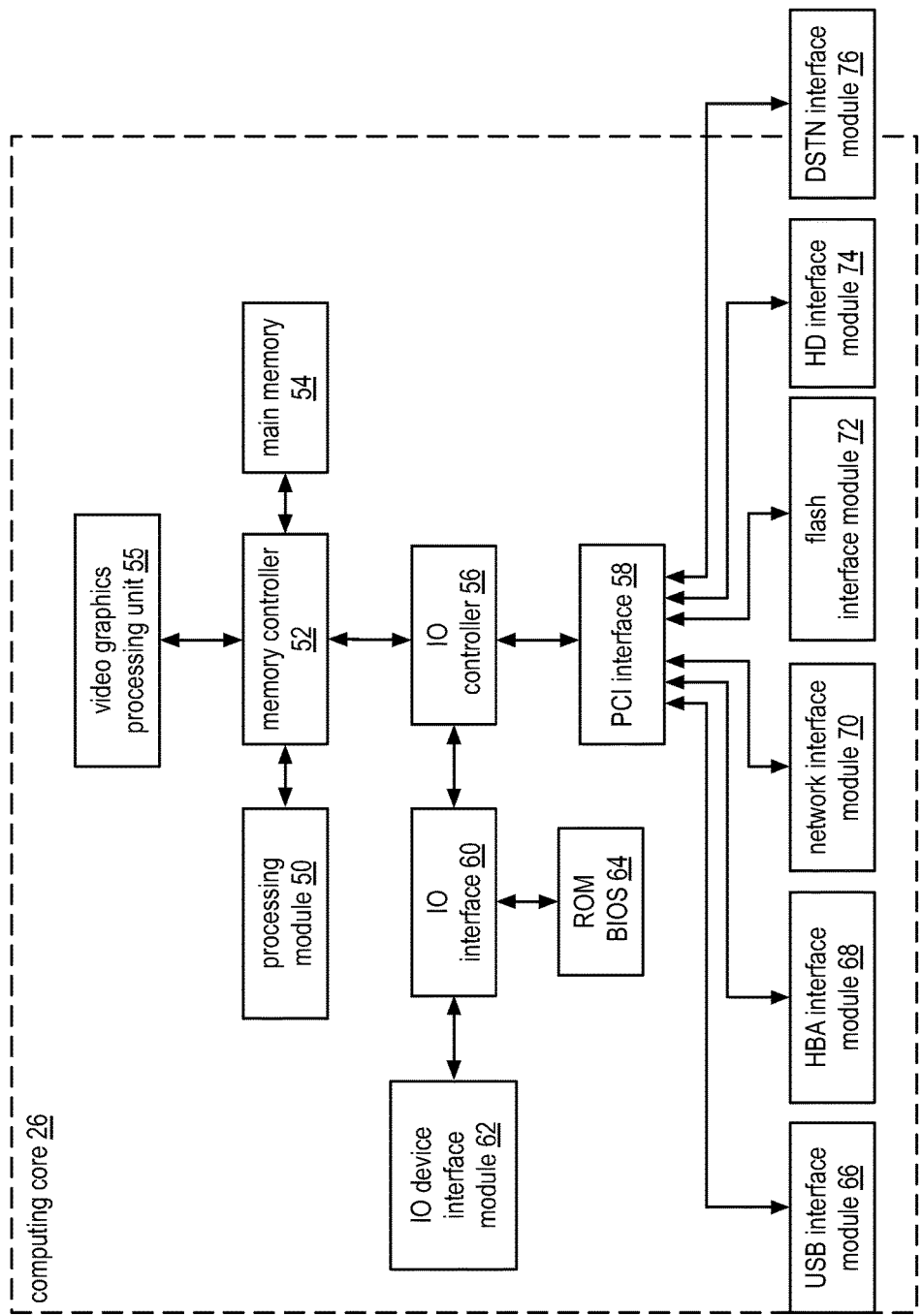
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
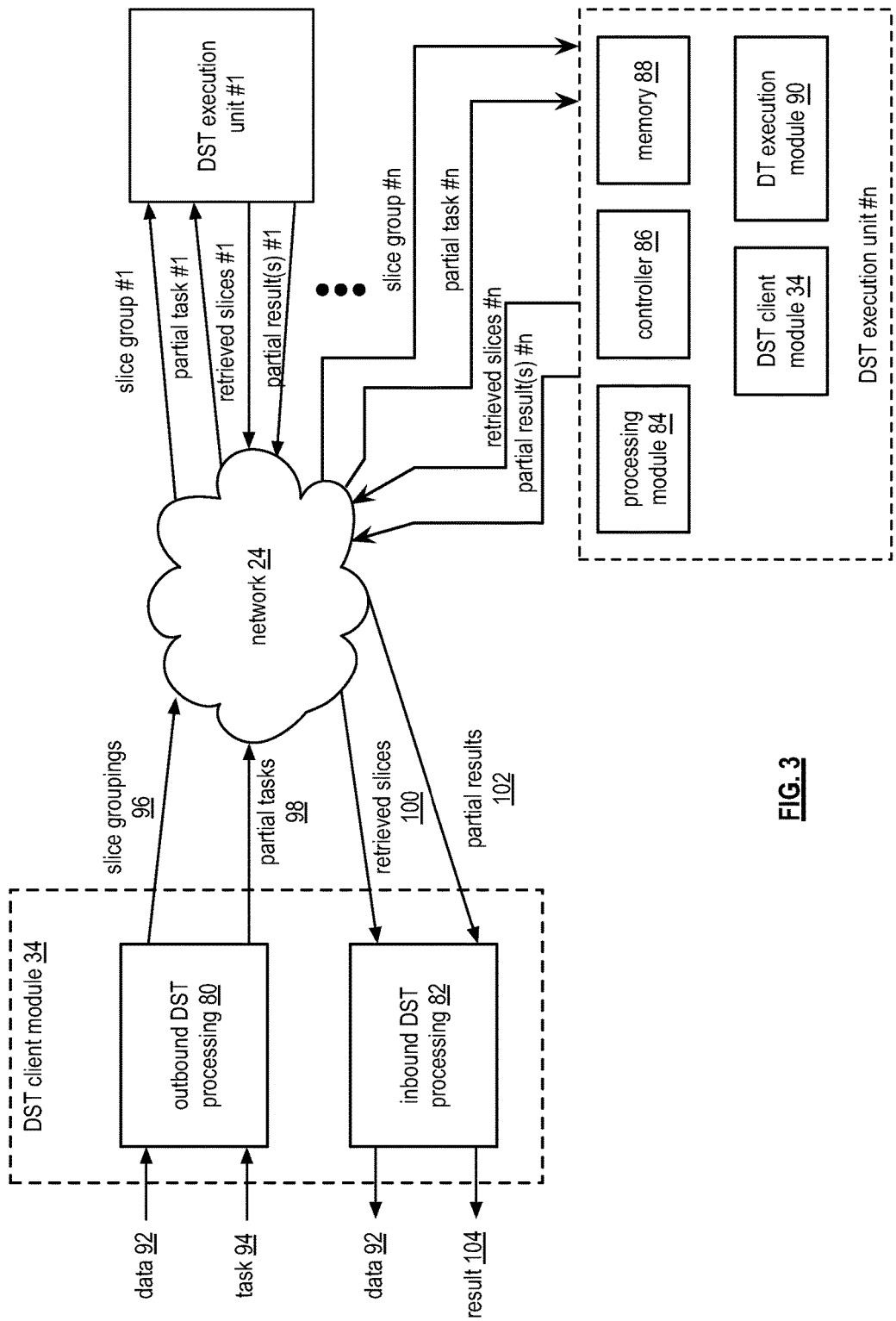
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-$n$ that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-$n$ includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-$n$ of the DSTN module 22 of FIG. 1. For example, the outbound DST processing section 80 sends slice group 1 and partial task 1 to DST execution unit 1. As another example, the outbound DST processing section 80 sends slice group #$n$ and partial task #$n$ to DST execution unit #$n$.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
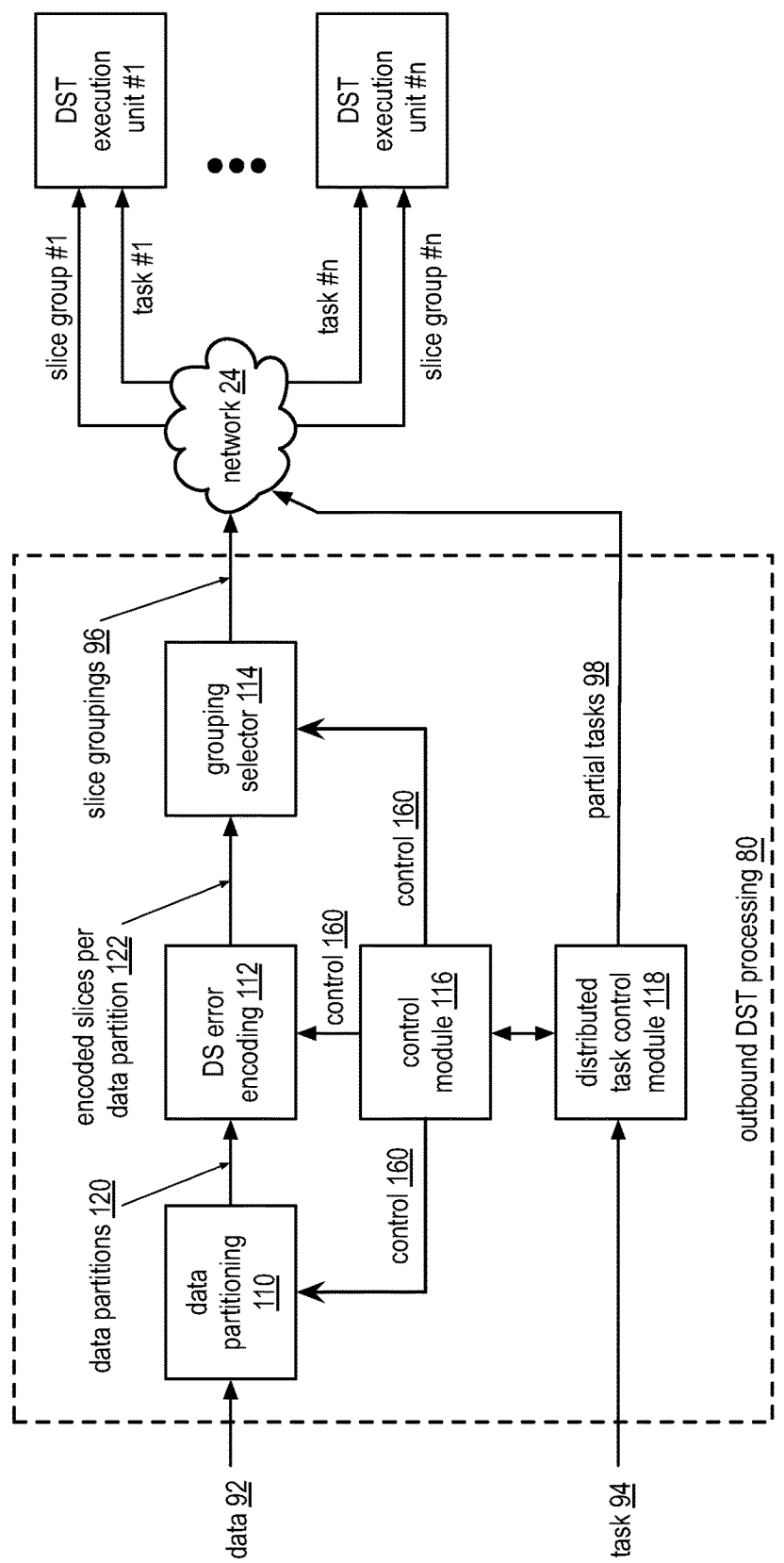
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
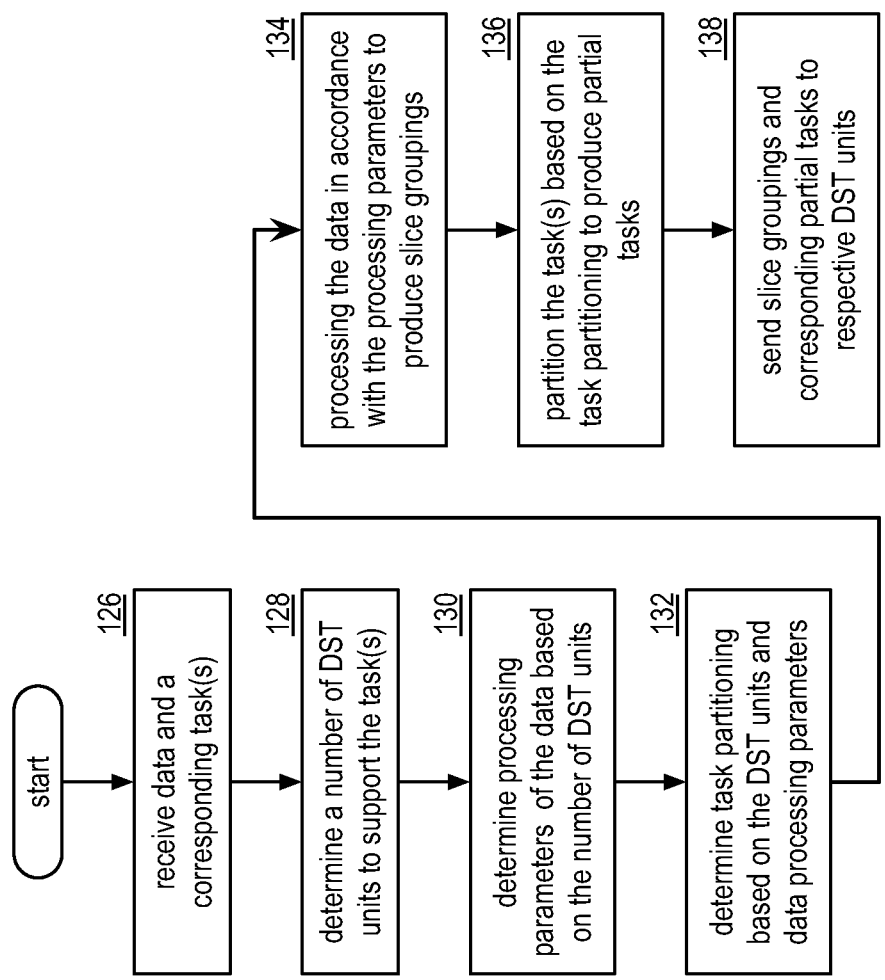
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
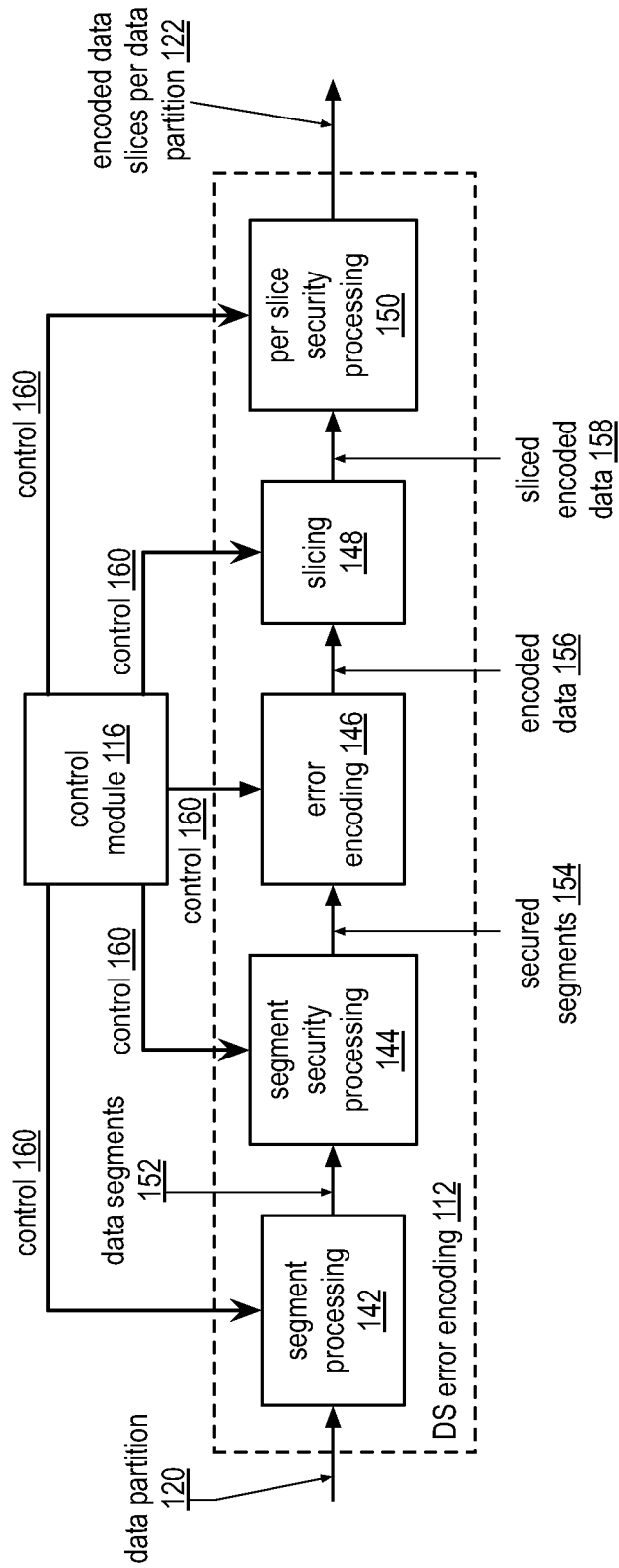
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
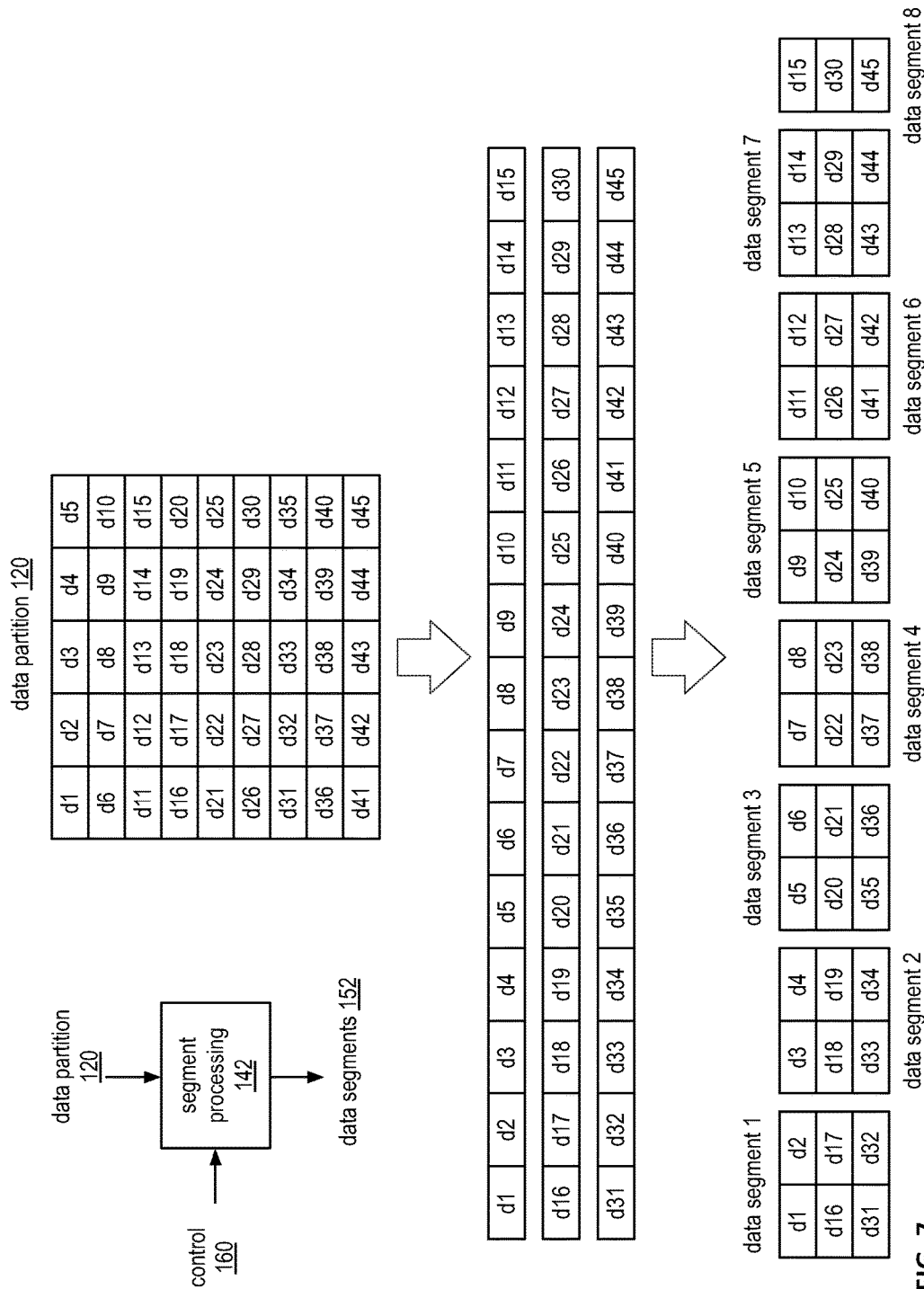
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
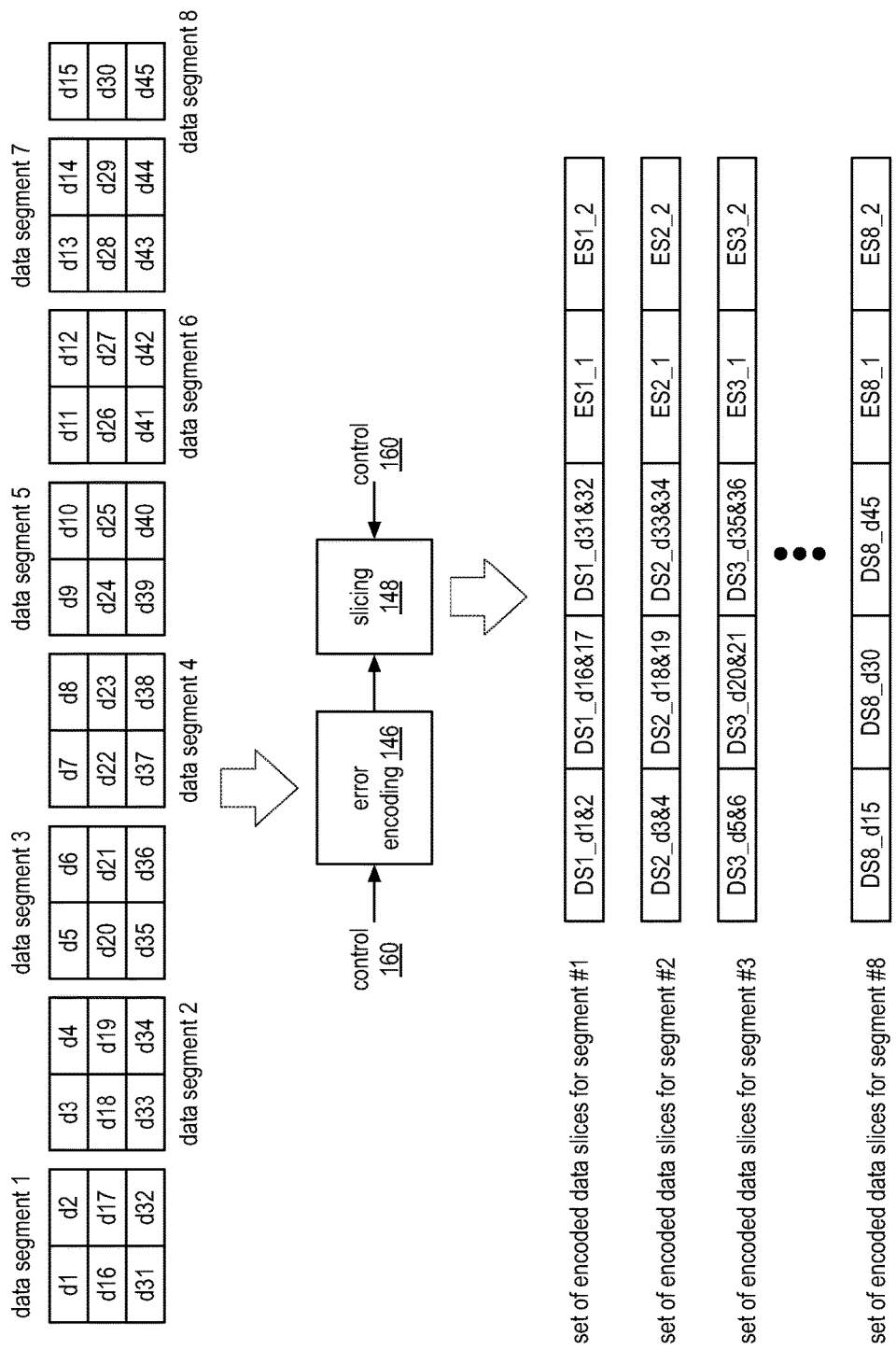
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
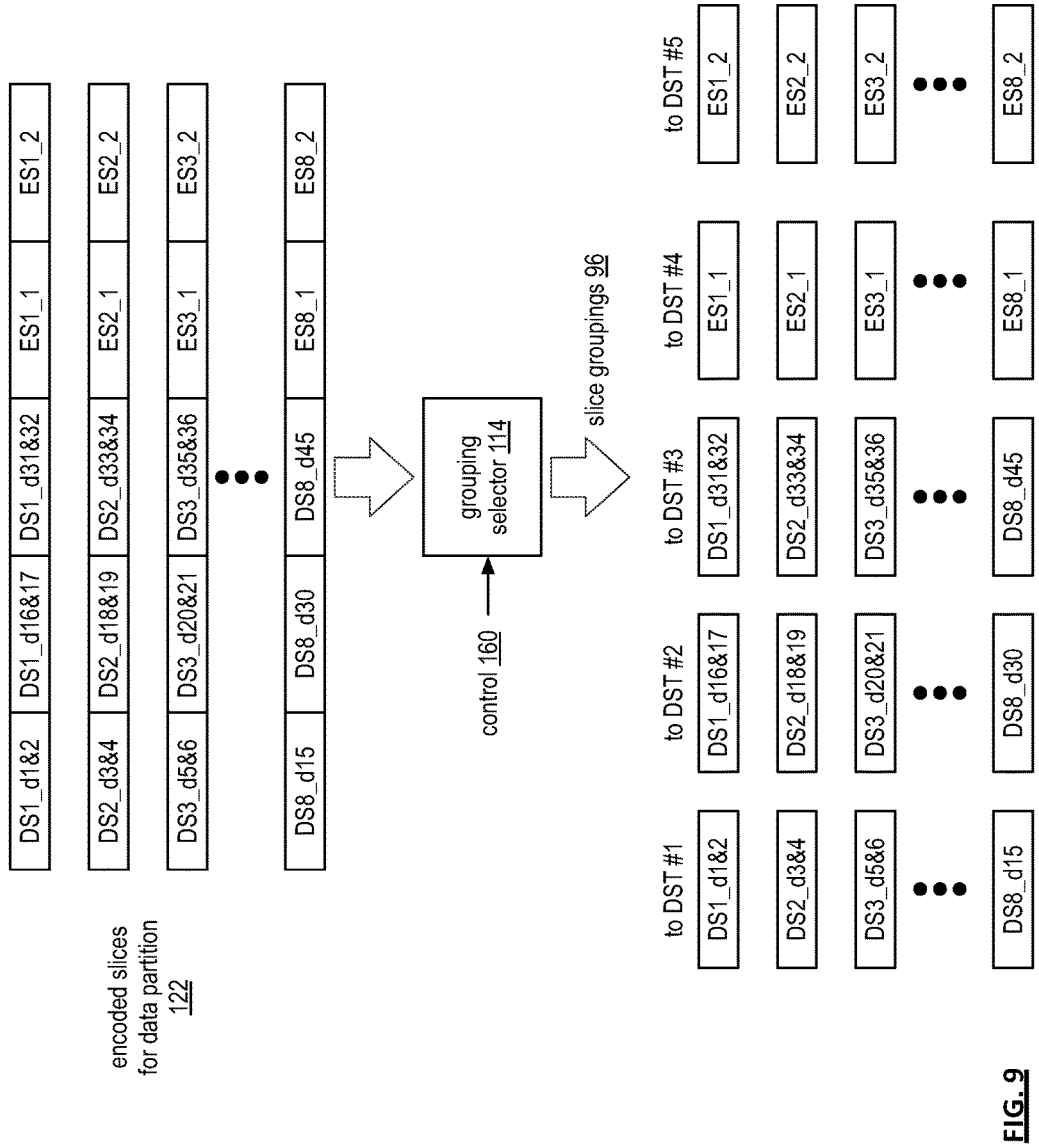
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with grouping selector information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
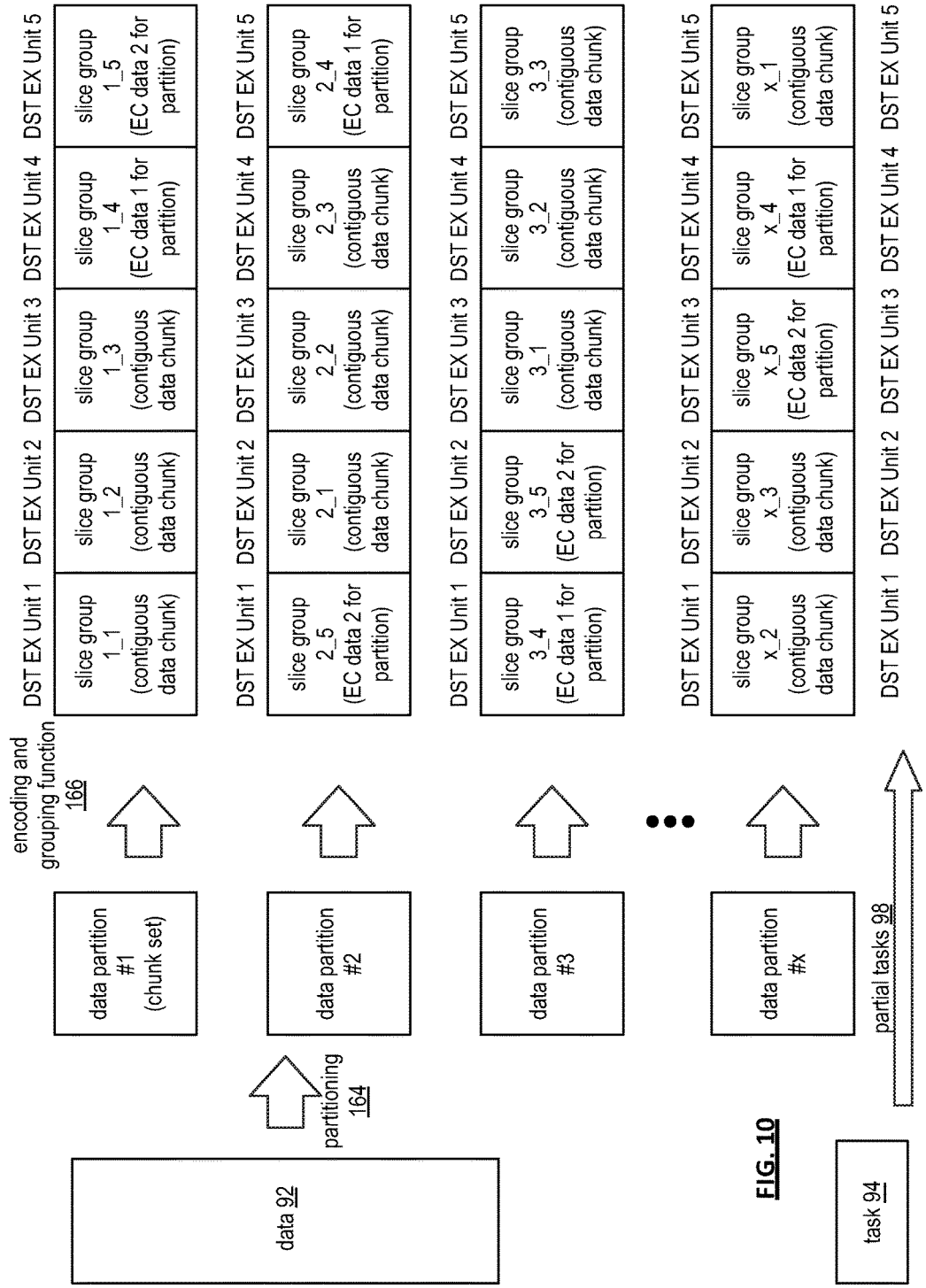
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST)

execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
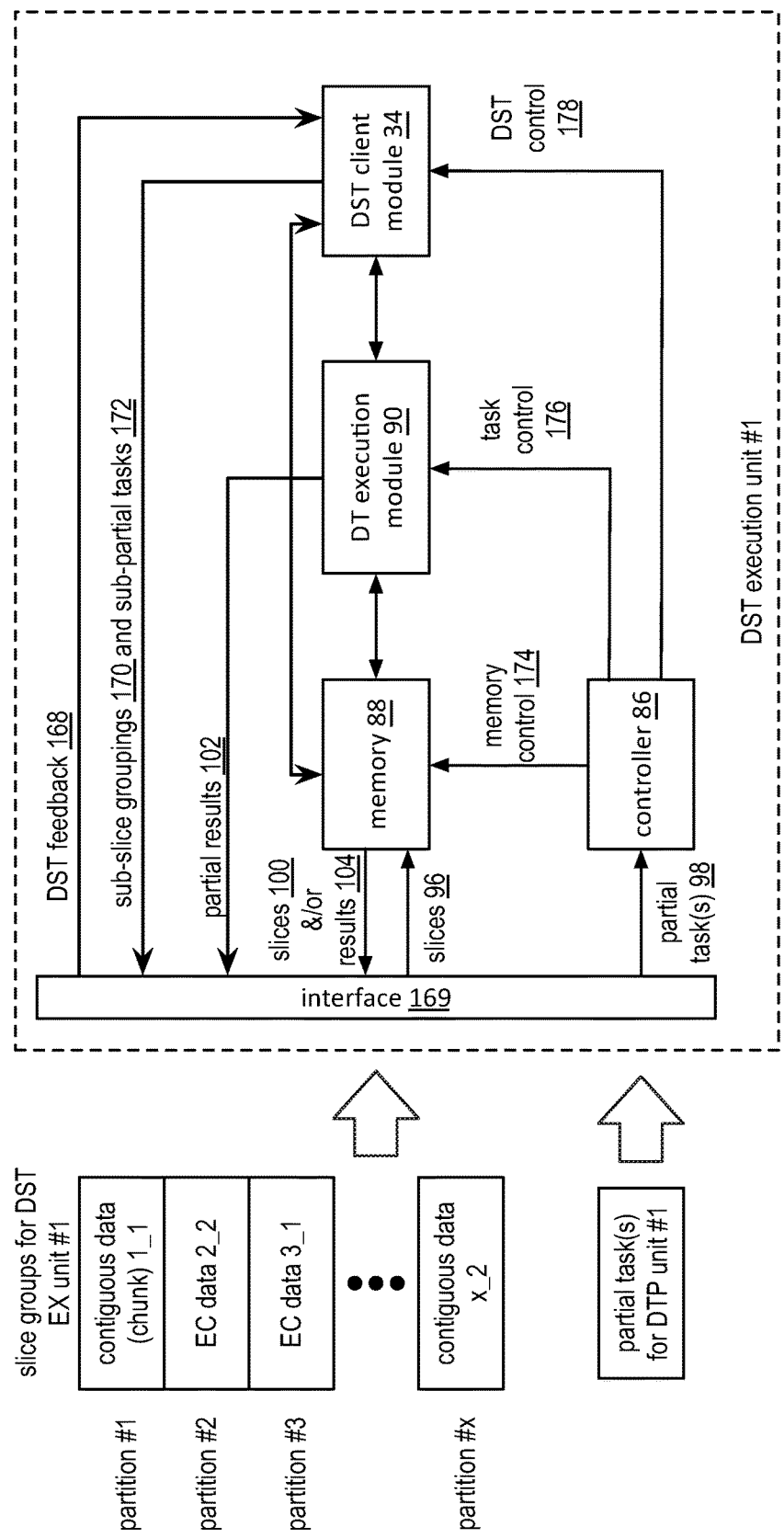
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
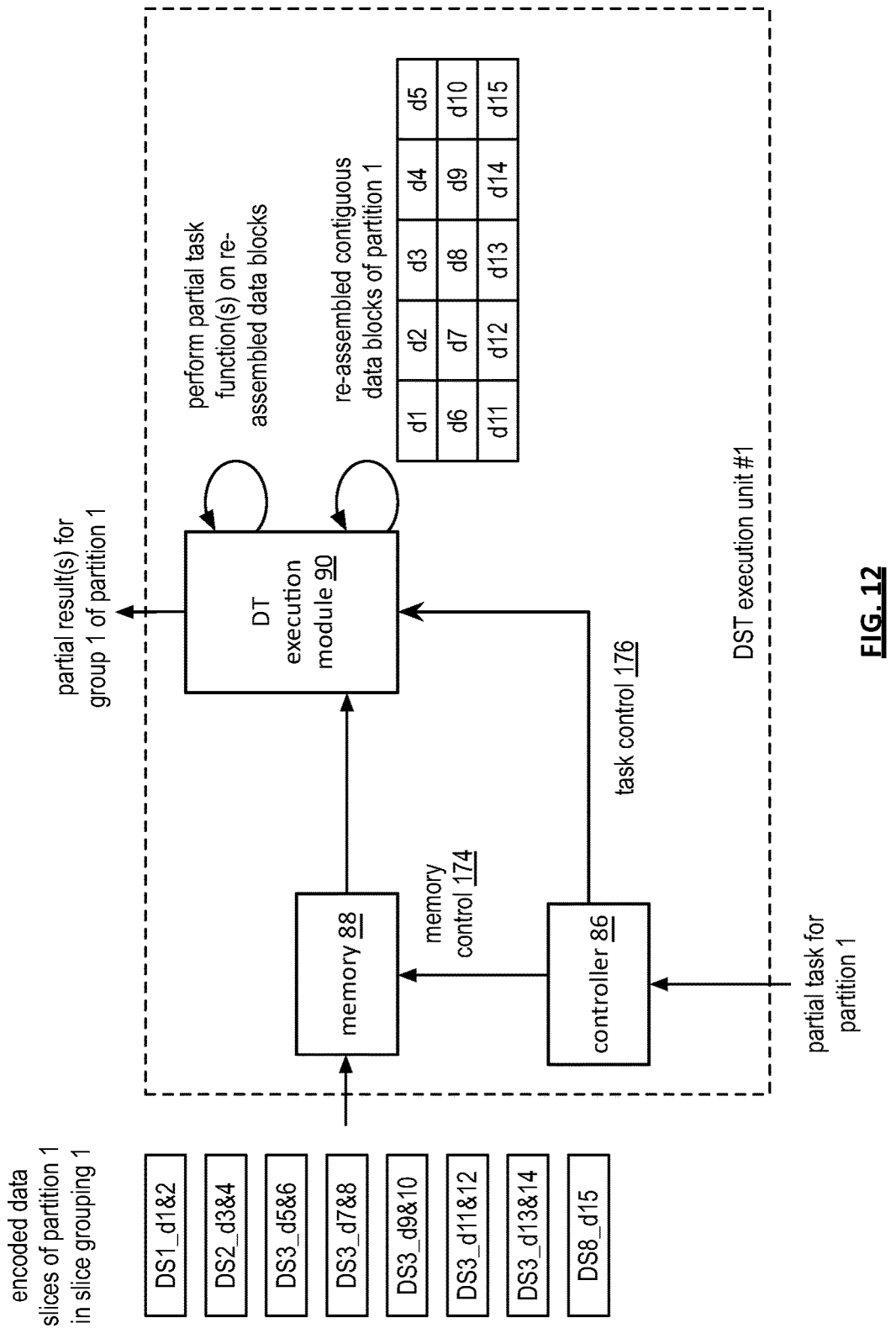
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
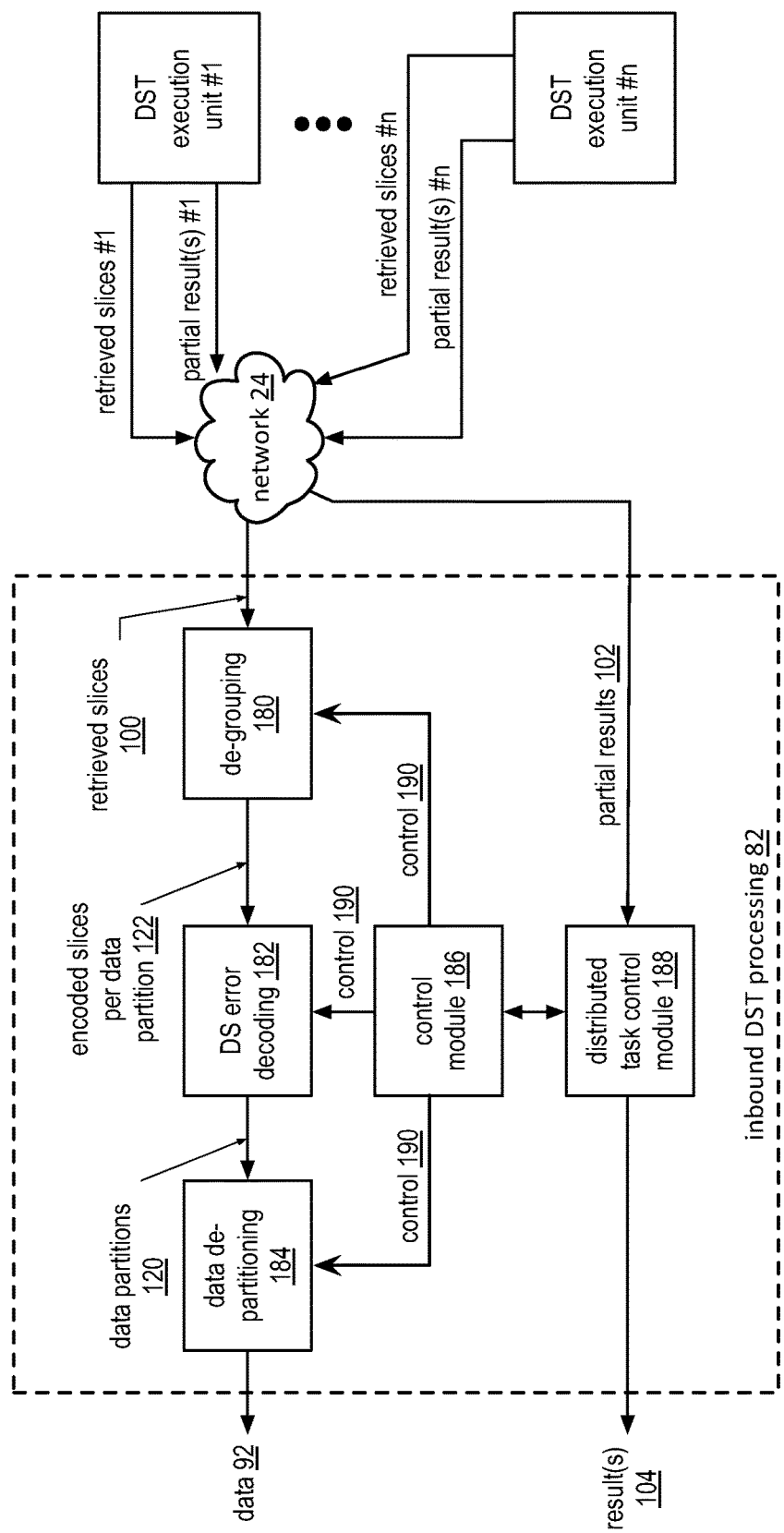
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
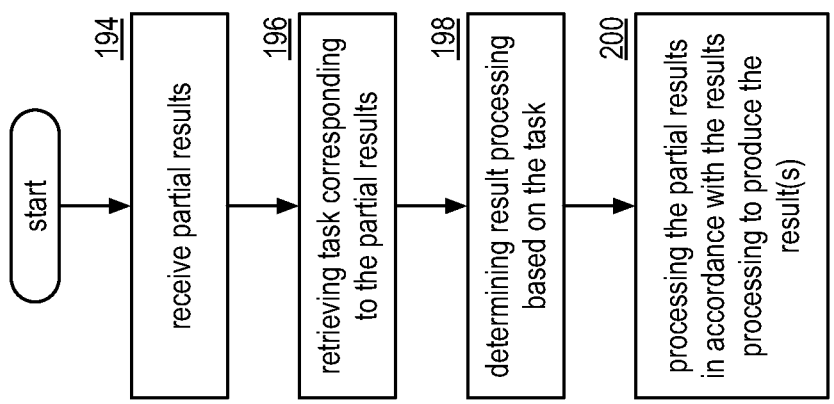
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
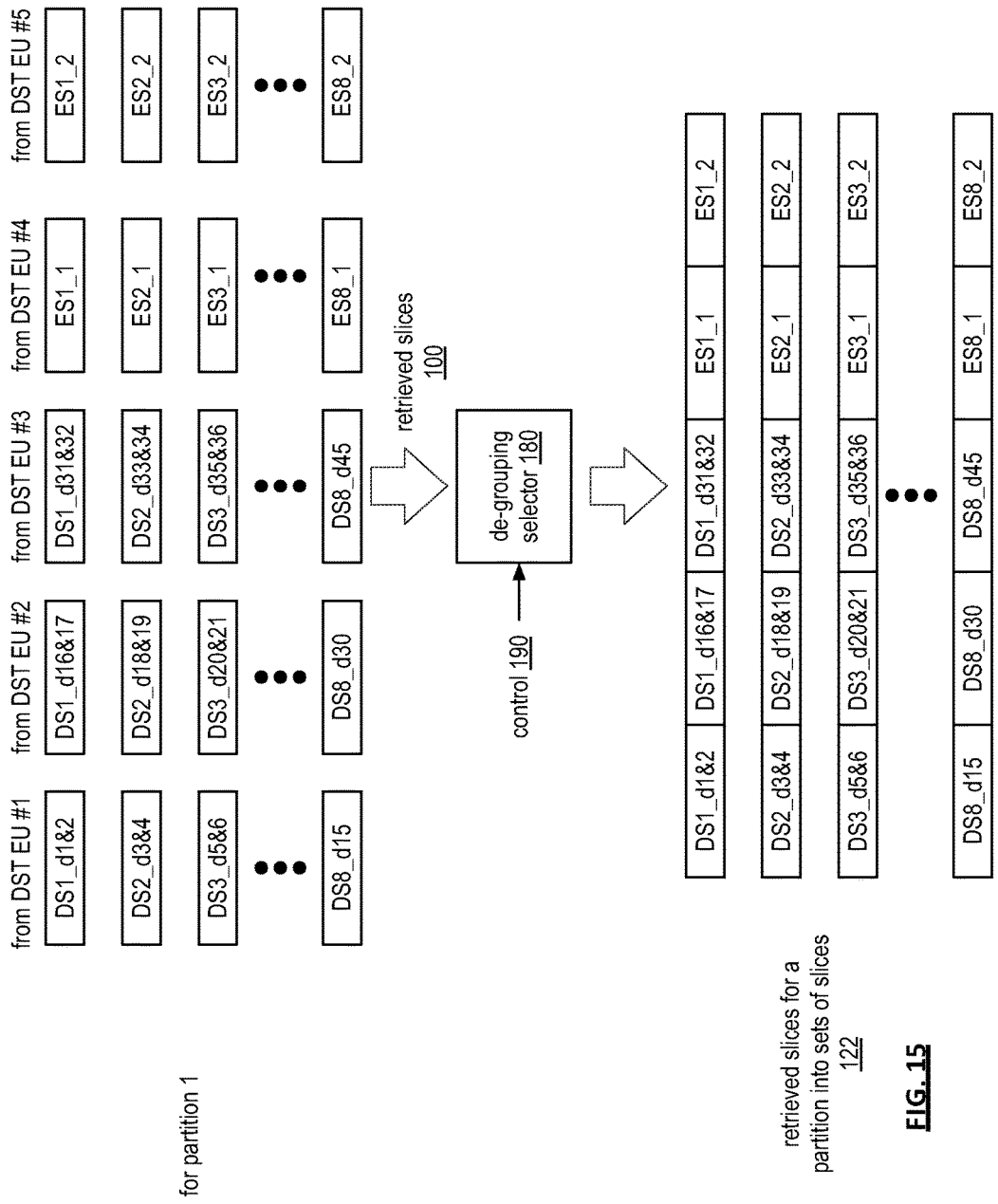
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
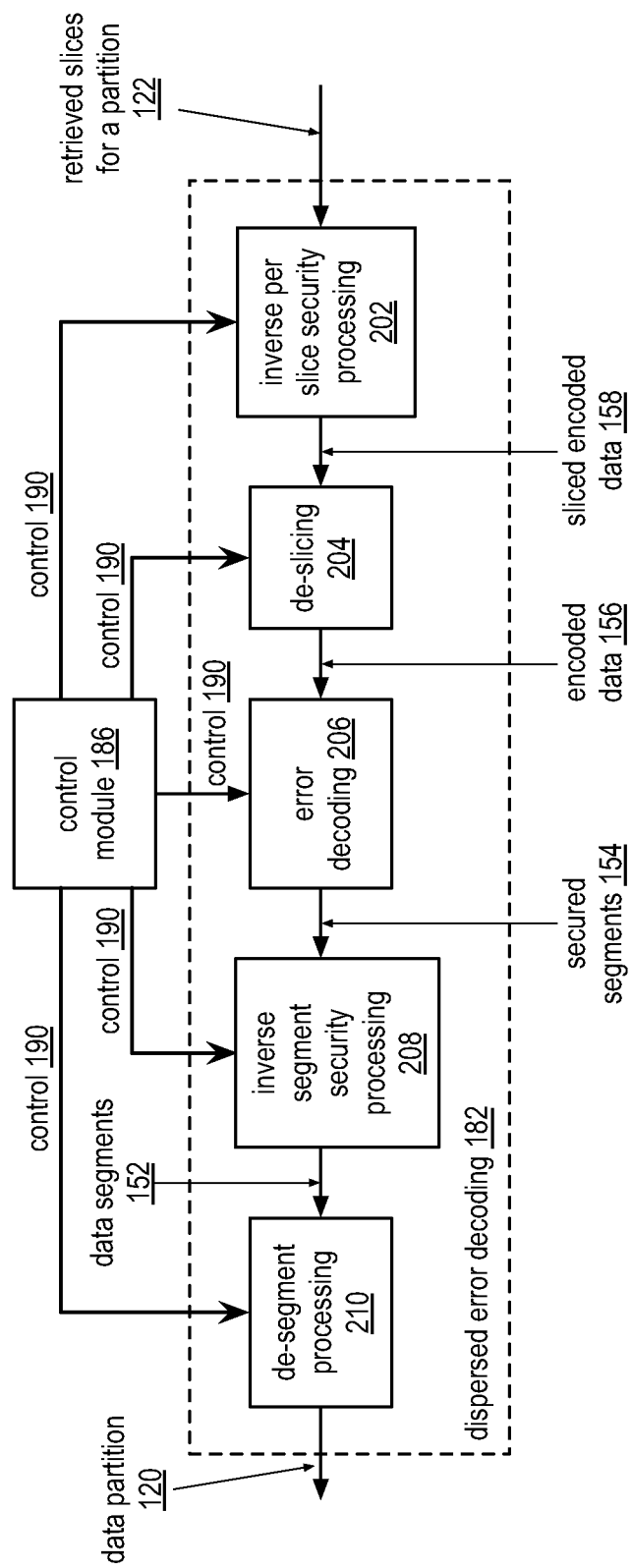
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
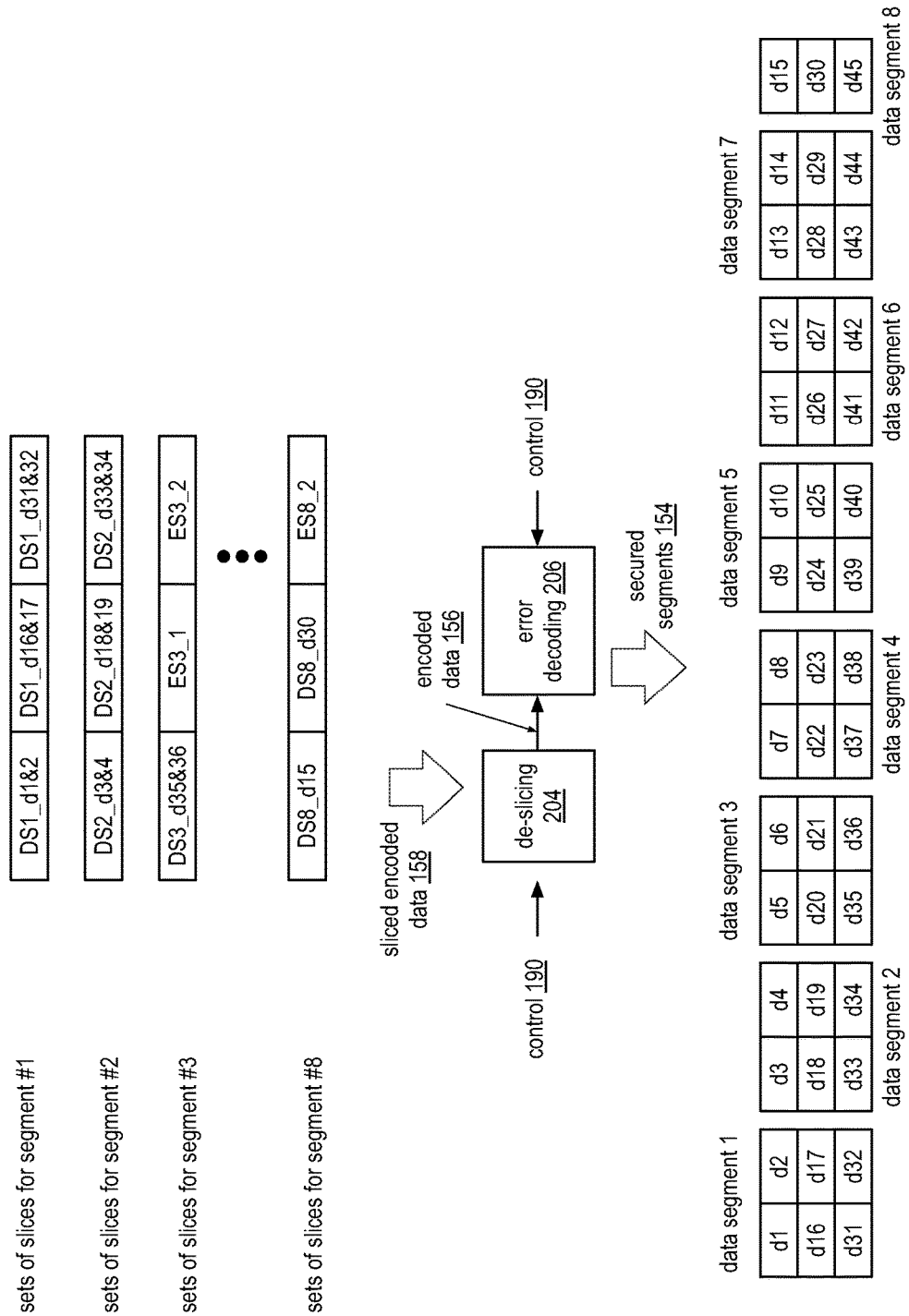
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
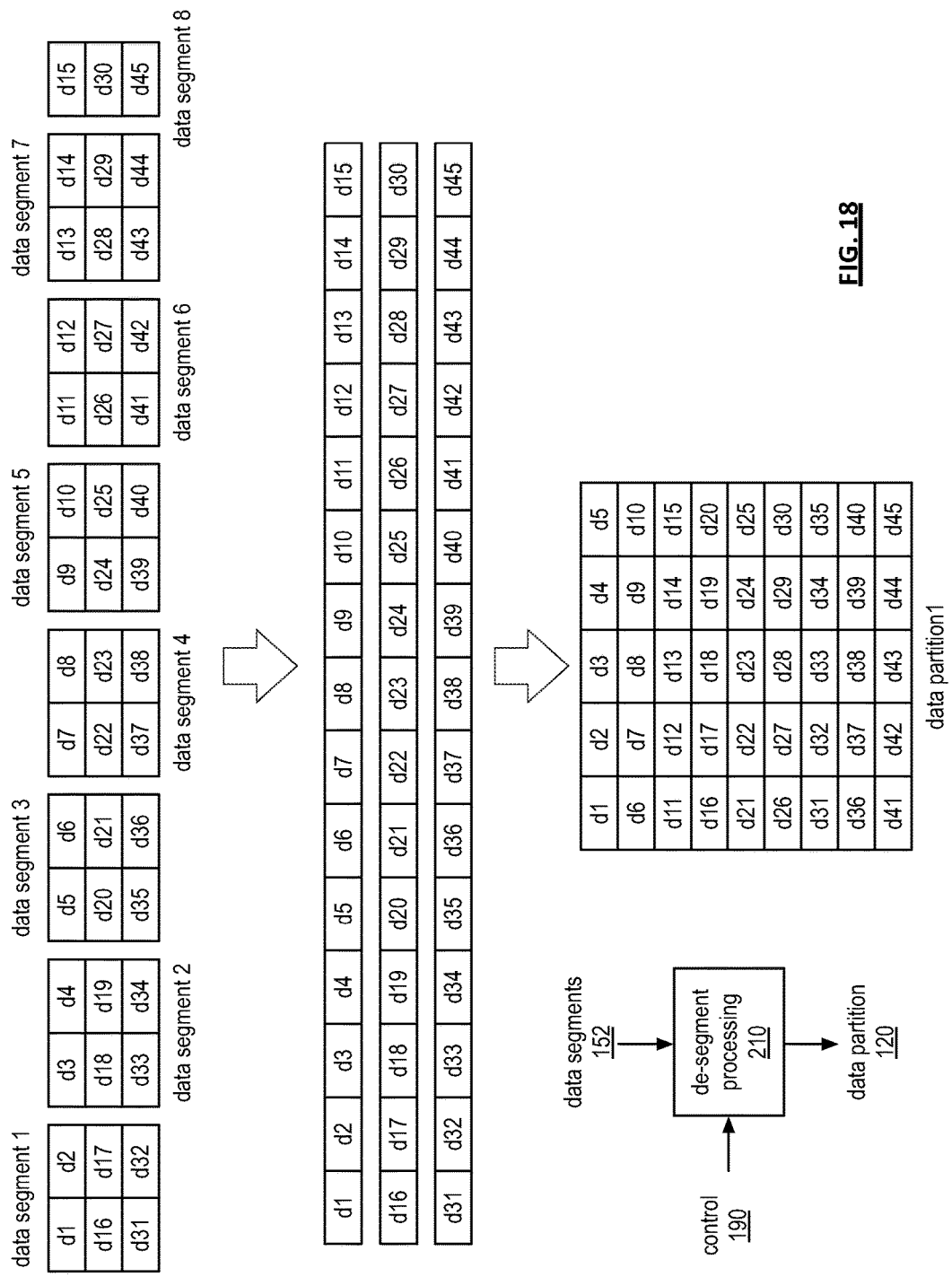
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
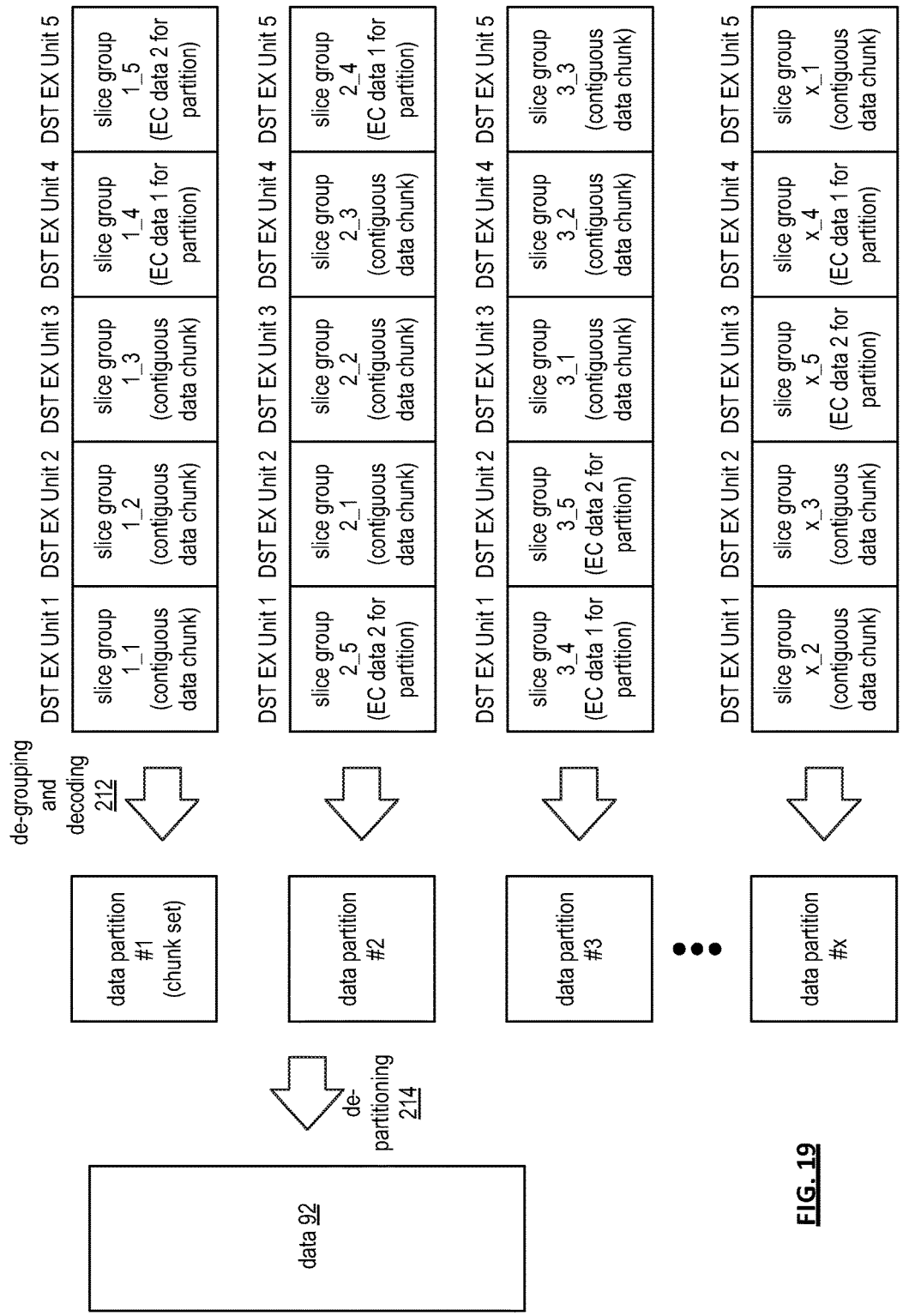
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-*x*, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
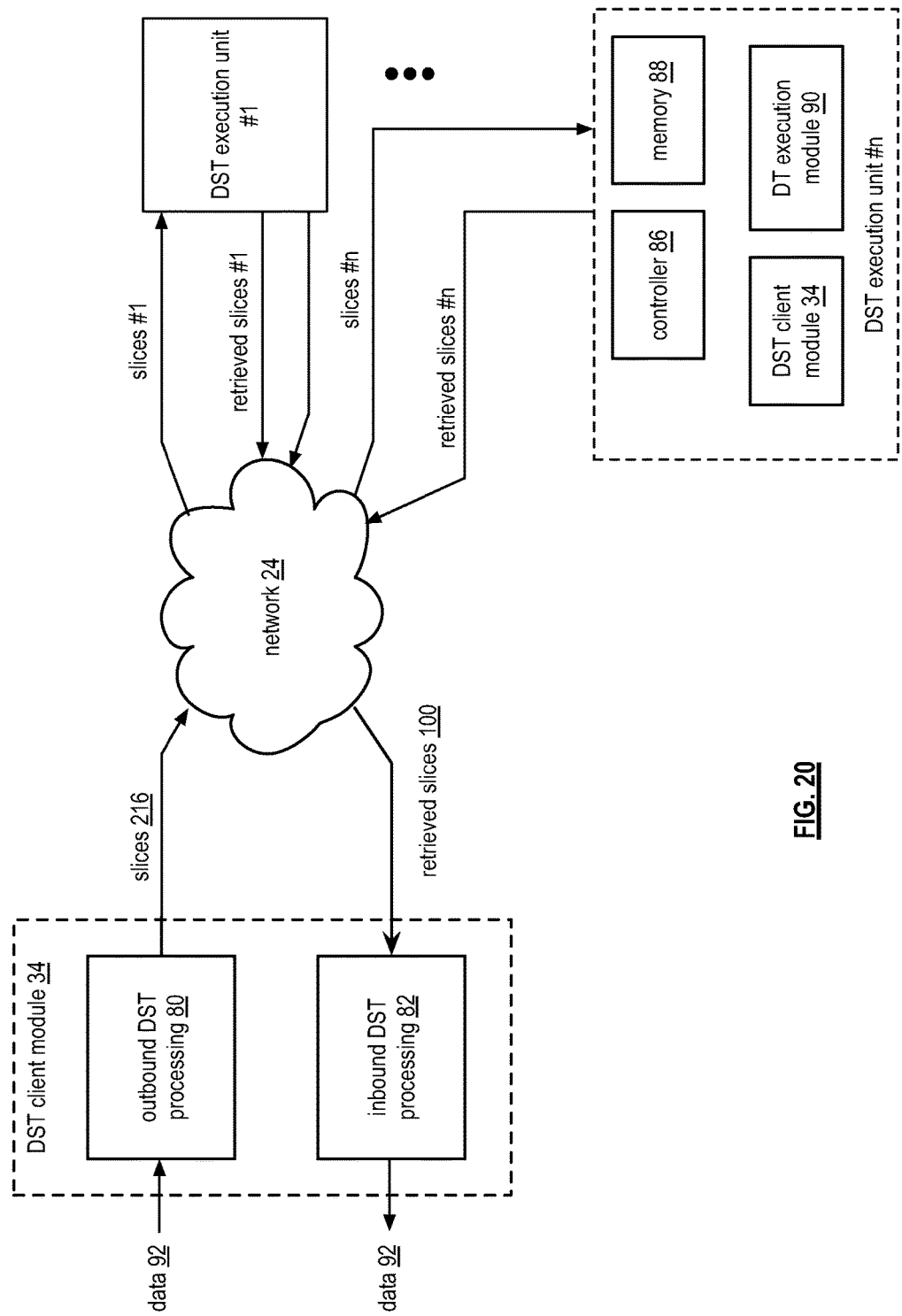
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units.

In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
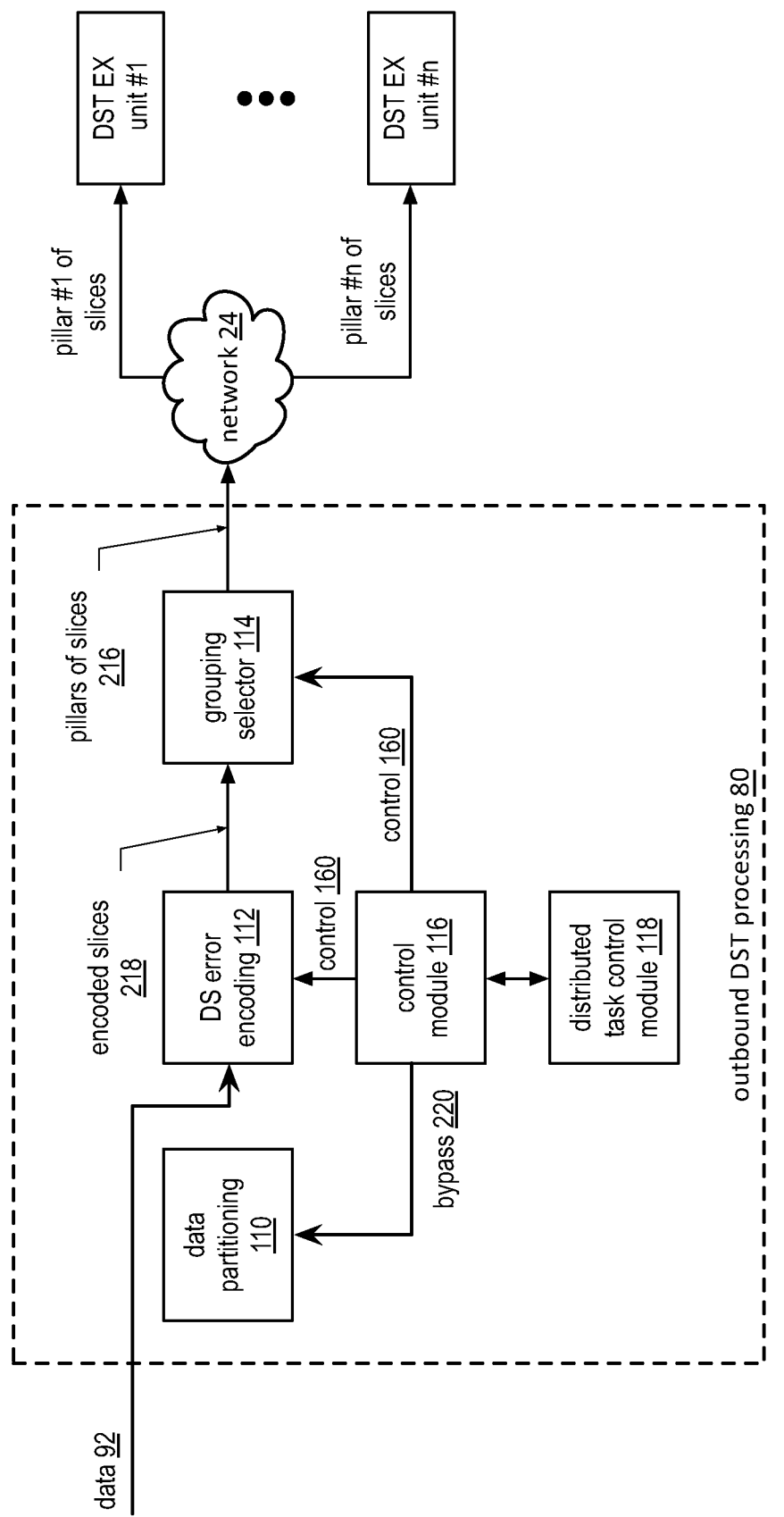
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
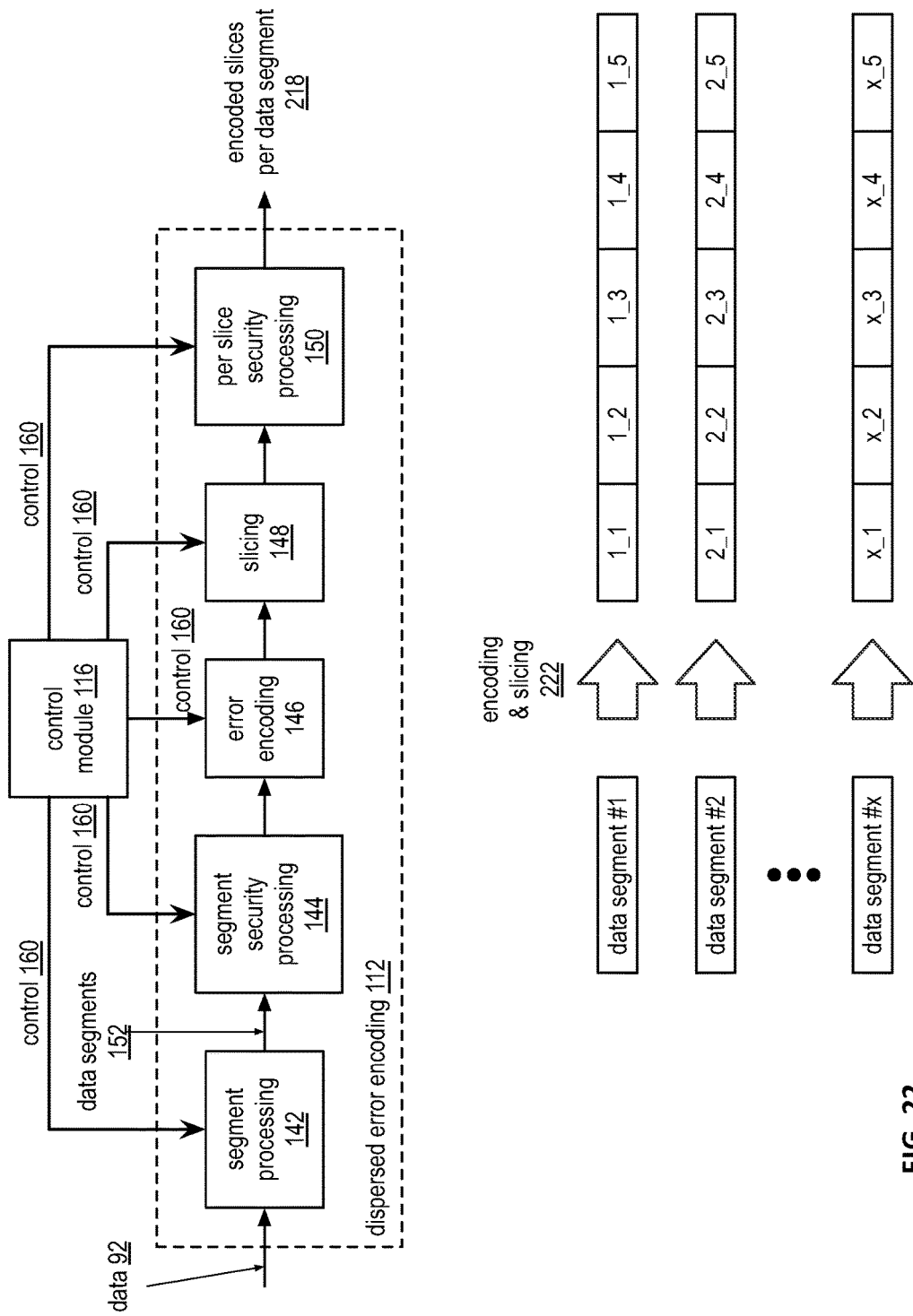
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
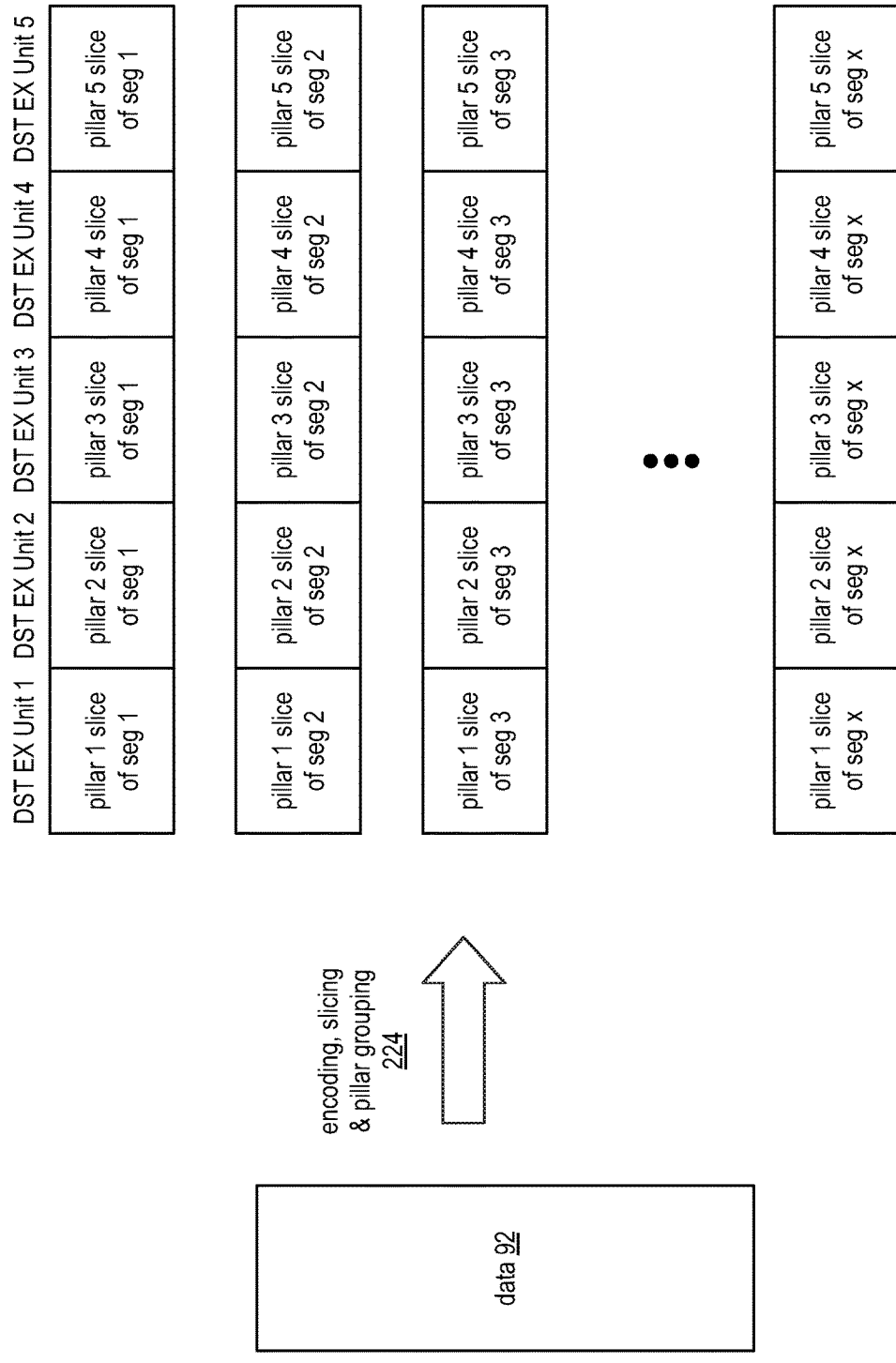
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

Figure 24:
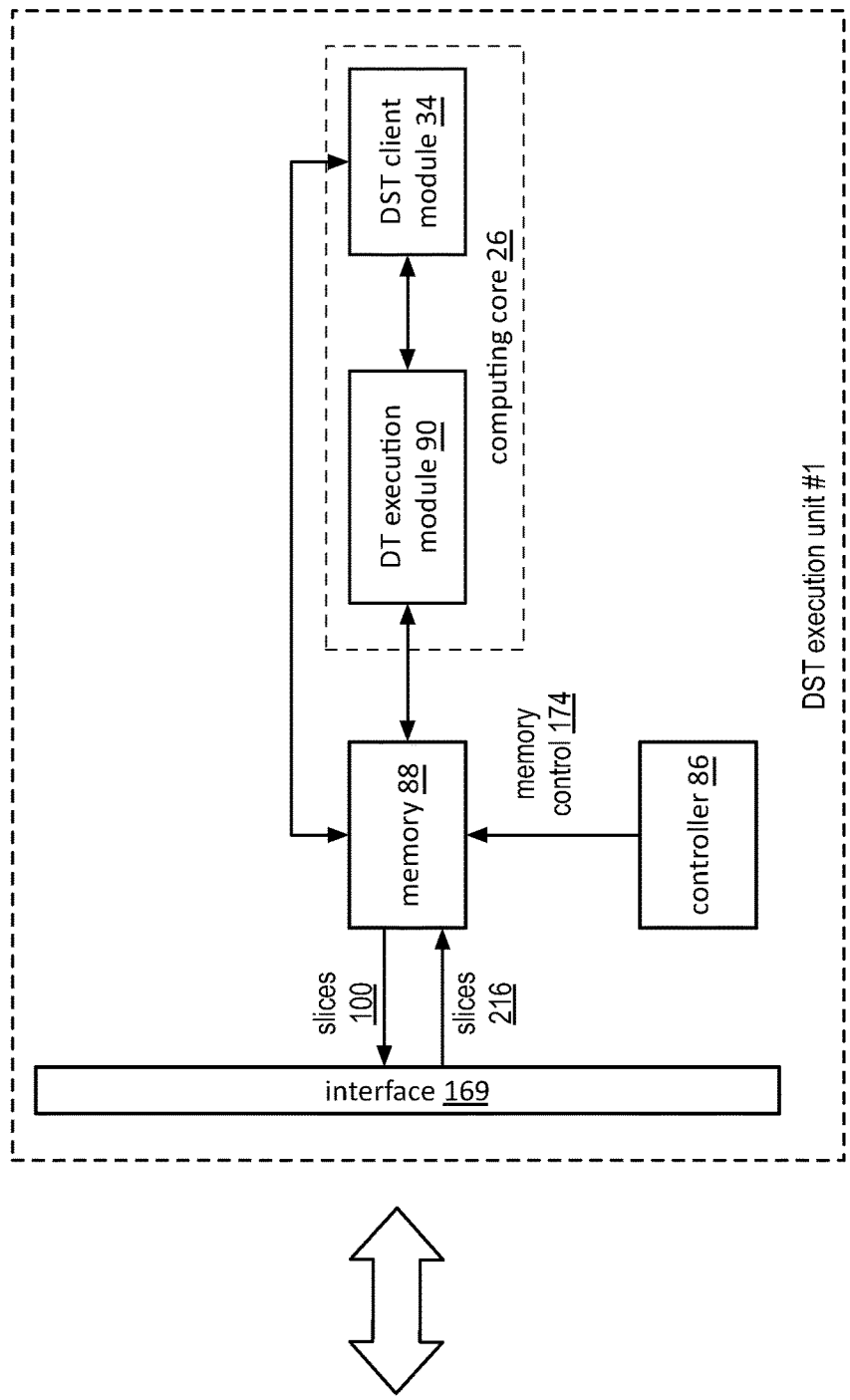
FIG. 24 is a schematic block diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
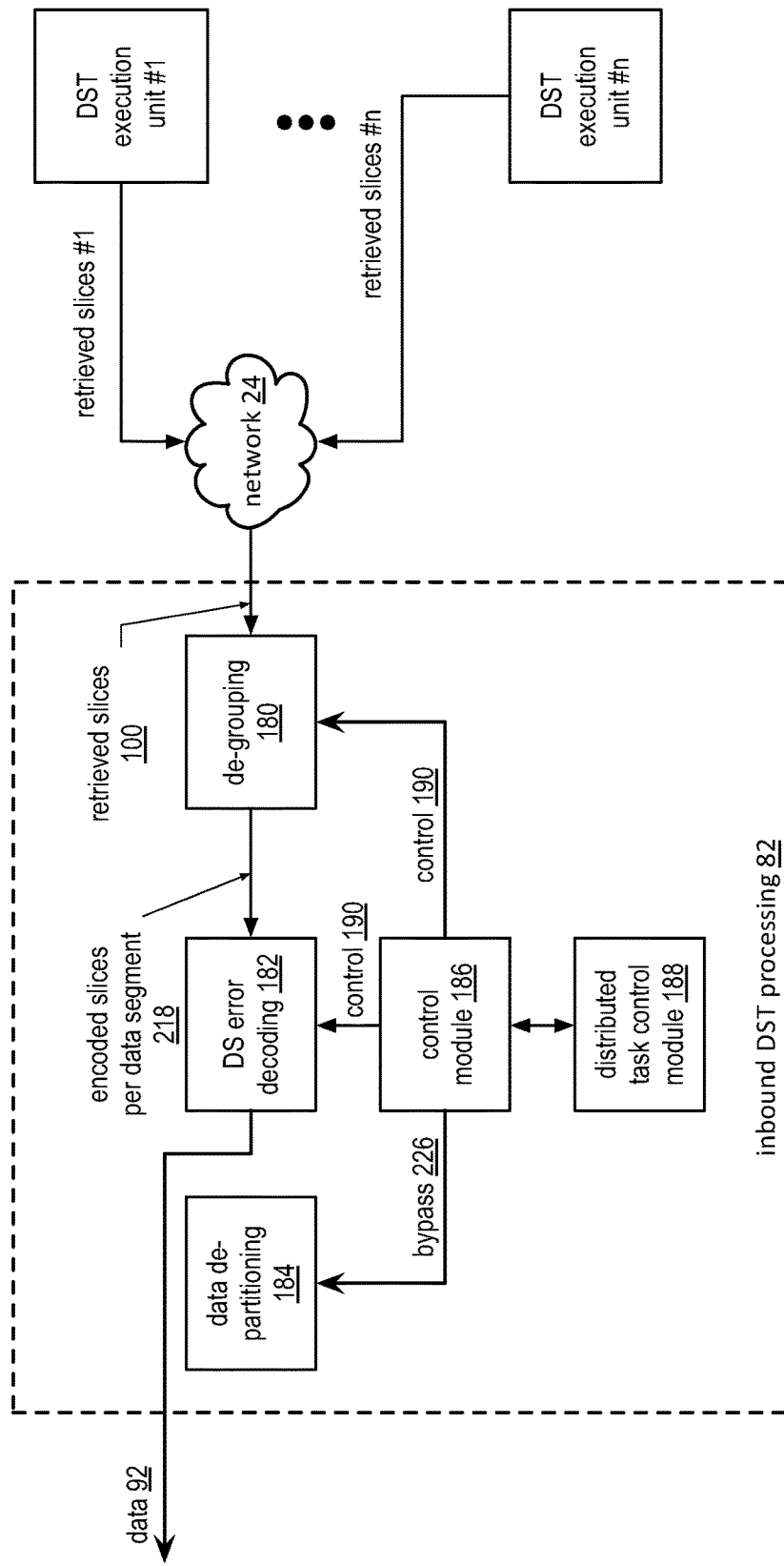
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
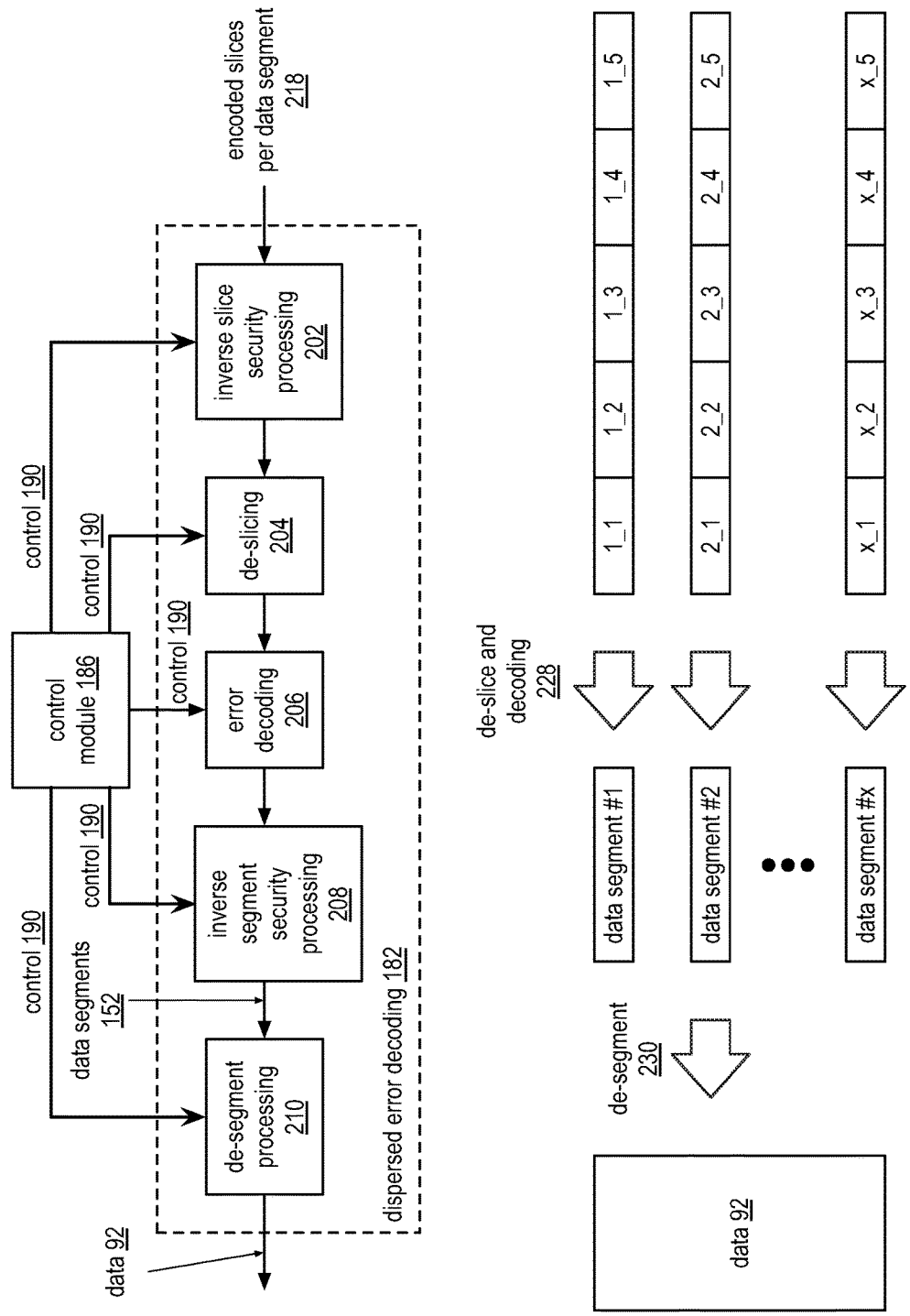
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
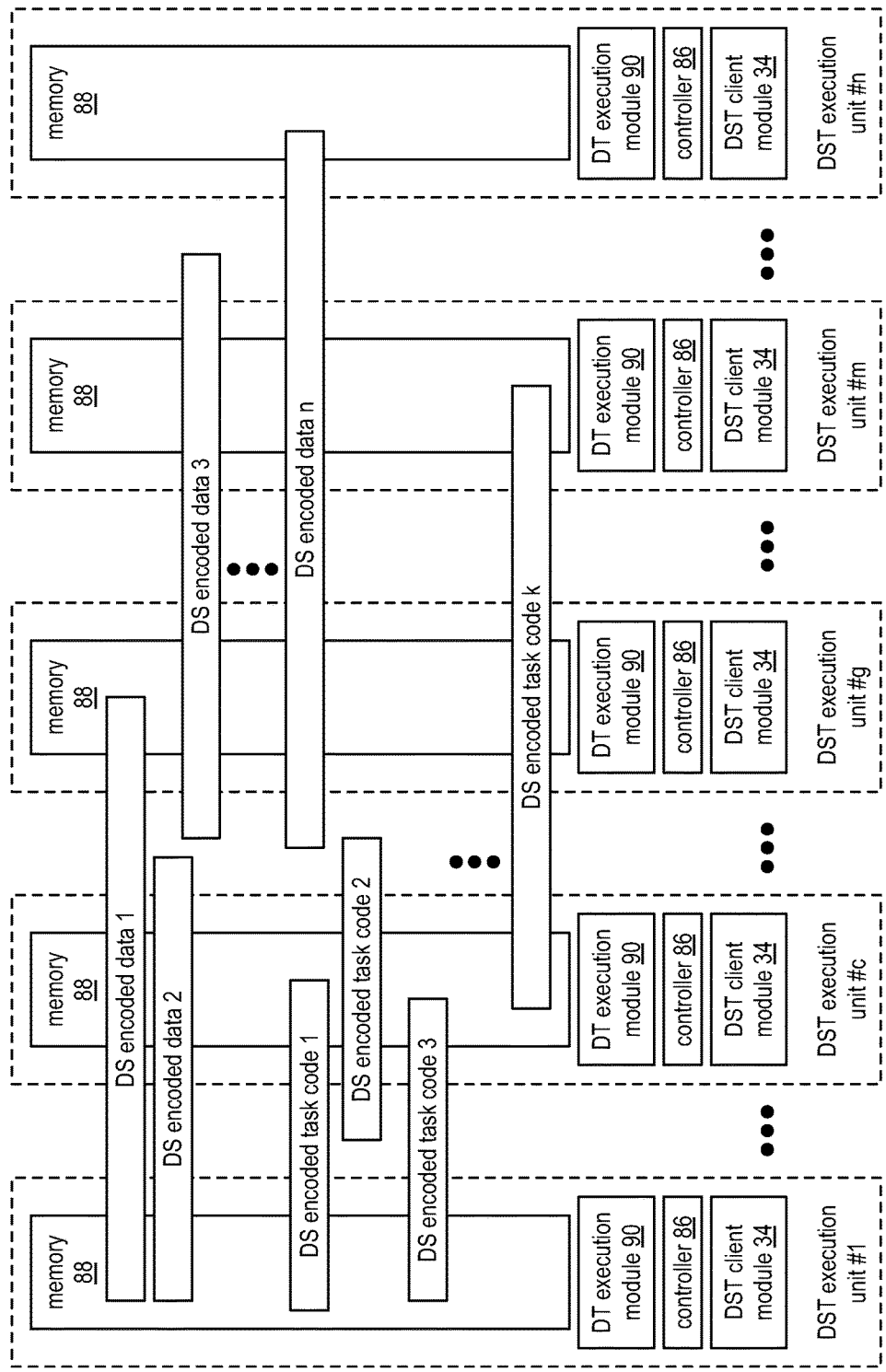
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
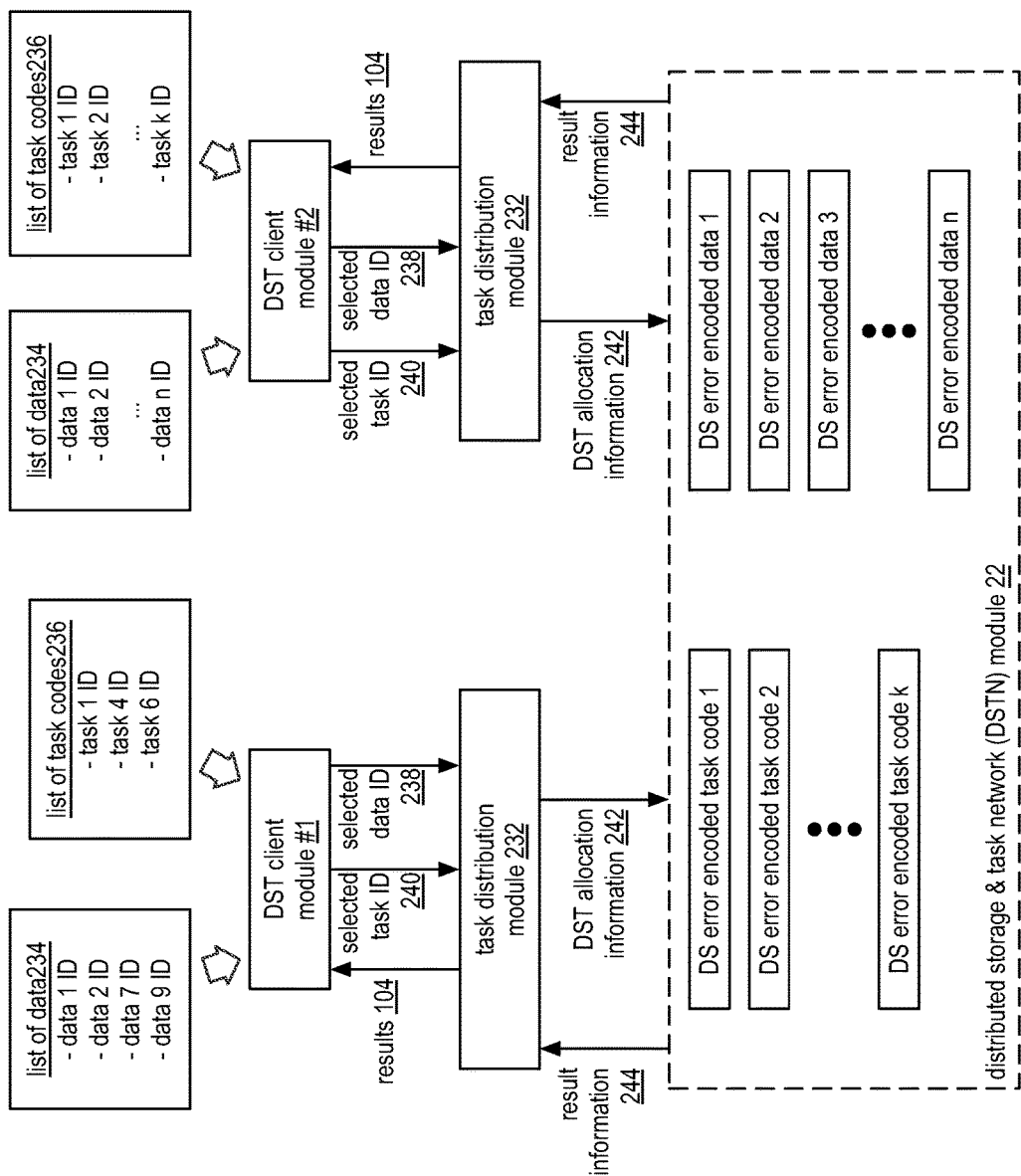
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
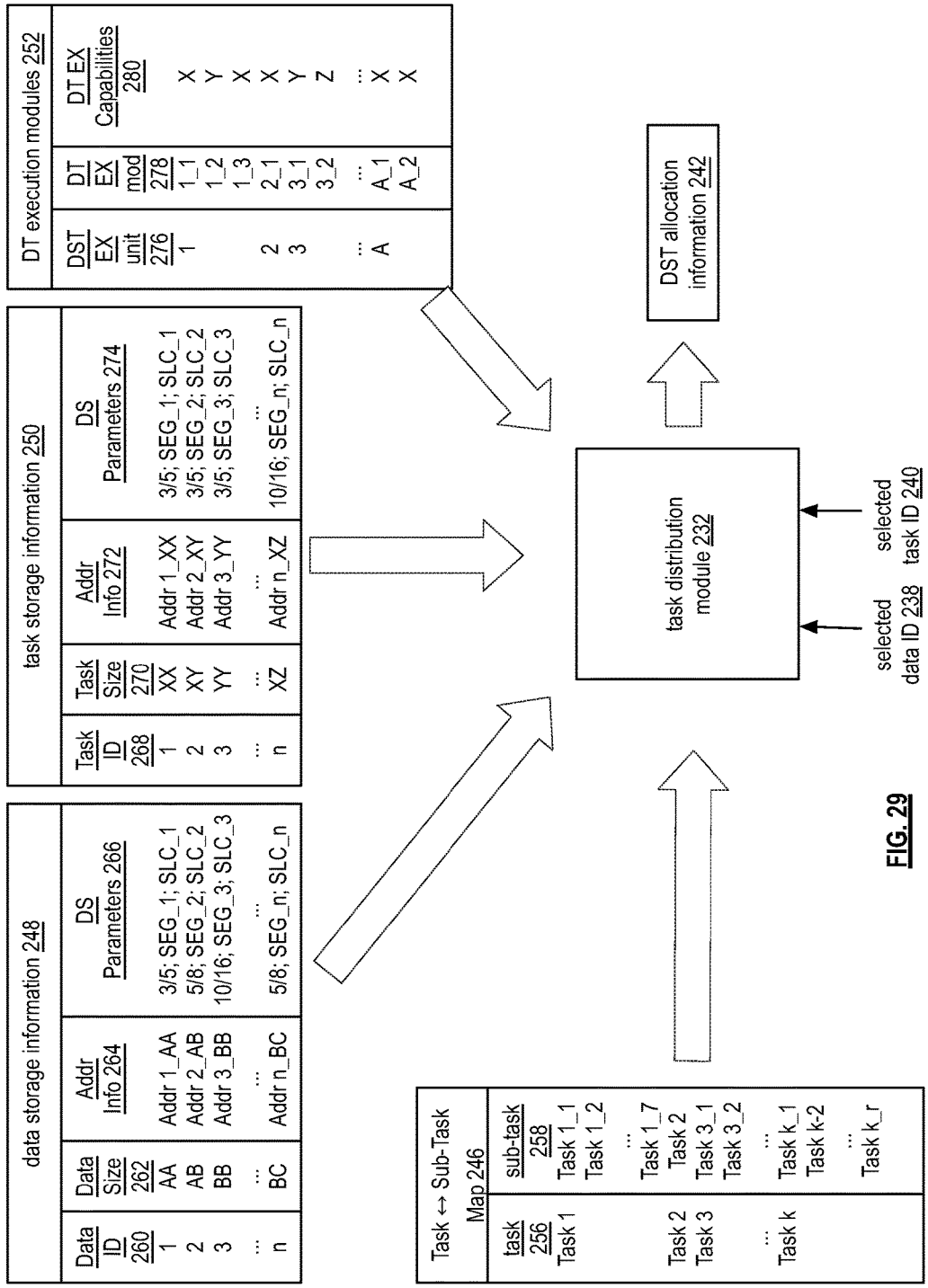
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
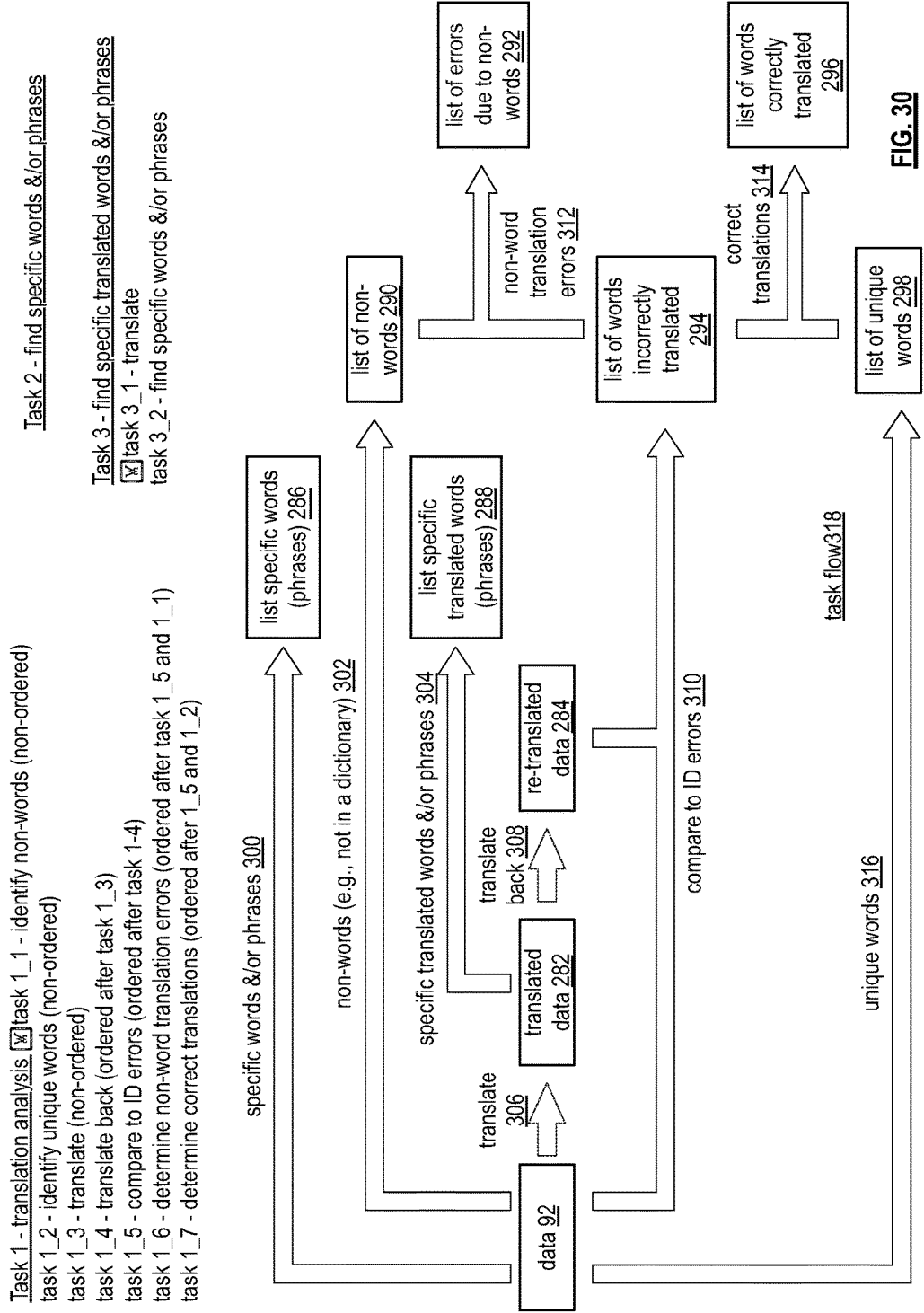
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
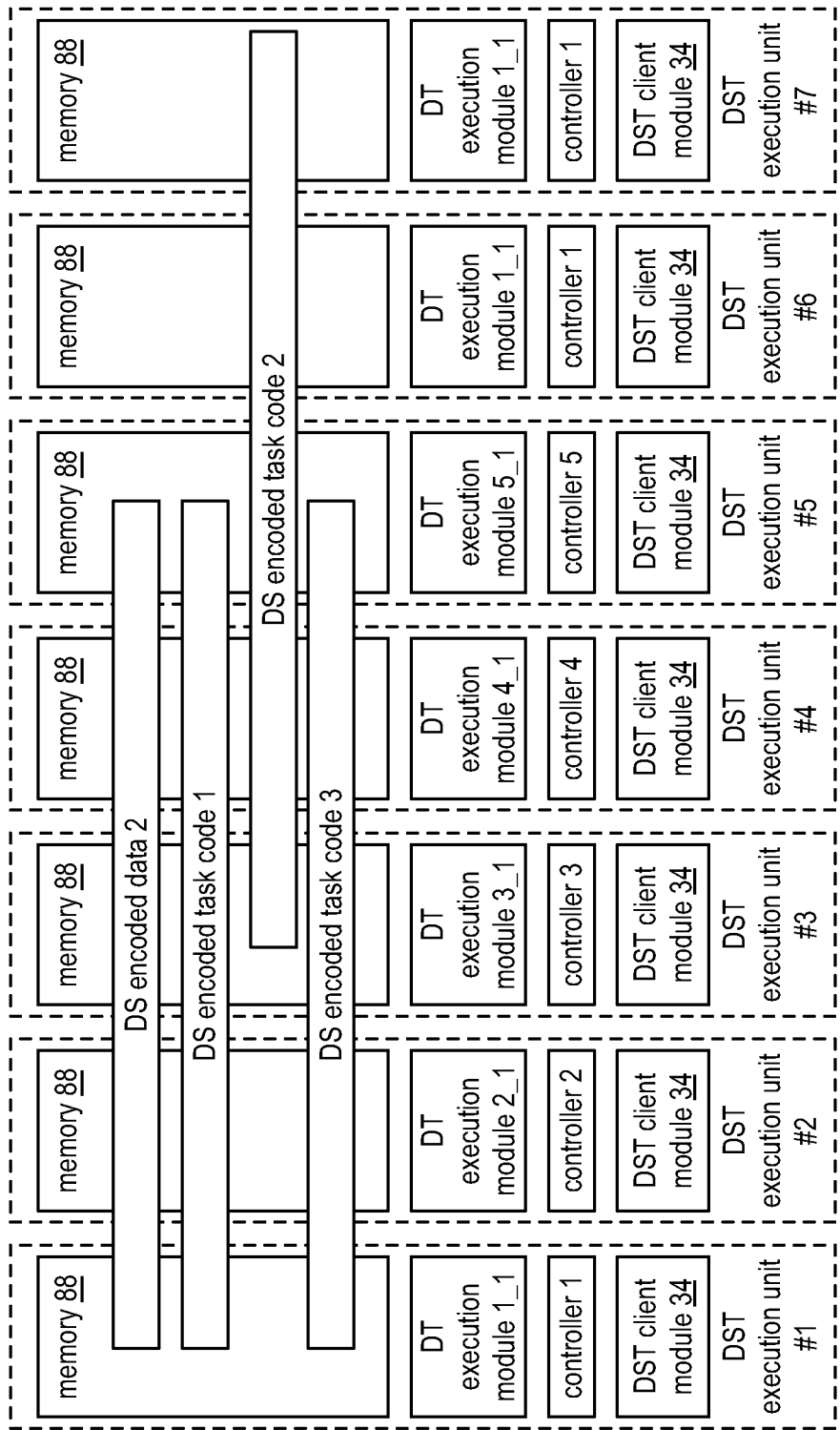
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words). Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes ⅗ decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
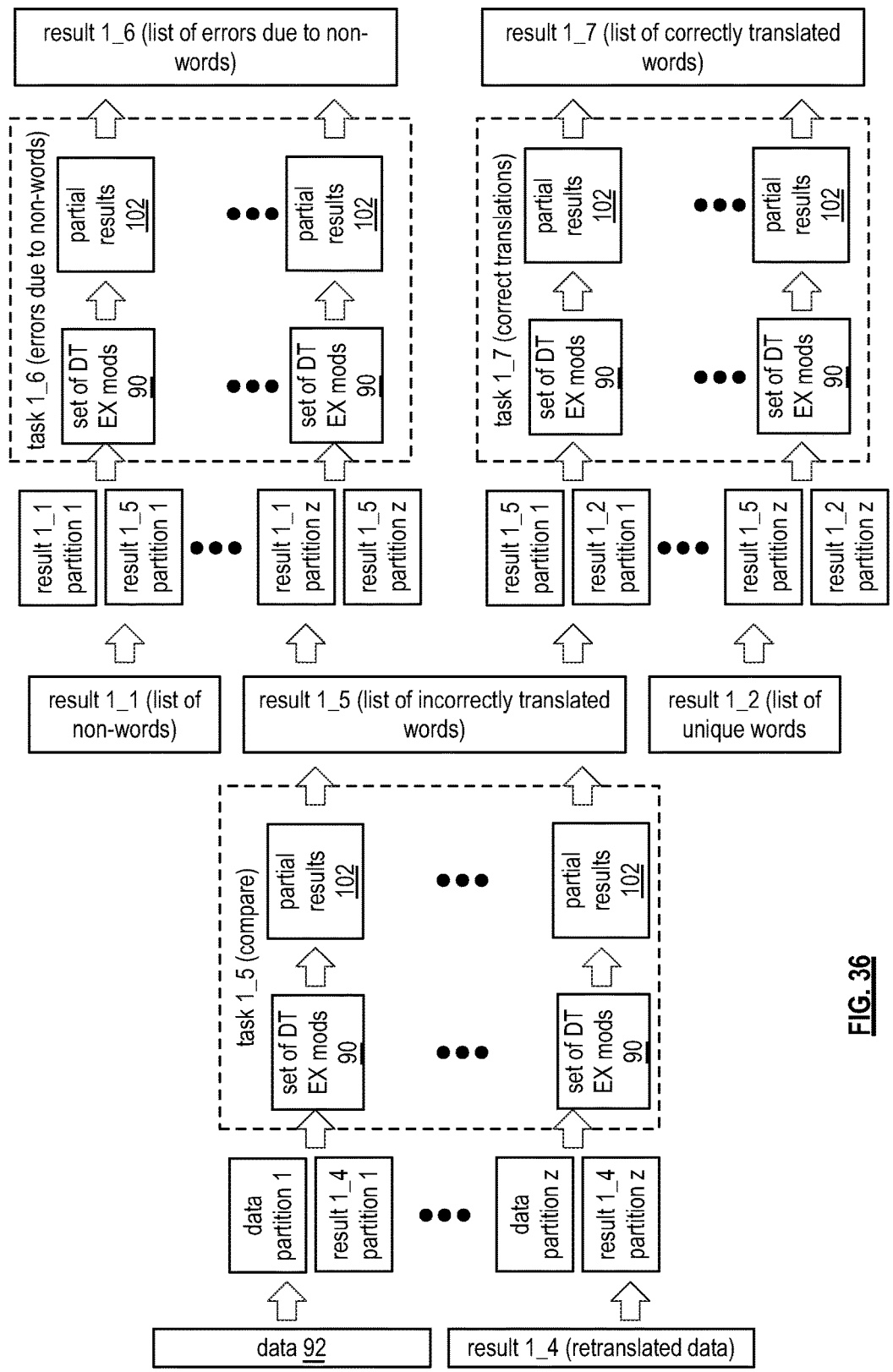

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
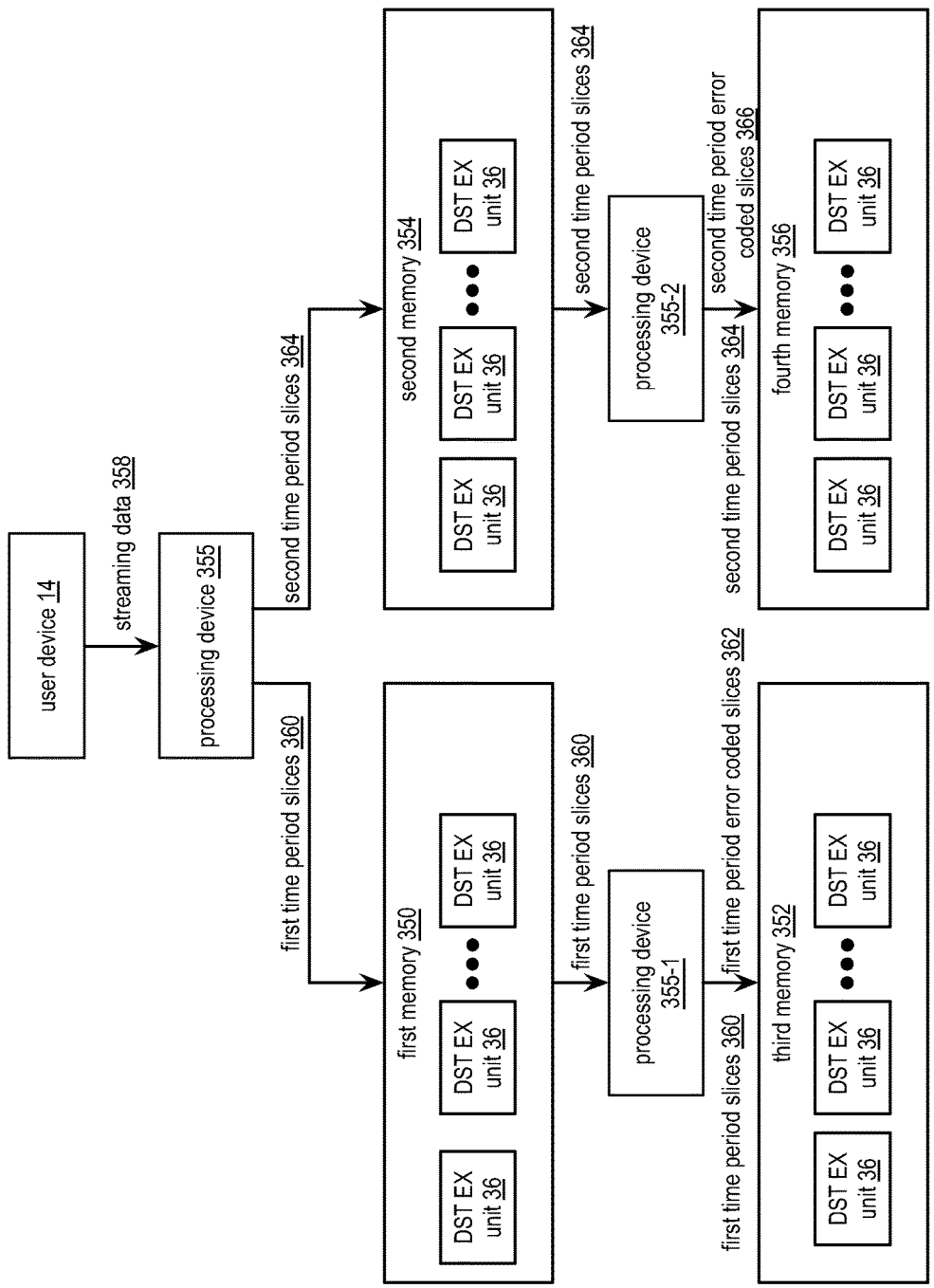
FIG. 40A is a schematic block diagram of another embodiment of a distributed computing system in accordance with the present invention.

FIG. 40A is a schematic block diagram of another embodiment of a distributed computing system that includes user devices 14, one or more distributed storage and task (DST) processing units 16, and DST storage sets 350, 352, 354, 356. Each of the DST storage sets 350-356 includes one or more DST execution units 36.

In an example of operation, one or more user devices 14 (e.g., video surveillance equipment of a building with multiple cameras) send streaming data 358 (e.g., video, audio, multimedia, or other type of data) to a first processing device 355 (e.g., a DST processing unit 16 and/or one or more processing modules thereof). For a variety of reasons, the first processing device 355 may evoke a multi-step dispersed storage error encoding method to error encode and disperse store the streaming data 358. For example, the first processing device 355 may evoke the method due to the data size of the streaming data. As another example, the first processing device 355 may evoke the method to conserve processing resources (for other tasks) while receiving the streaming data. As yet another example, the first processing device 355 may evoke the method in response to a command.

When the method is evoked, the first processing device 355, via one or more of its processing modules, performs a first portion of a dispersed storage error encoding function on the streaming data 358 to produce a plurality of sets of a threshold number of encoded data slices. For example, the processing module(s) segments the streaming data into data segments. For a data segment, the processing module(s) performs a first portion of the dispersed storage error encoding function on the segment to produce a set of a threshold number of encoded data slices. As an example of the first portion of the dispersed storage error encoding function, the processing module(s) arranges the data segment into a data matrix, selects a portion of encoding matrix, and creates a partial coded matrix from the data matrix and the partial encoding matrix. The processing module(s) arranges the partial coded matrix into a set of the threshold number of encoded data slices.

As a specific example, assume that a form of Reed Solomon encoding is used as the dispersed storage error encoding function, where, for a data segment, five encoded data slices are created and any three of them are needed to reconstruct the data segment. Accordingly, an encoding matrix includes five rows of three coefficients and the data segment is arranged into a data matrix having three rows of "n" number of data words. While "n" could be any positive integer, assume "n" is 4 for this example. The partial encoding matrix includes any three rows of the encoding matrix. For example, the partial encoding matrix may include the first three rows, which may correspond to a unity matrix. The processing module(s) multiplies the data matrix by the partial encoding matrix to produce the partial coded matrix, which includes three rows of four encoded values. The processing module(s) then arranges the encoded values of the partial coded matrix into the set of a threshold number of encoded data slices. While this example utilized a form of Reed Solomon encoding, other types of encoding may be used, including, but not limited to, an information dispersal algorithm, on-line codes, forward error correction, erasure codes, convolution encoding, Trellis encoding, Golay, Multidimensional parity, Hamming, Bose Ray Chauduri Hocquenghem (BCH), and/or Cauchy-Reed-Solomon. For these other examples of encoding the first portion corresponds to a level of encoding to produce enough encoded values to recapture the data segment and the second portion corresponds to a level of encoding to produce a desired number of encoded values for error correction of the data segment.

As the processing module(s) of the first processing device 355 is creating sets of the threshold number of encoded data slices, it is alternatingly sending them to a first memory 350 of the DSN (e.g., memory of a first set of DST units) and a second memory 354 of the DSN (e.g., memory of a second set of DST units). The alternating may be done on a set-by-set basis, a group of sets by group of sets basis, or based on time (e.g., for a given period of time, send sets to one of the memories and then for the next interval of time, send sets to the other one of the memories). While the processing module(s) is sending one or more sets to the first or the second memory, it places that memory in a write only mode. As is known, when a hard drive is processing only write commands without interruption for read commands, the hard drive functions more efficiently. The efficiency increases when a multitude of hard drives are being written to in this manner, which is the case in this example since each DST unit 36 of the first or second memory includes at least ten hard drives.

When the first and second memories 350 and 354 are not receiving one or more sets of the threshold number of encoded data slices, they are taken out of the write only mode. The first or second memory may be taken out of the write only mode by placing it in a read only mode or by removing the write only mode and not specifying another mode.

After at least some of the sets of the threshold number of encoded data slices are stored in the first and second memories (e.g., milliseconds, seconds, hours, days, weeks), a second processing device (e.g., other processing module(s) of the first DST processing unit 16 or another DST processing unit 16) reads sets of the threshold number of encoded data slices from the first memory when the first memory is not in the write only mode. After reading the sets, the second processing device performs a second portion of the dispersed storage error encoding function on the read sets of the threshold number of encoded data slices to produce sets of redundancy encoded data slices. For example, a processing module(s) of the second process devices performs the second portion of the dispersed storage error encoding function on a set of the threshold number of encoded data slices to produce a set of redundancy encoded data slices, wherein the set of threshold number of encoded data slices and the set of redundancy encoded data slices collectively provides a set of encoded data slices.

As an example of the second portion of the dispersed storage error encoding function, the processing module(s) decode the set of threshold number of encoded data slices to recapture the data segment. The processing module(s) then arrange the recaptured data segment into a data matrix, selects a second portion of encoding matrix, and creates a second partial coded matrix from the data matrix and the second partial encoding matrix. The processing module(s) arranges the second partial coded matrix into the set of redundancy encoded data slices.

As a specific example, assume that a form of Reed Solomon encoding is used as the dispersed storage error encoding function, where, for a data segment, five encoded data slices are created and any three of them are needed to reconstruct the data segment. Accordingly, an encoding matrix includes five rows of three coefficients and the data segment is arranged into a data matrix having three rows of "n" number of data words. While "n" could be any positive integer, assume "n" is 4 for this example. The second partial encoding matrix includes any two rows of the encoding matrix. For example, the second partial encoding matrix may include the last two rows, where the first three rows may correspond to a unity matrix. The processing module(s) multiplies the data matrix by the second partial encoding matrix to produce the second partial coded matrix, which includes two rows of four encoded values. The processing module(s) then arranges the encoded values of the second partial coded matrix into the set of redundancy encoded data slices.

After the second processing device has created the sets of redundancy encoded data slices, it stores them in a third memory 352 of the DSN (e.g., memory of a third set of DST units 36). Note that the second processing device may place the third memory 352 in a write only mode before storing the redundancy encoded data slices therein.

A third processing device (e.g., another DST processing unit 16 or other processing modules of one or more of the other DST processing units 16) performs a similar function on the sets of the threshold number of encoded data slices that are stored in the second memory. In particular, when the second memory is not in the write only mode, the third processing module reads and then decodes the set of the threshold number of encoded data slices to recapture data segments. For each recaptured data segment, the third processing device performs the second portion of the dispersed storage error encoding function to produce a set of redundancy encoded data slices, which it stores in a fourth memory 356 of the DSN (e.g., a fourth set of DST units 36).

When the streaming data has ended, the sets of redundancy encoded data slices may be transferred from the third memory to the first memory to produce first sets of encoded data slices. Similarly, the sets of redundancy encoded data slices may be transferred from the fourth memory to the second memory to produce second sets of encoded data slices. The first sets of encoded data slices may be further transferred to the second memory such that a plurality of sets of encoded data slices for the streaming data are stored in the second memory. Transferring of the sets of redundancy encoded data slices, the first and/or second set of encoded data slices, and/or the sets of the threshold number of encoded data slices may be done in a variety of ways between the four memories. Regardless of the encoded data slices are transferred, an address mapping is created to track where the sets of encoded data slices of the streaming data are stored.

Figure 40B:
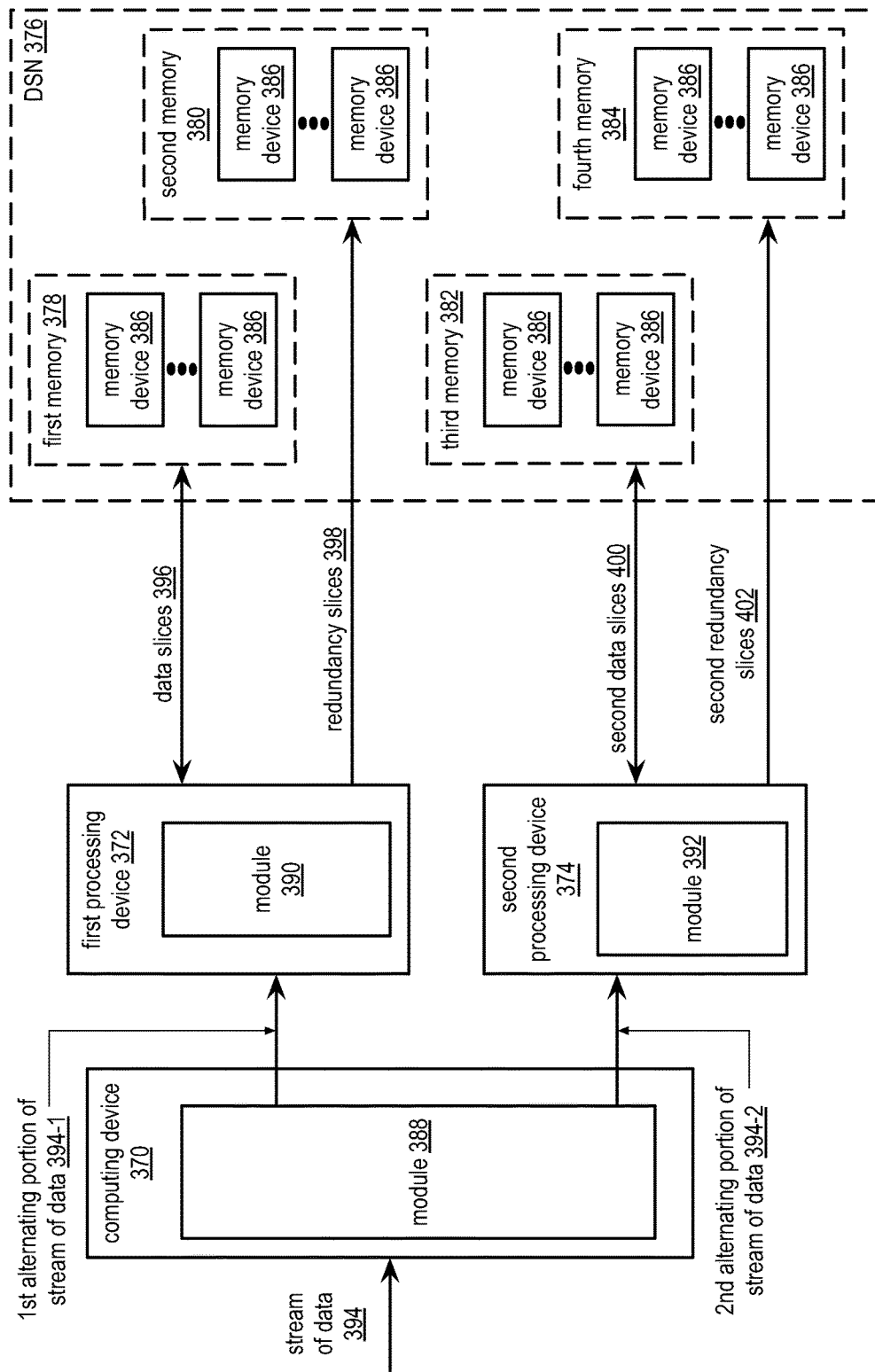
FIG. 40B is a schematic block diagram of an embodiment of a dispersed storage system in accordance with the present invention.

FIG. 40B is a schematic block diagram of an embodiment of a dispersed storage system that includes a computing device 370, a first processing device 372, a second processing device 374, and a dispersed storage network (DSN) 376. The DSN 376 includes a plurality of memories including a first memory 378, a second memory 380, a third memory 382, and a fourth memory 384. The computing device 370 includes a module 388 and may be a user device, a DST processing unit 16, or other device within the system. Each of the first and second processing devices 372 and 374 includes a module 390 and 391 and may be a DST processing unit 16, one or more processing modules of a DST execution unit 16, and/or other device in the system. Each of the memories 378-384 includes a plurality of memory devices 386 (e.g., a set of DST units 36, each of which includes a plurality of disk drives, or the like).

In an example of operation, the computing device 370 receives a stream of data (or streaming data) 394. Via the module 388, the computing device 370 alternatingly sends a first portion of the stream of data 394-1 to the first processing device 372 and a second portion of the stream of data 394-2 to the second processing device 374. The computing device 370 may alternate the sending of the streaming data in accordance with alternating first and second time intervals (which may be of the same duration, different durations, and/or varying durations). Accordingly, the computing device 370 sends the streaming data to the first processing device during the first time intervals and sends the streaming data to the second processing device during the second time intervals.

The first processing device 372, via module 390, performs the first portion of the dispersed storage error encoding function on the first alternating portions of the streaming data to produce first sets of the threshold number of encoded data slices. When the first memory 378 is in the write only mode, the first processing device 372 writes the first sets of the threshold number of encoded data slices 396 to the first memory 378. Similarly, the second processing device performs the first portion of the dispersed storage error encoding function on the second alternating portion of the streaming data 394-2 to produce second sets of the threshold number of encoded data slices 400. When the third memory 382 is in the write only mode, the second processing device 374 writes the second sets of the threshold number of encoded data slices to the third memory 382.

When the first memory 378 is not in the write only mode, the first processing device 372 reads the first sets of the threshold number of encoded data slices 396 from the first memory 378. The first processing device 372 then decodes the first sets of the threshold number of encoded data slices to produce a first set of reconstructed data segments. For each reconstructed data segment, the first processing device performs a second portion of the dispersed storage error encoding function to produce a set of redundancy encoded data slices 398. The first processing device writes the sets of redundancy encoded data slices 398 to the second memory 380.

When the third memory 382 is not in the write only mode, the second processing device 374 reads the second sets of the threshold number of encoded data slices 400 from the third memory 382. The second processing device 374 then decodes the second sets of the threshold number of encoded data slices to produce a second set of reconstructed data segments. For each reconstructed data segment, the second processing device performs a second portion of the dispersed storage error encoding function to produce a set of redundancy encoded data slices 402. The second processing device writes the sets of redundancy encoded data slices 402 to the fourth memory 384.

When the streaming data has ended, the sets of redundancy encoded data slices may be transferred from the second memory to the first memory to produce first sets of encoded data slices. Similarly, the sets of redundancy encoded data slices may be transferred from the fourth memory to the third memory to produce second sets of encoded data slices. The first sets of encoded data slices may be further transferred to the third memory such that a plurality of sets of encoded data slices for the streaming data are stored in the third memory. Transferring of the sets of redundancy encoded data slices, the first and/or second set of encoded data slices, and/or the sets of the threshold number of encoded data slices may be done in a variety of ways between the four memories. Regardless of the encoded data slices are transferred, an address mapping is created to track where the sets of encoded data slices of the streaming data are stored.

Figure 40C:
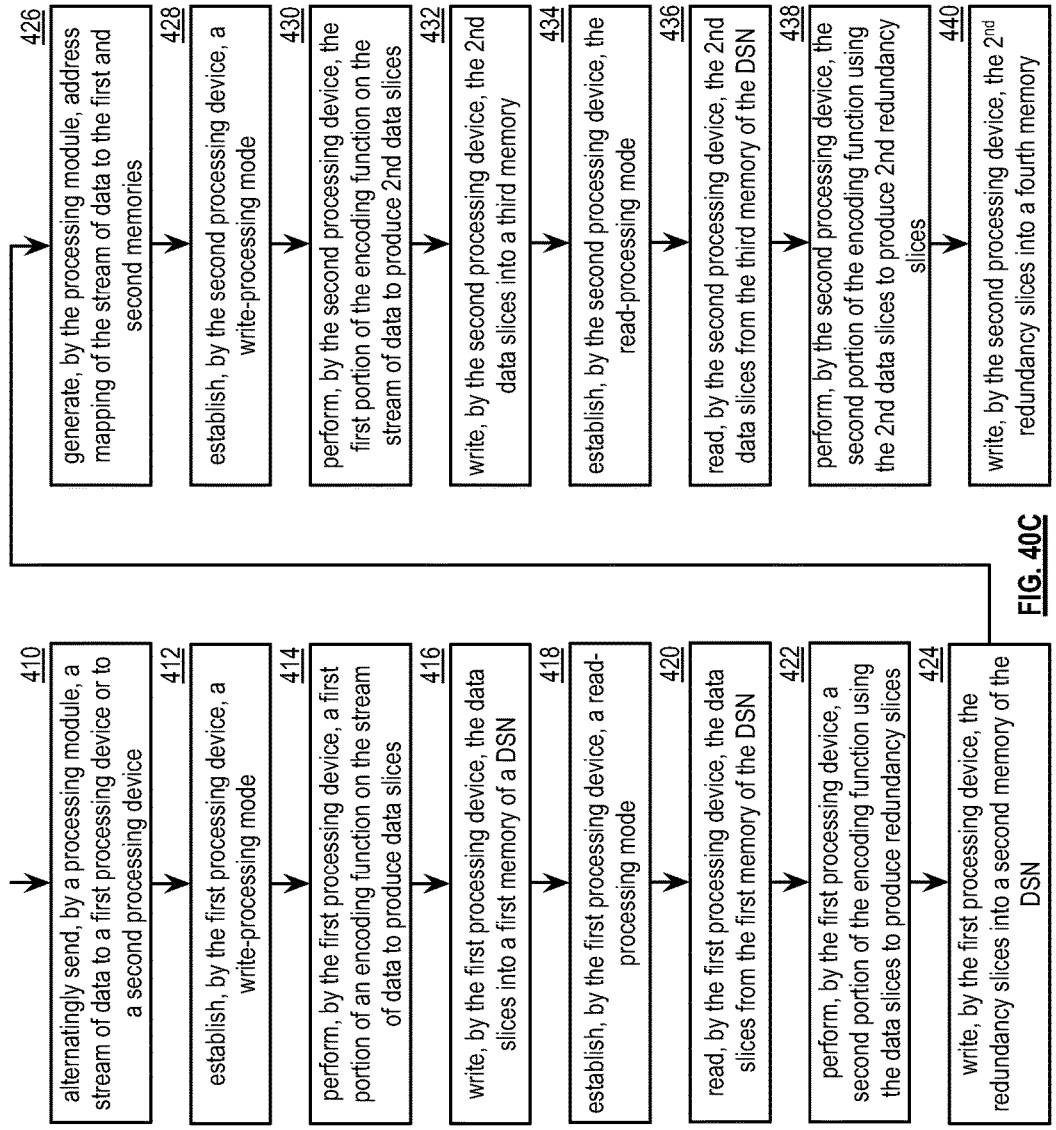
FIG. 40C is a flowchart illustrating an example of storing data in accordance with the present invention.

FIG. 40C is a flowchart illustrating an example of storing data. The method begins at step 410 where a processing module of a computing device alternatingly sends a stream of data to a first processing device or to a second processing device, where each of the first and second processing devices is in a write-processing mode or in a read-processing mode. The alternatingly sending the stream of data includes a series of sending steps. A first sending step includes establishing an alternating first time interval and second time interval. A second sending step includes sending the stream of data to the first processing device during the first time interval. A third sending step includes sending the stream of data to the second processing device during the second time interval. The first and second time intervals may be the same duration, different durations, fixed for the stream of data, and/or varying for the stream of data. The processing module may further alternatingly send the stream of data to the first processing device, to the second processing device, or to a third processing device, where each of the first, second, and third processing devices is in the write-processing mode, in the read-processing mode, or is in a wait mode (e.g., idle).

The method continues at step 412 where the first processing device establishes the write-processing mode when the first processing device is receiving the stream of data. The establishing includes setting the first memory in a write only mode when the first processing device is in the write-processing mode. The setting includes at least one of selecting a first set of memory devices as the first memory, sending a write mode of operation request to the first memory, and suspending read requests from transmission to the first memory.

When in the write-processing mode, the method continues at step 414 where the first processing device performs a first portion of a dispersed storage error encoding function on the received stream of data to produce a plurality of sets of a threshold number of encoded data slices. The first portion of the dispersed storage error encoding function corresponding to a level of encoding to produce the plurality of sets of the threshold number of encoded data slices.

The method continues at step 416 where the first processing device writes the sets of the threshold number of encoded data slices into a first memory of a dispersed storage network (DSN). For example, the processing module issues at least a threshold number of write slice requests to a threshold number of storage devices of the first memory, where the threshold number of write slice requests includes the plurality of sets of the threshold number of encoded data slices.

The method continues at step 418 where the first processing device establishes the read-processing mode when the first processing device is not receiving the stream of data. The first processing device establishes this mode by setting the first memory in a read only mode, which includes at least one of: sending a read mode of operation request to the first memory and suspending write requests from transmission to the first memory.

When in the read-processing mode, the method continues at step 420 where the first processing device reads the sets of the threshold number of encoded data slices from the first memory. The method continues at step 422 where the first processing device performs a second portion of the dispersed storage error encoding function using the sets of the threshold number of encoded data slices to produce sets of redundancy encoded data slices. The second portion of the dispersed storage error encoding function corresponds to a level of encoding to produce the sets of the redundancy encoded data slices.

The method continues at step 424 where the first processing device writes the sets of redundancy encoded data slices into a second memory of the DSN. The method continues at step 426 where the processing module of the computing device and/or of the first and/or second processing devices generates an address mapping of the stream of data to the first and second memories, where the address mapping links a set of the threshold number of encoded data slices with a corresponding set of redundancy encoded data slices to produce a set of encoded data slices.

While the method shows that steps 428-440 are done subsequently to step 426, these steps may actually be done in parallel with steps 412-424. At step 428, the second processing module establishes the write-processing mode when the second processing device is receiving the stream of data. The method continues at step 430 where the second processing device performs the first portion of the dispersed storage error encoding function on the received stream of data to produce sets of a threshold number of encoded data slices. The method continues at step 432 where the second processing device writes the sets of the threshold number of encoded data slices into a third memory of the DSN.

The method continues at step 434 where the second processing device establishes the read-processing mode when the second processing device is not receiving the stream of data. When in the read-processing mode, the method continues at step 436 where the second processing device reads the sets of the threshold number of encoded data slices from the third memory. The method continues at step 438 where the second processing device performs the second portion of the dispersed storage error encoding function using the sets of the threshold number of encoded data slices to produce a set of redundancy encoded data slices. The method continues at step 440 where the second processing device writes the sets of redundancy encoded data slices into fourth memory of the DSN. Alternatively, or in addition to, the second processing device writes the second plurality of sets of redundancy encoded data slices into the second memory of the DSN.

Figure 41A:
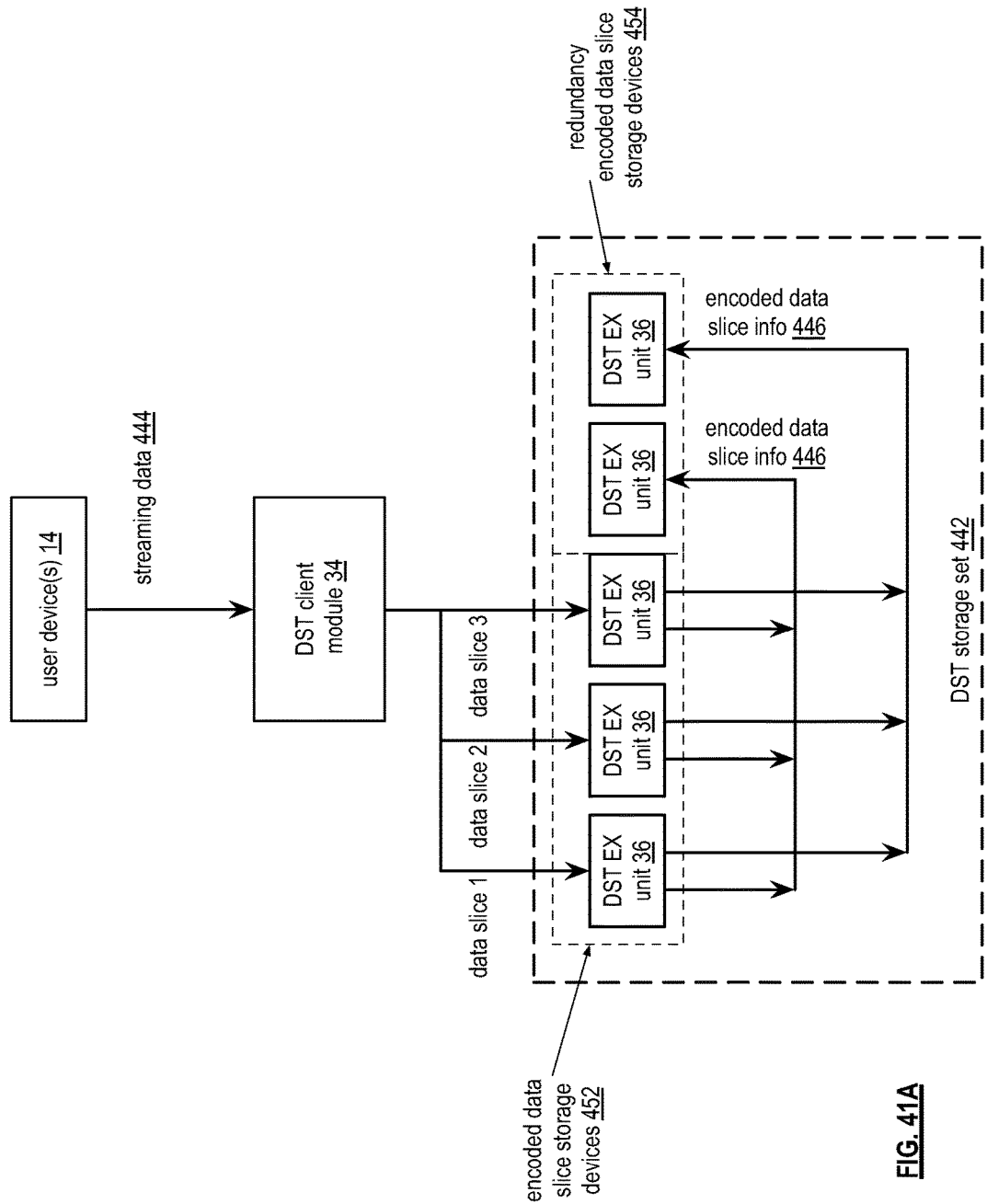
FIG. 41A is a schematic block diagram of another embodiment of a distributed computing system in accordance with the present invention.

FIG. 41A is a schematic block diagram of another embodiment of a distributed computing system that includes a user device 14, a DST client module 34 (which may be included in a DST processing unit 16, a user device, and/or one or more DST EX units 36), and a DST storage set 442. The DST storage set 442 includes a plurality of DST execution units 36 that are arranged into encoded data storage devices and redundancy encoded data storage devices. For example, the encoded data storage devices includes a decode threshold number of DST execution units 36 (i.e., the DST EX units in this group storage a decode threshold number of encoded data slices of an encoded data segment to recapture the data segment) and the redundancy encoded data storage devices includes DST execution units 36 that store remaining encoded data slices of a set of encoded data slices of the encoded data segment. As a specific example, data segments of the streaming data 444 are encoded into sets of five encoded data slices, where, for a data segment, three of the encoded data slices are stored in the encoded data slice storage group of devices and the remaining two encoded data slices are stored in the redundancy encoded data slice storage group of devices.

Prior to receiving the streaming data 444, the set of DST ET units (e.g., a set of storage devices) performs a method to establish which of the DST EX units 36 will be in the group of encoded data slice storage devices 452 and which will be in the group of redundancy encoded data slice storage devices 454. The method will be described in greater detail with reference to FIG. 41C.

In an example of operation after the DST EX units 36 are configured into the groups, the user device sends streaming data 444 (e.g., streaming video, audio, text, graphics, multimedia, etc.) to the DST client module 34. The DST client module 34 divides the streaming data 444 into data segments and partially encodes each of the data segments in accordance with dispersed storage error encoding parameters to produce, for a data segment, a decode threshold number of encoded data slices 1-3. For example, the DST client module 34 performs a first portion of the dispersed storage error encoding function to produce the decode threshold number of encoded data slices.

For each encoded data segment, the DST client module 34 sends the decode threshold number of encoded data slices to DST execution units 36 within the group of encoded data slice storage devices. For example of storing encoded data slices of an encoded data segment, encoded data slice 1 may be stored by a first DST EX unit 36, encoded data slice 2 may be stored by a second DST EX unit 36, and encoded data slice 3 may be stored by a third DST EX unit 36.

Having stored encoded data slices for an encoded data segment, each of the DST execution unit 36 of the group of encoded data slice storage devices sends information 446 regarding its stored encoded data slice to the DST EX units in the group of redundancy encoded data slice storage devices. For example, the information 446 may be the stored encoded data slices themselves such that the DST execution units 36 in the group of redundancy encoded data slice storage devices creates redundancy encoded data slices (e.g., the remaining encoded data slices of a set of encoded data slices for a data segment) and stores them. In another example, the information 446 may be partially encoded data slices, which the DST execution unit 36 decodes to produce the redundancy encoded data slices. An example of creating and decoding partially encoded data slices will be discussed with reference to FIG. 41B.

Figure 41B:
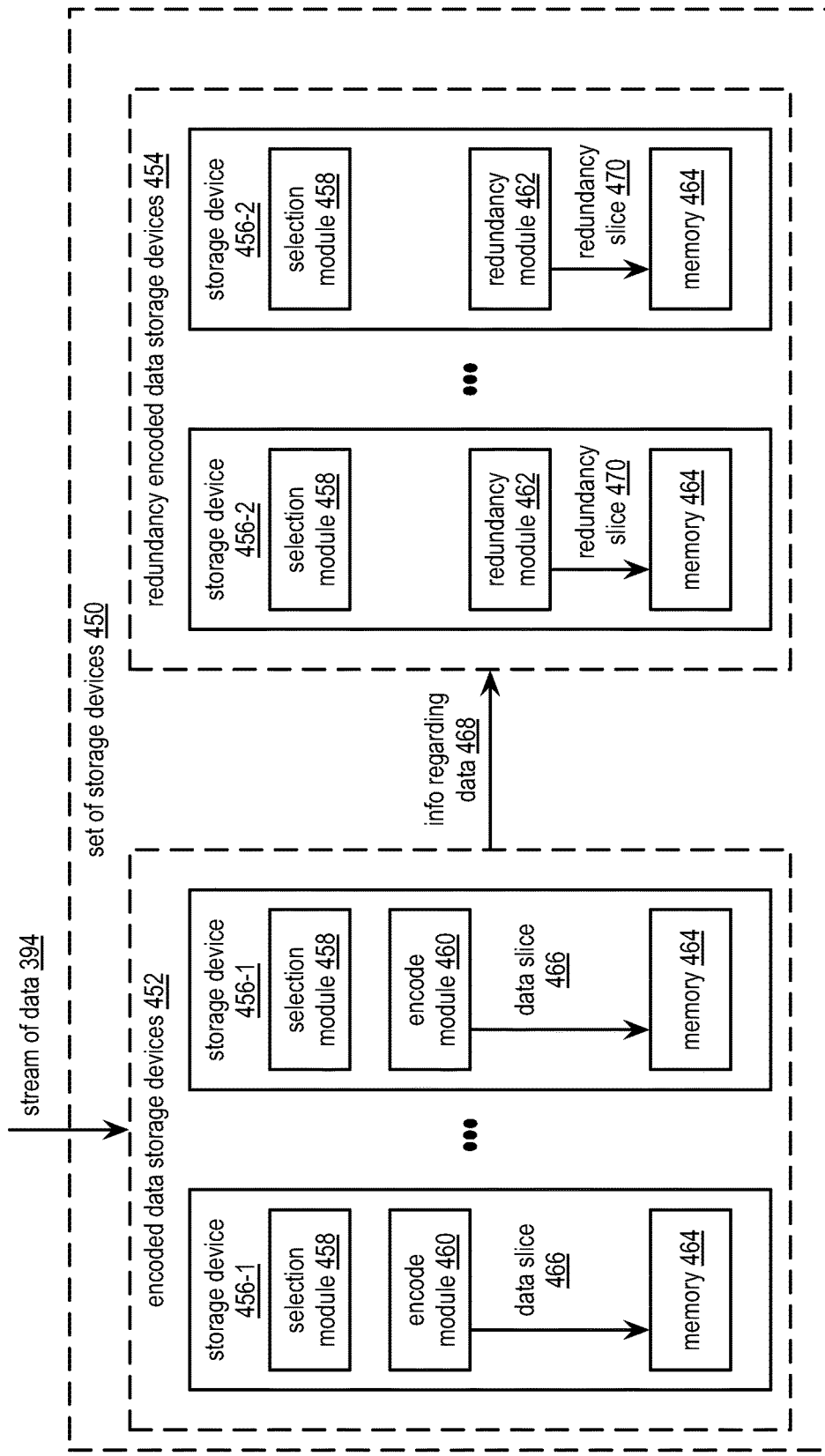
FIG. 41B is a schematic block diagram of another embodiment of a dispersed storage system in accordance with the present invention.

FIG. 41B is a schematic block diagram of another embodiment of a dispersed storage system that includes a set of storage devices 450, where each storage device 456 includes a selection module 458, an encoding module 460, a redundancy module 462, and memory 464. The set of storage devices 450 self configures into encoded data storage devices 452 and redundancy encoded data storage devices 454 by executing the method of FIG. 41C. The storage devices 456 may be DST EX unit 36, where storage devices 456-1 of the encoded data slice storage devices 452 utilize the selection module 458, the encode module 460, and the memory 464, while storage devices 456-2 of the redundancy encoded data slice storage devices 454 utilize the selection module 458, the redundancy module 462, and memory 464.

In an example of self-configuring, the set of storage devices coordinates to select dispersed storage error encoding parameters for storing a stream of data. For example, the set of storage devices coordinate determining, via the selection module(s) 458, an error encoding method (e.g., Reed Solomon, an information dispersal algorithm, on-line codes, forward error correction, erasure codes, convolution encoding, Trellis encoding, Golay, Multidimensional parity, Hamming, Bose Ray Chauduri Hocquenghem (BCH), and/or Cauchy-Reed-Solomon, etc.). The set also determines the number of coded words, or encoded slices, to create for a given data segment (e.g., pillar width) and the number code words, or encoded slices, needed to recover the data segment (e.g., a decode threshold). The set 450 may further determine how the stream of data is to be segmented into data segments (e.g., fixed size, varying size, etc.). Still further, the set 450 may determine whether the data segments are to be encrypted, compresses, integrity information created therefor, etc. prior to encoding (e.g., pre-error encoding data processing). The set 450 may even further determine whether the encoded data slices are to be encrypted, compressed, integrity information created therefor, etc. As a specific example, the set of storage devices determines that, for each data segment, integrity information is to be created prior to encoding, five code word or encoded data slices are be to created from the encoding, and three of them are needed to recover the data segment.

The set of storage devices 450 coordinates, via the selection module(s) 458, dividing the set of storage devices into the encoded data storage devices 452 and the redundancy encoded data storage devices 454. For example and based on the selected dispersed storage error encoding parameters, the set 450 selects a number of storage units for encoded data storage devices 452 to correspond to the selected decode threshold and a number of storage units for the redundancy encoded data storage devices to correspond to the number of encoded slices minus the decode threshold.

In an example of processing a stream of data 394 and with the set of storage devices 450 divided into the two sub-sets 452 and 454, the storage devices of the encoded data storage devices 452 coordinate storage of a decode threshold amount of encoded data of the stream of data. For example, an encoding module 460 of one of the storage devices in sub-set 452 divides the stream of data 394 into data segments and encodes, on a data segment by data segment basis, a data segment into a decode threshold number of encoded data slices. As a particular example, the encoding module 460 performs a first portion of a dispersed storage error encoding function. For an encoded data segment, the encoding module 460 sends the decode threshold number of encoded data slices to the memories 464 of the storage devices in the sub-set 452. For example, if the encoding module 460 creates three encoded data slices for an encoded data segment, it sends one of the encoded data slices to its memory 464, sends another encoded data slice to the memory 464 of another storage device 456-1, and sends the third encoded data slice to the memory 464 of a third storage device 456-1. Alternatively, the encoding may be done in a distribute manner between the encoding modules 460 of the storage devices 460.

Having stored, or while storing, the decode threshold amount of encoded data, the encoded data storage devices 452 create information regarding the decode threshold amount of encoded data 468. For example and on a data segment by data segment basis, the encoded data storage devices 452 create information regarding the decode threshold number of encoded data slices. The information may be the encoded data slices, partially encoded data slices, and/or other information that may be used to create the remaining encoded data slices of a set of encoded data slices for a data segment (e.g., redundancy encoded data slices).

As a specific example and on a data segment by data segment basis, an encoding module 460 of the encoded data storage devices 452 creates partially encoded data slices for a data segment by obtaining an encoding matrix and reducing it to produce a square matrix that includes rows associated with the decode threshold number encoded data slices. The encoding module 460 then inverts the square matrix to produce an inverted matrix. The encoding module 460 then matrix multiplies the inverted matrix by a corresponding encoded data slice 466 to produce a data vector (e.g., a partially decoded data segment). The encoding module 460 then matrix multiplies the data vector by a row of the encoding matrix corresponding to an encoded data slice of the decode threshold number of encoded data slices to produce a partial encoded redundancy slice. This process is repeated for each of the redundancy encoded data slice to be created. The encoded data storage devices 452 then send the information regarding the decode threshold amount of encoded data 468 to the redundancy encoded data storage devices 454.

The redundancy encoded data storage devices 454 generate redundancy encoded data based on the information regarding the decode threshold amount of encoded data 468 and in accordance with the dispersed storage error encoding parameters. For example and on a data segment by data segment basis, one or more of the redundancy encoded data storage devices 454 receive information regarding the decode threshold number of encoded data slices. The storage device(s) 456-2 processes the information regarding the decode threshold number of encoded data slices to produce the remaining encoded data slices of the set of encoded data slices for a data segment (e.g., the redundancy encoded data slices). As a specific example, the storage device(s) 456-2 performs a second portion of a dispersed storage error encoding function.

As another specific example, a redundancy module 462 of the storage device(s) 456-2 process the partially encoded data slices by summing the partially error coded data in a field such as modulo some prime. For instance, the redundancy module 462 receives a decode threshold number of partial encoded redundancy slices and performs an exclusive OR function on the partial encoded redundancy slices to produce one or more redundancy encoded data slices 470. The redundancy encoded data storage devices 454 stores the redundancy encoded data. For example, the storage devices 454 stores the redundancy encoded data slices for a data segment.

Note that the coordinating done by the set of storage devices, by the encoded data storage devices, and/or by the redundancy encoded data storage devices may be done in a centralized manner and/or in a distribute manner. Further, from coordinating step to coordinating step (e.g., selection of dispersed storage error encoding parameters, selection of grouping the storage devices, storing a decoded threshold amount of encoded data, etc.), the manner may change from centralized to distributed, or vise versa.

Figure 41C:
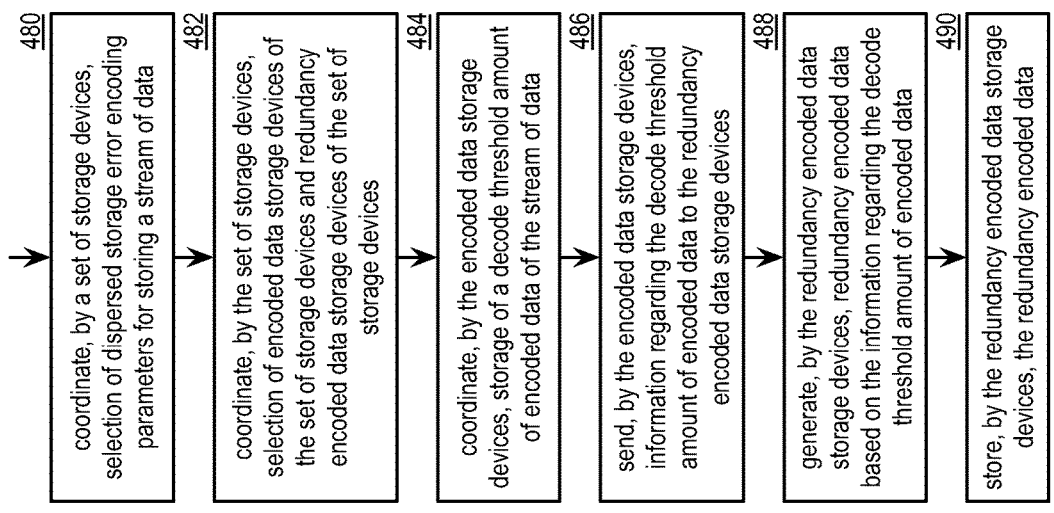
FIG. 41C is a flowchart illustrating another example of storing data in accordance with the present invention.

FIG. 41C is a flowchart illustrating another example of storing data. The method begins at step 480 where a set of storage devices coordinates selection of dispersed storage error encoding parameters for storing a stream of data. The storage devices select the dispersed storage error encoding parameters by determining one or more of a redundancy factor, an encoding pillar width, a decode threshold, a data segmenting process, pre-error encoding data processing, and post-error encoding data processing.

The method continues at step 482 where the set of storage devices coordinates selection of which storage devices to include in a group of encoded data storage devices and which storage devices to include in a group of redundancy encoded data storage devices. For example, the set coordinates dividing the storage devices into the sub-sets by determining, based on the dispersed storage error encoding parameters, a data segment threshold number (e.g., determining the decode threshold for a data segment) and a redundancy factor (e.g., for a data segment, the number of encoded data slices in a set of encoded data slices minus the decode threshold number of encoded data slices). The set then selects storage devices to be in the group of encoded data storage devices based on the data segment threshold number and selects storage devices to be in the group of redundancy encoded data storage devices based on the redundancy factor. As a specific example, if the data segment threshold number is three and the redundancy factor is two, then the set selects three storage devices for inclusion in the group of encoded data storage devices and two storage devices for inclusion in the group of redundancy encoded data storage devices.

The method continues at step 484 where the encoded data storage devices coordinate storage of a decode threshold amount of encoded data (e.g., a decode threshold number of encoded data slices for a data segment of the stream of data), in accordance with the dispersed storage error encoding parameters. For example, the encoded data storage devices coordinate partitioning the stream of data into a stream of data partitions, or data segments, and coordinating encoding the data segments into set of the decode threshold number of encoded data slices.

The method continues at step 486 where the encoded data storage devices send information regarding the decode threshold amount of encoded data to the redundancy encoded data storage devices. For example, the encoded data storage devices send a corresponding portion (e.g., an encoded data slice) of the decode threshold amount of encoded data. As another example, the encoded data storage devices generate partially error coded data (e.g., a partial encoded redundancy slice) based on a corresponding portion of the decode threshold amount of encoded data (e.g., an encoded data slice) and send the partially error coded data to the redundancy encoded data storage devices.

The method continues at step 488 where the redundancy encoded data storage devices generate redundancy encoded data (e.g., redundancy encoded data slices) based on the information regarding the decode threshold amount of encoded data and in accordance with the dispersed storage error encoding parameters. For example, a redundancy encoded data storage device receives corresponding portions of the decode threshold amount of encoded data (e.g., the decode threshold number of encoded data slices for a data segment) and generates a corresponding portion of the redundancy encoded data therefrom. As another example, a redundancy encoded data storage device receives partially error coded data and generates a corresponding portion of the redundancy encoded data therefrom (e.g., summing the partial encoded redundancy slices in a field such as modulo some prime). The method continues at step 490 where the redundancy encoded data storage devices store the redundancy encoded data to provide error encoded reliable storage of the stream of data.

Figure 42:
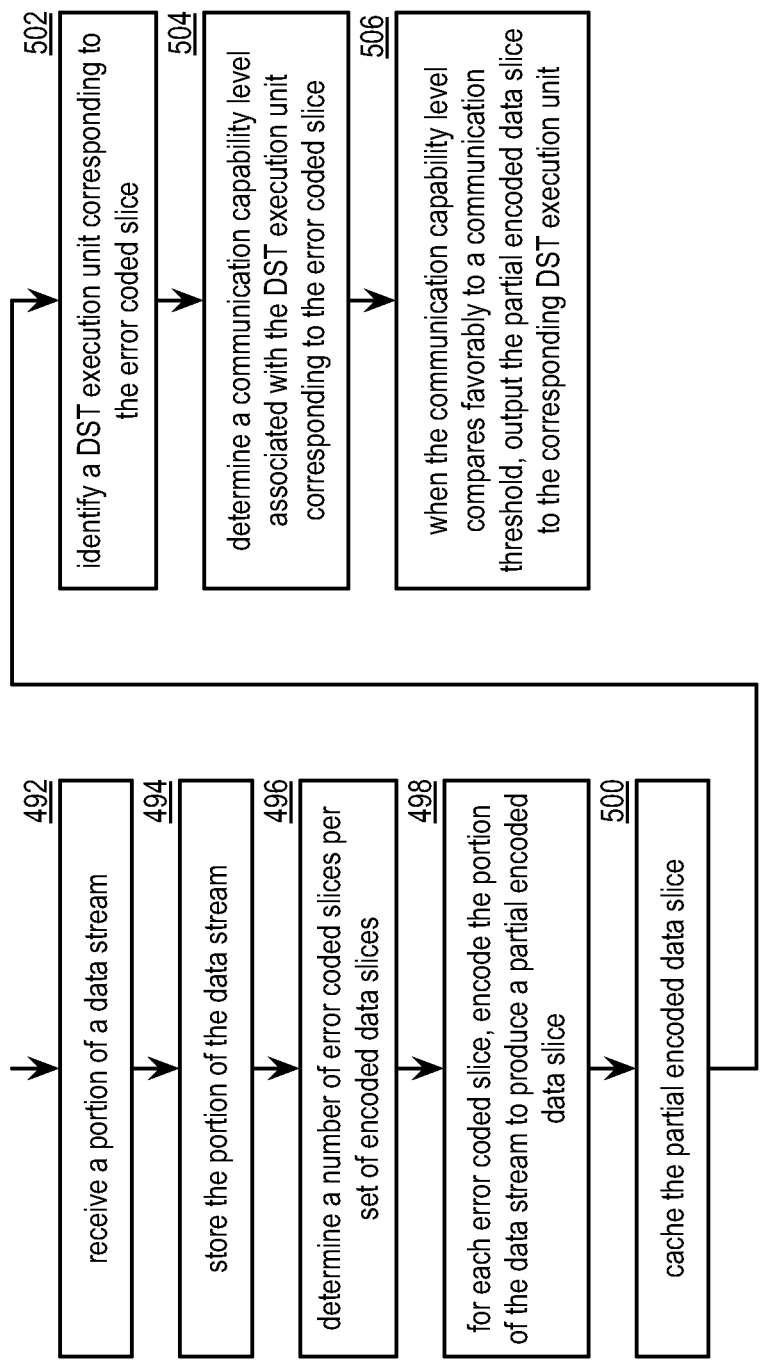
FIG. 42 is a flowchart illustrating another example of storing data in accordance with the present invention.

FIG. 42 is a flowchart illustrating another example of storing data. The method begins at step 492 where a processing module (e.g., of a distributed storage and task (DST) client module of a DST execution unit) receives a portion of a data stream. The method continues at step 494 where the processing module stores the portion of the data stream. The method continues at step 496 where the processing module determines a number of error coded slices per set of encoded data slices. The method continues at step 498, where, for each error coded slice, the processing module encodes the portion of the data stream to produce a partial encoded data slice. The method continues at step 500 where the processing module caches the partial encoded data slice. The method continues at step 502 where the processing module identifies a DST execution unit corresponding to the error coded slice. The identifying includes at least one of a lookup, receiving an identifier, and identifying the DST execution unit corresponding to the error coded slice when a pillar identifier associated with the DST extension unit compares favorably (e.g., substantially the same) to a pillar identifier of the error coded slice.

The method continues at step 504 where the processing module determines a communication capability level associated with the DST execution unit corresponding to the error coded slice. The communication capability level includes one or more of a network bandwidth, a latency, and an activity level. The determining may be based on one or more of a query, a test, an error message, and a lookup. When the communication capability level compares favorably to a communication threshold, the method continues at step 506 where the processing module outputs the partial encoded data slice to the corresponding DST execution unit.

Figure 43A:
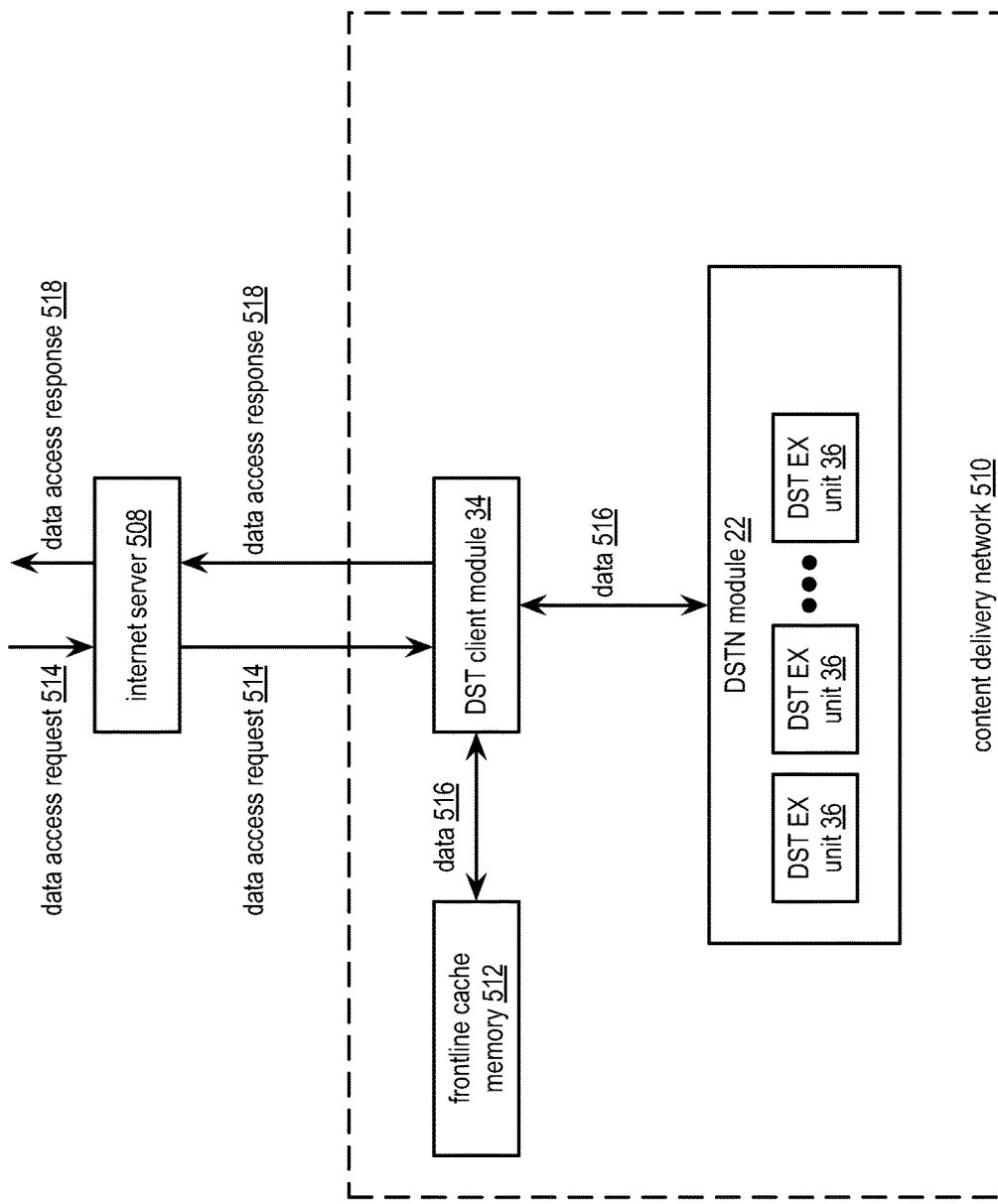
FIG. 43A is a schematic block diagram of another embodiment of a distributed computing system in accordance with the present invention.

FIG. 43A is a schematic block diagram of another embodiment of a distributed computing system that includes an internet server 508 and a content delivery network (CDN) 510. The CDN 510 includes a front-line cache memory 512, a distributed storage and task (DST) client module 34, and a distributed storage and task network (DSTN) module 22. The DSTN module 22 includes a plurality of DST execution units 36 or storage devices. Alternatively, any number of internet servers 508 may be operably coupled to the CDN 510. Alternatively, the DST client module 34 may be implemented in the internet server 508.

The internet server 508 is operable to receive a data access request 514 (e.g., via the internet) from a requesting entity, present the data access request 514 to the CDN 510, receive a data access response 518 from the CDN 510, and present the data access response 518 to the requesting entity. The data access request 514 includes one or more of an access type indicator, a requesting entity identifier, and data 516 for storage. For example, the data access request 514 includes a store data request access type indicator and the data 516 for storage when the data access request 514 is in regards to storing new data. As another example, the data access request 514 includes a retrieve data request access type indicator when the data access request 514 is in regards to retrieving the data 516. The data access response 518 includes one or more of a response type indicator, the requesting entity identifier, and retrieved data of data 516.

The DST client module 34 receives data 516 from a store data access request and stores the data 516 in the frontline cache memory 512. Subsequent to storing the data 516 in the frontline cache memory 512 (e.g., 10 minutes later), the DST client module 34 determines whether the data 516 stored in the frontline cache memory 512 substantially matches data stored in the DSTN module 22. The determining may be based on one or more of comparing the data 516 to the data stored in the DSTN module 22, comparing a deterministic value calculated from the data 516 to a deterministic value calculated from the data stored in the DSTN module, a lookup, and receiving an indication. When the DST client module 34 determines that the data 516 stored in the frontline cache memory 512 does not substantially match data stored in the DSTN module, the DST client module 34 facilitate storing the data 516 in the DSTN module 22. The facilitating includes retrieving the data five and 16 from the frontline cache memory 512, encoding the data 516 utilizing a dispersed storage error coding function to produce a plurality of sets of encoded data slices, and sending the plurality of sets of encoded data slices to the DSTN module 22 for storage therein.

Subsequent to storing the data in the DSTN module 22, the DST client module 34 may delete the data five and 16 from the frontline cache memory 512. The deleting includes determining when to delete 516. The determining when to delete includes at least one of determining that a time period has expired since storing the data five and 16 in the DSTN module 22, receiving a delete request, and determining that available memory space of the frontline cache memory 512 is less than a memory low threshold level.

Data 516 may be retrieved from the CDN when the data access request 514 includes a retrieve data request. The DST client module 34 receives a data access request 514 that includes a retrieve data request type. The DST client module 34 determines a storage location associated with the data 516. The storage location includes at least one of a storage address (e.g., a memory device identifier, an offset within the memory device) of the frontline cache memory 512 and a storage address (e.g., a DSTN address, a source name, a plurality of sets of slice names) of the DSTN module 22. The determining includes at least one of a lookup, receiving storage location information, and a query. When the DST client module 34 determines that the data five and 16 is stored in the frontline cache memory 512, the DST client module 34 retrieves the data 516 from the frontline cache memory 512. When the DST client module 34 determines that the data 516 is not stored in the frontline cache memory 512, the DST client module retrieves the data 516 from the DSTN module 22. Retrieving the data 516 from the DSTN module 22 includes generating a plurality of sets of read slice requests, sending the plurality of sets of read slice requests to the DSTN module 22, receiving at least a decode threshold number of encoded data slices for each set of the plurality of sets of encoded data slices, and decoding the least the decode threshold number of encoded data slices for each set of the plurality of sets of encoded data slices utilizing the dispersed storage error coding function to reproduce the data 516. Next, the DST client module 34 generates a data access response 518 that includes the data 516 and outputs the data access response 518 to the internet server 508 for delivery to a requesting entity.

Figure 43B:
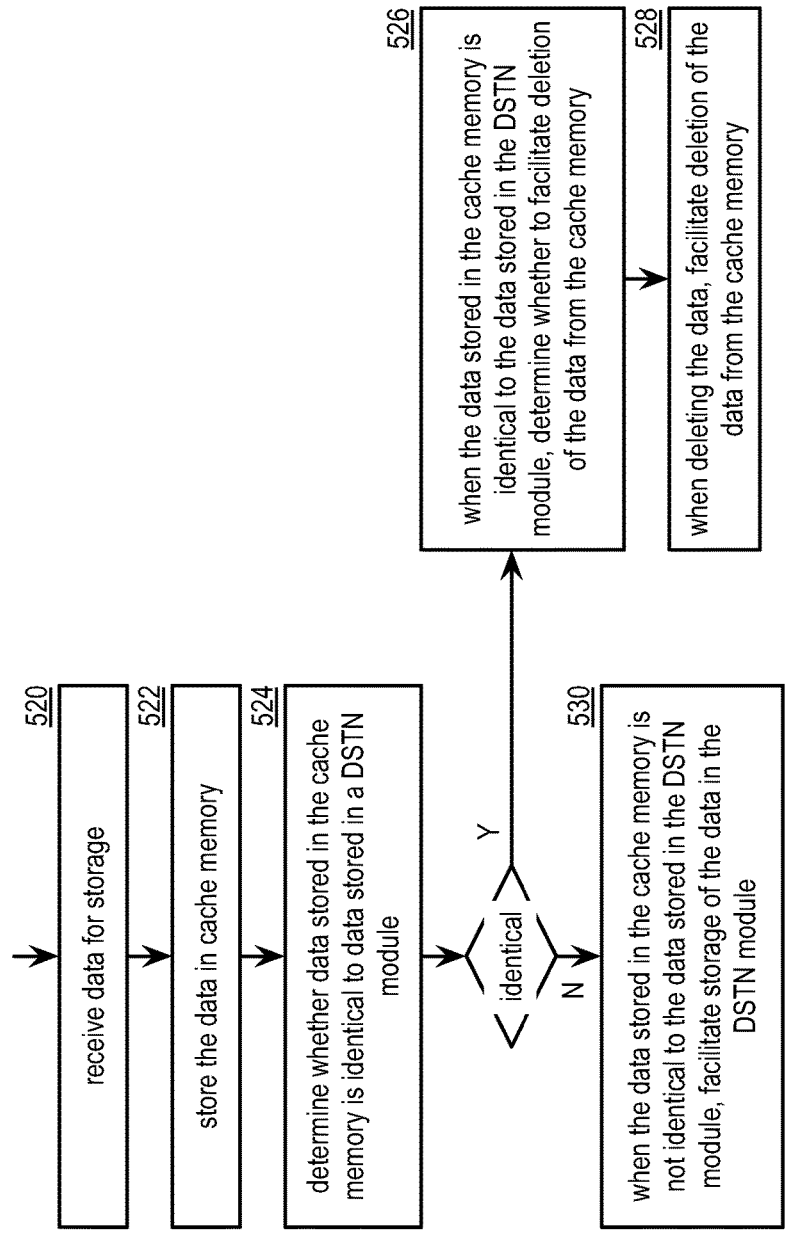
FIG. 43B is a flowchart illustrating another example of storing data in accordance with the present invention.

FIG. 43B is a flowchart illustrating another example of storing data. The method begins at step 520 where a processing module (e.g., of a distributed storage and task (DST) client module) receives data for storage. The receiving the data may include receiving a data access request that includes a store data access type and the data. The method continues at step 522 where the processing module stores the data in cache memory. The storing may include identifying a storage address and updating a storage location table to include a data identifier of the data in the storage address.

The method continues at step 524 where the processing module determines whether data stored in the cache memory is substantially the same as data stored in a dispersed storage and task network (DSTN) module. The method branches to step 530 when the processing module determines that the data stored in the cache memory is not identical to data stored in the DSTN module. The method continues to step 526 when the processing module determines that the data stored in the cache memory is substantially the same as data stored in the DSTN module.

The method continues at step 526 where the processing module determines whether to facilitate deletion of the data from the cache memory when the data stored in the cache memory is substantially the same as the data stored in the DSTN module. The determining may be based on one or more of a time period expiring since storage of the data in the DSTN module, determining that a data access frequency level is less than an access threshold, receiving a request, and a schedule. The method continues at step 528 where the processing module facilitates deletion of the data from the cache memory when deleting the data. The facilitating includes at least one of erasing the data from the cache memory, overwriting the data with random data, updating a storage location table to indicate that the data is disassociated with the cache memory, and generating a delete signal to the cache memory for the data. The method continues at step 530 where the processing module facilitates storage of the data in the DSTN module when the data stored in the cache memory is not identical to the data stored in the DSTN module (e.g., retrieve data, encode the data to produce slices, send the slices to the DSTN module for storage therein).

Figures 44A, 44B:
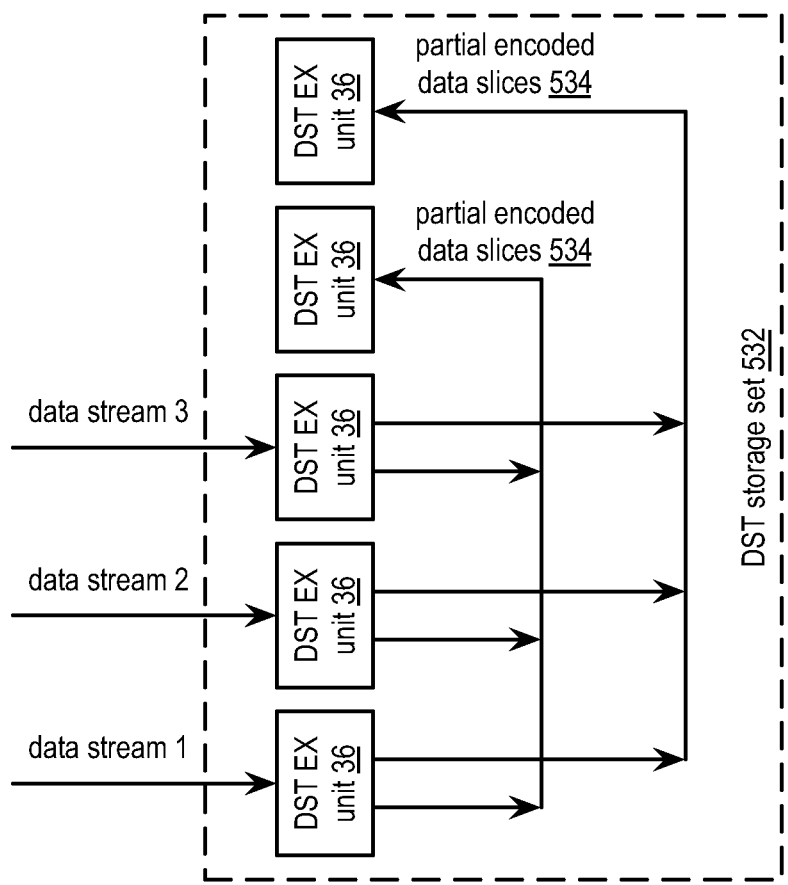
FIG. 44A is a schematic block diagram of another embodiment of a distributed computing system in accordance with the present invention.
FIG. 44B is a diagram illustrating an example of a directory in accordance with the present invention.

FIG. 44A is a schematic block diagram of another embodiment of a distributed computing system that includes a distributed storage and task (DST) storage set 532. The DST storage set 532 includes a set of DST execution units 36. The set of DST execution units 36 includes a decode threshold number of DST execution units 36 corresponding to a decode threshold number of data streams 1-3 and other DST execution units 36 corresponding to error coded data slices associated with the decode threshold number of data streams 1-3. The other DST execution units 36 includes a difference of a pillar width number and a decode threshold number of DST execution units 36. For example, the decode threshold number of DST execution units 36 includes three DST execution units 36 and the other DST execution units includes two DST execution units 36 when a decode threshold number is three and a pillar width number is five.

The decode threshold number of DST execution units 36 receive a decode threshold number of data streams 1-3 and stores data slices of the data streams 1-3. A first DST execution unit 36 of the decode threshold number of DST execution units 36 receives data stream 1, encodes data stream 1 to produce one or more slices associated with a first pillar, generates one or more slice names corresponding to the one more slices of the first pillar, and stores the one or more first pillar slices and the corresponding one more first pillar slice names (e.g., in a local memory of the first DST execution unit 36). The generating a first slice name of the one or more first pillar slice names includes generating a source name corresponding to a first set of slices that includes a first slice associated with the first slice name. A second DST execution unit 36 of the decode threshold number of DST execution units 36 receives data stream 2, encodes data stream 2 to produce one or more slices associated with a second pillar, generates one or more slice names corresponding to the one more slices of the second pillar, and stores the one or more second pillar slices and the corresponding one more second pillar slice names (e.g., in a local memory of the second DST execution unit 36). The generating of a first slice name of the one or more second pillar slice names includes obtaining the source name corresponding to the first set of slices that includes a first slice associated with the first slice name. As such, each DST execution unit 36 of the decode threshold number of DST execution units 36 utilizes a common source name for corresponding slices (e.g., ingested within a similar time period).

The generating of the source name includes generating a common source name based on at least one of a common time reference, a common group data stream identifier, and a predetermined common reference. For example, a source name is changed every 10 seconds to be substantially the same as a timestamp at the beginning of each 10 second interval. The generating of the one or more first pillar slice names includes generating a slice index associated with the first DST execution unit 36 (e.g., a pillar number) and generating a contiguously incrementing segment number entry for each segment number field of each of the one or more first pillar slice names. The generating of the one or more first pillar slice names further includes updating a directory to associate a data stream identifier and the one or more first pillar slice names. Such a directory structure is discussed in greater detail of reference to FIG. 44B.

Each DST execution unit 36 of the decode threshold number of DST execution units 36 generates a partial encoded data slice 534 for each of the one or more data slices for each of the other DST execution units 36. The generating includes generating a slice name for each partial encoded data slice corresponding to an associated error coded slice to be stored in the other DST execution units 36. The generating of a slice name of a partial encoded data slice includes utilizing the common source name and the pillar index associated with another corresponding DST execution unit 36. Each DST execution unit 36 of the decode threshold number of DST execution units 36 sends a corresponding partial encoded data slice for each of the one or more data slices for each of the other DST execution units 36 to each of the other DST execution units 36 such that each of the other DST execution units 36 may combine a decode threshold number of partial encoded data slices 534 to produce a corresponding error coded slice for storage therein.

FIG. 44B is a diagram illustrating an example of a directory 536 that includes a plurality of directory entries. An entry of the plurality of directory entries includes a data stream identifier (ID) entry of a data stream identifier field 538, a source name entry of a source name field 540, and a slice name range entry of a slice name range field 542. The data stream ID entry identifies a data stream for ingestion. The source name entry includes a source name associated with the data stream entry. The slice name range entry includes a slice name range associated with the data stream ID entry. Slice names within a slice name range share a common pillar number and include contiguously incrementing data segment identifiers. For example, a decode threshold number of data streams 1-3 are associated with a common source name of 1FF during a first time period, a slice name range of 340-440 is associated with data slices of data stream 1, a slice name range of 1340-1440 is associated with data slices of data stream 2, and a slice name range of 2340-2440 is associated with data slices of data stream 3.

Figure 44C:
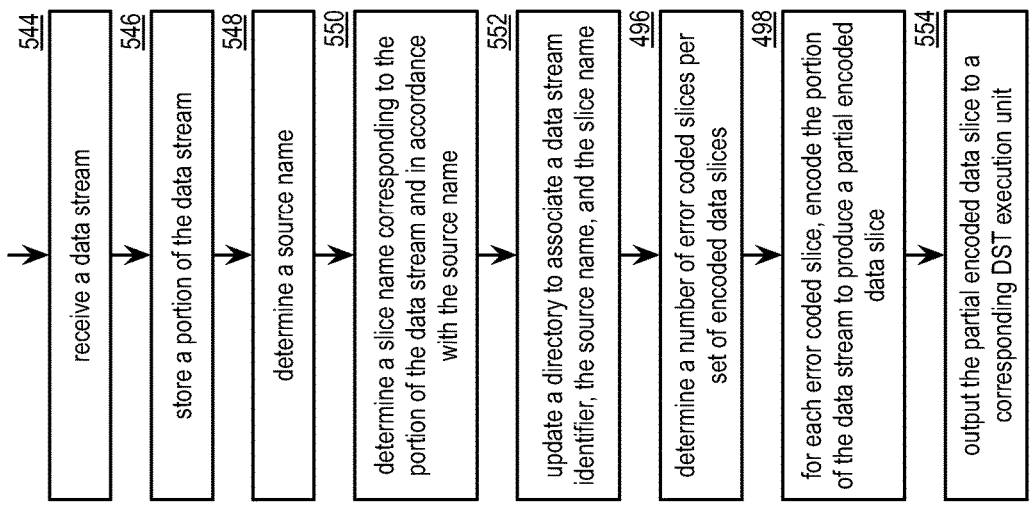
FIG. 44C is a flowchart illustrating another example of storing data in accordance with the present invention.

FIG. 44C is a flowchart illustrating another example of storing data, which include similar steps to FIG. 42. The method begins at step 544 where a processing module (e.g., of a distributed storage and task (DST) client module) receives a data stream. The method continues at step 546 where the processing module stores a portion of the data stream. For example, the processing module partitions the data stream to generate a first data slice as a first portion in accordance with a slice generation approach. The method continues at step 548 where the processing module determines a source name. The determining may be based on one or more of receiving, retrieving, and generating based on at least one of a timestamp, a list, and a deterministic function performed on a decode threshold number of data stream identifiers. For example, the processing module performs an exclusive OR (XOR) function on data stream identifiers 1-3 to produce the source name. As another example, the processing module utilizes a current timestamp that includes date, hour, and minutes as the source name. The processing module may change the source name from time to time as the data stream is ingested.

The method continues at step 550 where the processing module determines a slice name corresponding to the portion of the data stream and in accordance with the source name. For example, the processing module identifies a pillar identifier associated with the data stream to generate a slice index of the slice name. As another example, the processing module generates a segment identifier associated with a portion of a plurality of portions associated with the same data stream. For instance, the processing module generates a segment ID of 1 for a first portion of the plurality of portions associated with the same data stream and generates a segment ID of 2 for a second portion of the plurality of portions associated with the same data stream etc.

The method continues at step 552 where the processing module updates a directory to associate a data stream identifier, the source name, and the slice name. For example, the processing module generates a new entry to add to the directory that includes the data stream identifier, the source name, and a slice name range that includes the slice name when the slice name is a first slice name of the slice name range. As another example, the processing module modifies an existing entry of the directory to include a modified slice name range entry that includes a previous slice name range and the slice name. The method continues with the steps of FIG. 42 where the processing module determines a number of error coded slices per set of encoded data slices and encodes the portion of the data stream to produce a partial encoded data slice for each error coded slice. The method continues at step 554 where the processing module outputs the partial encoded data slice to a corresponding DST execution unit.

FIG. 45A is a schematic block diagram of another embodiment of a distributed computing system that includes a data interface module 556, a data transmission medium 564, a cache memory interface 558, a cache memory 560, a distributed storage and task network (DSTN) interface 562, a distributed storage and task (DST) client module 34, and a DSTN module 22. The DSTN module 22 includes a plurality of DST execution units 36. The data transmission medium 564 includes at least one of a waveguide, an optical coupler, a streaming data signals conductive wire, free space, and a closed tube signal guide.

The system functions to receive a streaming data message 566 and simultaneously store data 570 of the streaming data message 566 in the cache memory 560 and as a plurality of sets of encoded data slices 572 in the DSTN module 22. The streaming data message 566 may include one or more of data from a high-speed data link, a multimedia stream, an audio stream, a video stream, and a plurality of data streams. The data interface module 556 receives the streaming data message 566 and generates streaming data signals 568 based on the streaming data message 566. The streaming data signals 568 includes at least one of a wireless radio frequency transmission (e.g., 60 GHz), an optical frequency transmission (e.g., laser), and a multiplex of at least one of a plurality of wireless radio frequency transmissions and a plurality of optical frequency transmissions. The data interface module 556 is discussed in greater detail with reference to FIG. 45B.

The data interface module 556 outputs the streaming data signals 568 as a one-to-many transmission via the data transmission medium 564 to the cache memory interface 558 and the DSTN interface 562. The cache memory interface 560 receives the streaming data signals 568 and outputs the data 570 to the cache memory 560 for storage therein. The outputting includes controlling the cache memory 560 (e.g., activation of a write control). The cache memory interface 558 is discussed in greater detail with reference to FIG. 45C.

The DSTN interface 562 receives the streaming data signals 568 and outputs the data 570 to the DST client module 34. The outputting includes generating a storage request to facilitate storage of the data 570 in the DSTN module 22. The DSTN interface 562 is discussed in greater detail with reference to FIG. 45D. The DST client module 34 receives the data 570, encodes the data 570 utilizing a dispersed storage error coding function to produce the plurality of sets of encoded data slices 572, generates a plurality of sets of write slice requests that includes the plurality of sets of encoded data slices 572, and sends the plurality of sets of write slice requests to the DSTN module 22.

FIG. 45B is a schematic block diagram of an embodiment of a data interface module 556 that includes a data translator 574 and a data transmitter 576. The data translator 574 functions to receive a streaming data message 566 and extract data 578 from the streaming data message 566. For example, the data translator 574 identifies non-data elements (e.g., addressing, distribution instructions, permissions, credentials, addressing information) of the streaming data message 566 and discards the non-data elements to produce the data 578. As another example, the data translator 574 identifies the elements of the streaming data message 566 and extracts the data elements as the data 578. The data transmitter 576 encodes the data 578 to produce streaming data signals 568. For example, the data transmitter 576 modulates a frequency reference with the data 578 to produce a modulated frequency and up-converts the modulated frequency to a desired frequency (e.g., 60 GHz) of the streaming data signals 568. The encoding may include appending one or more of the addressing information, the permissions, the credentials, and the addressing distribution instructions.

FIG. 45C is a schematic block diagram of an embodiment of a cache memory interface 558 that includes a data receiver 580 and a memory controller 582. The data receiver 580 functions to receive streaming data signals 568 and decode data 584 from the streaming data signals 568. For example, the data receiver 580 down-converts the streaming data signals 568 from an operational frequency of the streaming data signals 568 (e.g., 60 GHz) to an intermediate frequency and demodulates the intermediate frequency to reproduce the data 584. The memory controller 582 functions to write at least some of the data 584 to a cache memory by outputting data 570 as the data 584 to the cache memory. The outputting includes activation of at least one control signal to operate the cache memory. The at least one control signal includes at least one of a write line and a write request.

FIG. 45D is a schematic block diagram of an embodiment of a distributed storage and task network (DSTN) interface 562 that includes a data receiver 580 and a DSTN controller 586. The data receiver 580 functions to receive streaming data signals 568 and decode data 588 from the streaming data signals 568. The DSTN controller 586 functions to generate at least one storage request that includes the data 588 as data 570 and to output the storage request to a distributed storage and task (DST) client module to facilitate storage of the data 570 in a DSTN module.

Figure 45E:
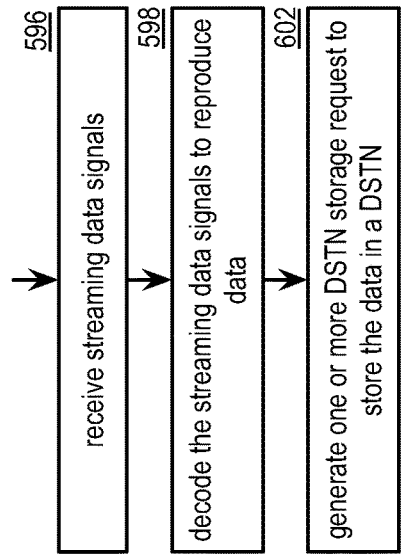
FIG. 45E is a flowchart illustrating an example of encoding data in accordance with the present invention.

FIG. 45E is a flowchart illustrating an example of encoding data. The method begins at step 590 where a processing module (e.g., of a data interface module) receives a streaming data message. The method continues at step 592 where the processing module extracts data from the streaming data message. The extracting includes at least one of identifying the data and identifying non-data. The identifying of the data and the non-data may be based on one or more of addressing information, a lookup, a predetermination, a streaming data message format, an indicator, and a query. The method continues at step 594 where the processing module encodes the data to produce streaming data signals for transmission to a plurality of memory system interfaces (e.g., modulate an intermediate frequency with the data, up-convert to an operational frequency of the streaming data signals). The plurality of memory system interfaces includes one or more of a cache memory interface and a distributed storage and task network (DSTN) interface.

Figure 45F:
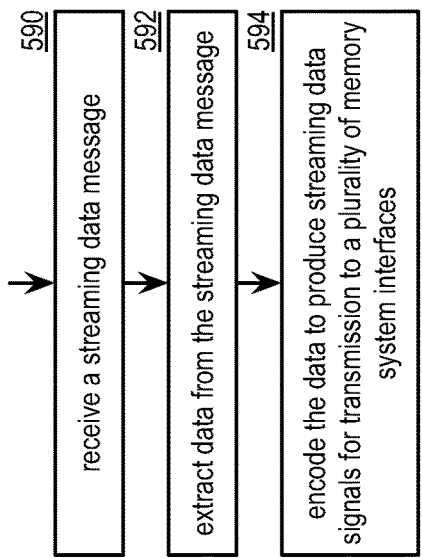
FIG. 45F is a flowchart illustrating an example of decoding streaming data signals in accordance with the present invention.

FIG. 45F is a flowchart illustrating an example of decoding streaming data signals. The method begins at step 596 where a processing module (e.g., of a cache memory interface) receives streaming data signals. The method continues at step 598 where the processing module decodes the streaming data signals to reproduce data (e.g., down-convert and operational fricassee of the streaming data signals to an intermediate fricassee, demodulate the intermediate frequency to reproduce the data). The method continues at step 600 where the processing module generates memory control signals to write the data to a cache memory. For example, the processing module activates a write control line to the cache memory.

Figure 45G:
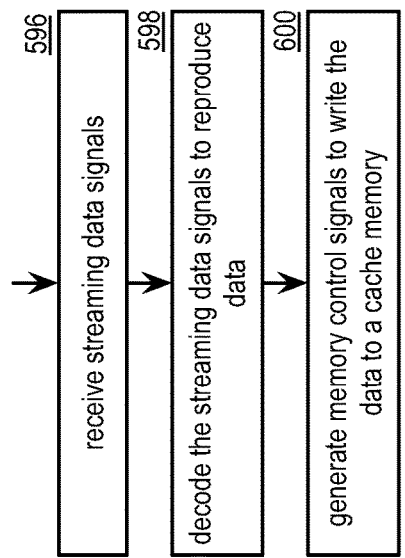
FIG. 45G is a flowchart illustrating another example of storing data in accordance with the present invention.

FIG. 45G is a flowchart illustrating another example of storing data, which includes similar steps to FIG. 45F. The method begins with steps 596 and 598 of FIG. 45F where a processing module (e.g., of a distributed storage and task network (DSTN) interface) receives streaming data signals and decodes the streaming data signals to reproduce data. The method continues at step 602 where the processing module generates one or more DSTN storage requests to facilitate storage of the data in a DSTN module. A DSTN storage request of the one or more DSTN storage requests includes at least a portion of the data.

Figure 46A:
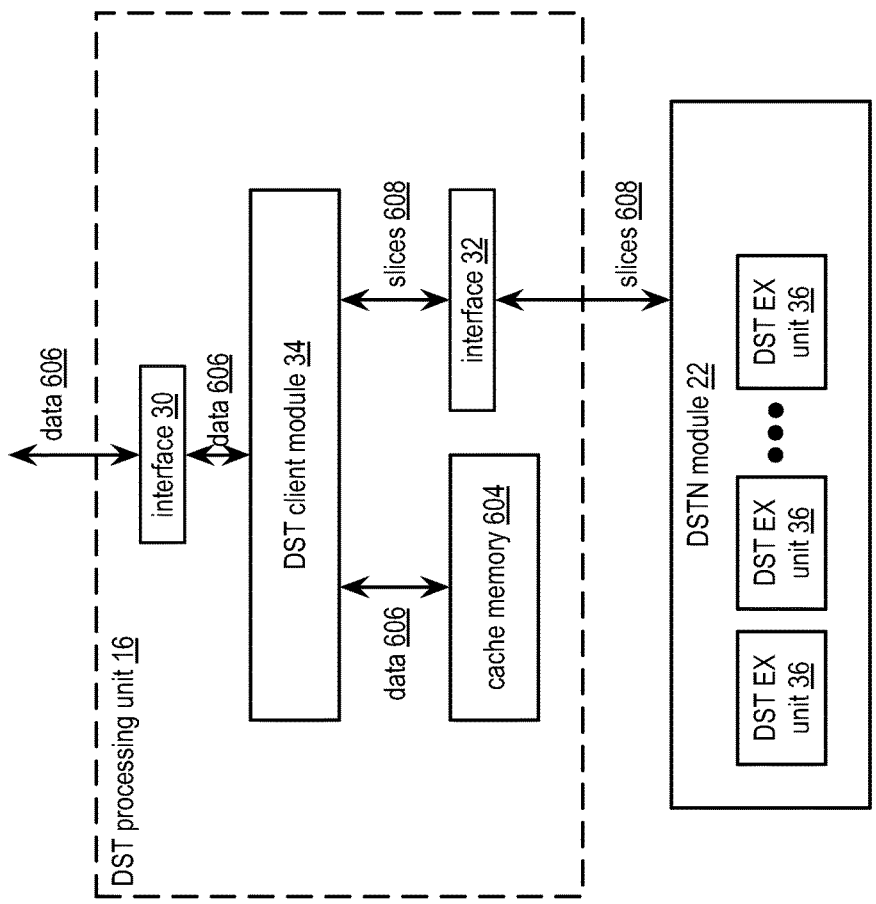
FIG. 46A is a schematic block diagram of another embodiment of a distributed computing system in accordance with the present invention.

FIG. 46A is a schematic block diagram of another embodiment of a distributed computing system that includes a distributed storage and task (DST) processing unit 16 and a distributed storage and task network (DSTN) module 22. The DST processing unit 16 includes an interface 30, a DST client module 34, a cache memory 604, and an interface 32. The cache memory 604 may be implemented utilizing one or more of a solid-state memory, an optical drive memory, and a magnetic drive memory. The DSTN module 22 includes a plurality of DST execution units 36.

The DST processing unit 16 functions to receive data 606 and facilitate storage of the data 606 in one or more of the cache memory 604 and in the DSTN module 22 as a plurality of sets of encoded data slices 608. The DST client module 34 receives the data 606 via the interface 30 and facilitate storage of the data 606 in the cache memory 604. Subsequent to storage of the data 606 in the cache memory 604, the DST client module 34 updates a directory to associate a data identifier of the data 606 with the cache memory 604. Further subsequent to storage of the data 606 in the cache memory 604, the DST client module 34 retrieves the data 606 from the cache memory 604, encodes the data 606 to produce a plurality of sets of encoded data slices 608, generates a plurality of sets of write slice requests that includes the plurality of sets of encoded data slices 608, and outputs the plurality of sets of write slice requests to the DSTN module 22 to facilitate storage of the data as the plurality of sets of encoded data slices 608 in the DSTN module 22. Subsequent to storage of the data 606 in the DSTN module 22, the DST client module 34 facilitates deletion of the data 606 from the cache memory 604. The deleting includes updating the directory to indicate a disassociation of the data identifier of the data 606 with the cache memory 604 and to indicate an association of the data identifier with the DSTN module 22.

Figure 46B:
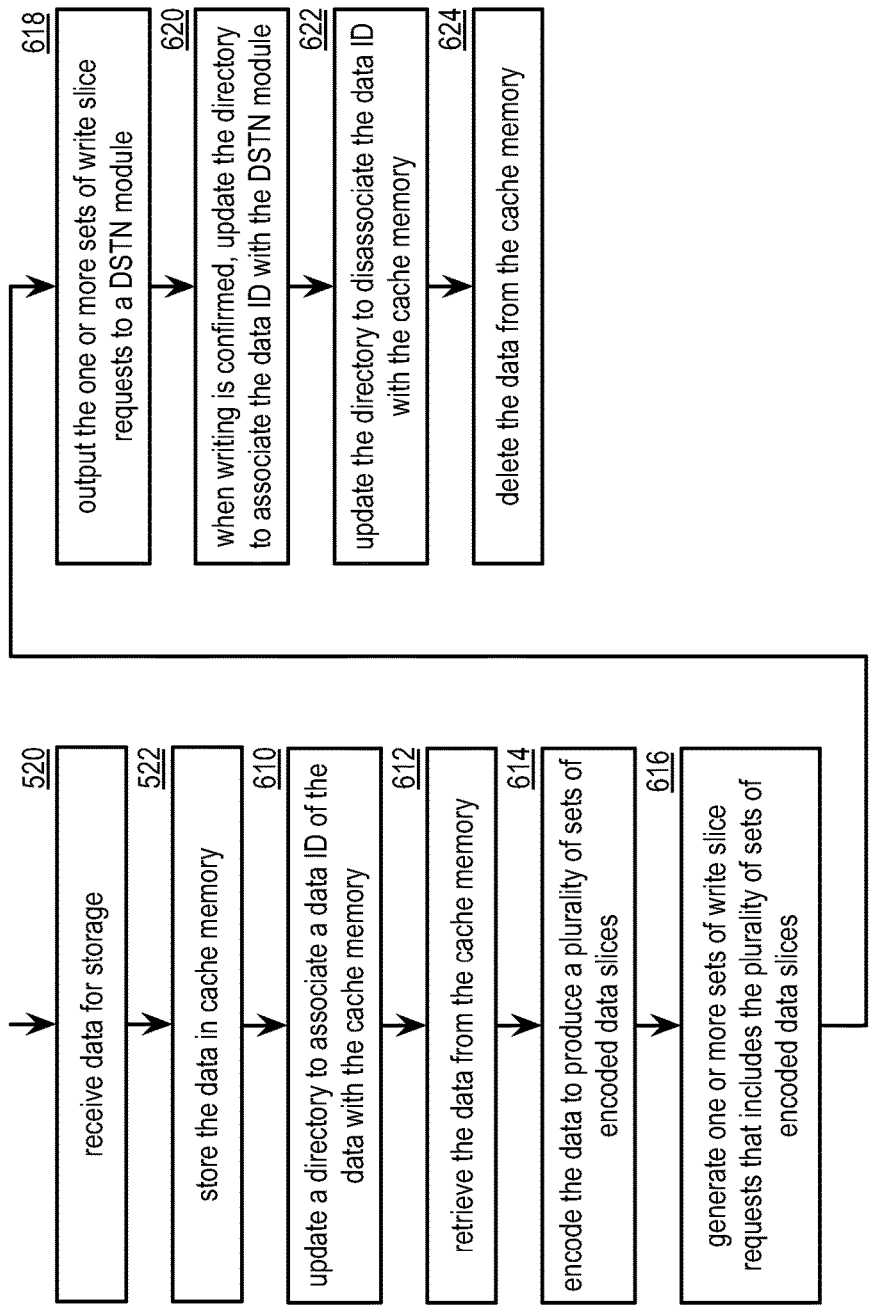
FIG. 46B is a flowchart illustrating another example of storing data in accordance with the present invention.

FIG. 46B is a flowchart illustrating another example of storing data, which includes similar steps to FIG. 43B. The method begins with steps 520 and 522 of FIG. 43B where a processing module (e.g., of a distributed storage and task (DST) client module) receives data for storage and stores the data in a cache memory. The method continues at step 610 where the processing module updates a directory to associate a data identifier (ID) of the data with the cache memory. The updating includes indicating a storage location of the cache memory (e.g., device ID, device address, offset) for the data ID. The method continues at step 612 where the processing module retrieves the data from the cache memory. The retrieving may include determining when to retrieve the data from the cache memory based on one or more of a schedule, a fixed time, when the data was stored in the cache memory, the data ID, a request, an error message, a cache memory capacity indicator, and a cache memory capacity threshold. For example, the processing module determines to retrieve the data from the cache memory 10 minutes after the data was stored in the cache memory.

The method continues at step 614 where the processing module encodes the data to produce a plurality of sets of encoded data slices utilizing a dispersed storage error coding function. The method continues at step 616 where the processing module generates one or more sets of write slice requests that includes the plurality of sets of encoded data slices. The method continues at step 618 where the processing module outputs the one or more sets of write slice requests to a distributed storage and task network (DSTN) module to facilitate storage of the data in the DSTN module as slices.

When writing to the DSTN module is confirmed, the method continues at step 620 where the processing module updates the directory to associate the data ID with the DSTN module. The processing module determines that the writing to the DSTN module is confirmed based on one or more of receiving at least a write threshold number of commit acknowledgments per set of the plurality of sets of encoded data slices, receiving a confirmation message, and a query. The method continues at step 622 where the processing module updates the directory to disassociate the data ID with the cache memory. The method continues at step 624 where the processing module facilitates deletion of the data from the cache memory.

In addition, the processing module may receive a retrieve data request that includes the data ID. The processing module identifies a storage location based on a directory lookup utilizing the data ID. When the storage location indicates that the data is stored in the cache memory, the processing module retrieves the data from the cache memory. When a storage location indicates that the data is not stored in the cache memory, the processing module retrieves the data from the DSTN module (e.g., generates read slice requests, receives slices, decodes the slices to reproduce the data).

Figure 47A:
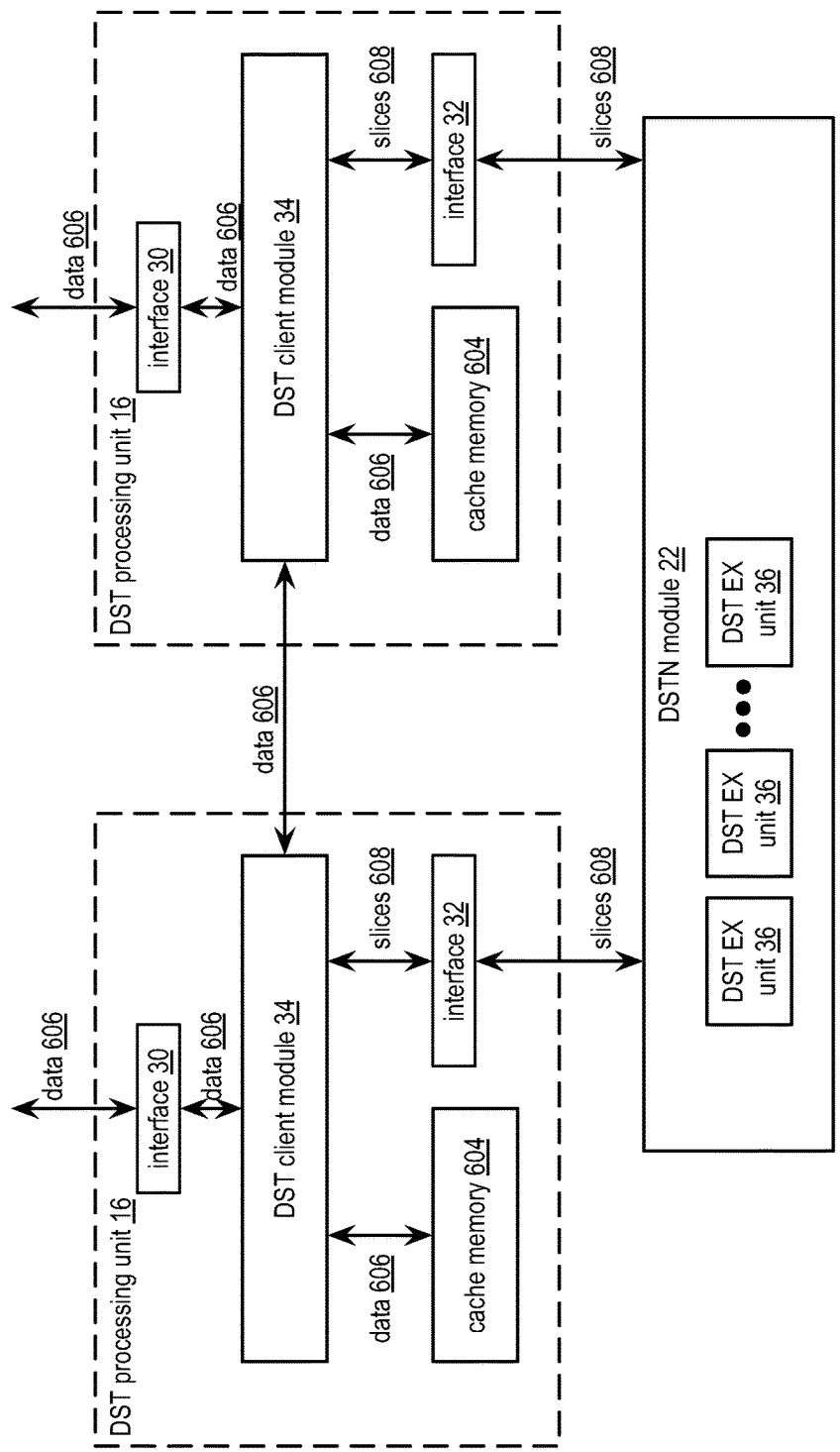
FIG. 47A is a schematic block diagram of another embodiment of a distributed computing system in accordance with the present invention.

FIG. 47A is a schematic block diagram of another embodiment of a distributed computing system that includes a first distributed storage and task (DST) processing unit 16, a second DST processing unit 16, and a distributed storage and task network (DSTN) module 22. Alternatively, the system includes more than two DST processing units 16. The first and second DST processing units 16 each includes an interface 30, a DST client module 34, a cache memory 604, and an interface 32. The DSTN module 22 includes a plurality of DST execution units 36.

The DST client module 34 of the first DST processing unit 16 receives data 606 via interface 30 and facilitate storage of the data 606 in the cache memory 604 associated with the first DST processing unit 16. The DST client module 34 of the first DST processing unit 16 updates a directory to associate a data identifier (ID) of the data 606 with an identifier of the cache memory 604 of the first DST processing unit 16. The DST client module 34 of the first DST processing unit 16 identifies the second DST processing unit 16 as associated with the data ID and sends the data 606 to the second DST processing unit 16. Alternatively, the DST client module 34 of the first DST processing unit 16 identifies a third DST processing unit 16 as associated with the data ID and sends the data 606 to the third DST processing unit 16. The identifying includes identifying a DST processing unit 16 that is associated with the data ID based on one or more of a lookup, a query, a request, a solicitation, and an error message.

When transfer is confirmed (e.g., the second DST processing unit 16 sends an acknowledgment to the first DST processing unit 16), the DST client module 34 of the first DST processing unit 16 updates a directory to associate the data ID with a cache memory identifier of the second DST processing unit 16. The DST client module 34 of the first DST processing unit 16 updates the directory to disassociate the data ID with the ID of the cache memory 604 of the first DST processing unit 16. The DST client module 34 of the first DST processing unit 16 facilitates deletion of the data 606 from the cache memory 604 of the first DST processing unit 16.

The DST client module 34 of the second DST processing unit 16 receives the data 606 and facilitates storage of the data 606 in the cache memory 604 of the second DST processing unit 16. The DST client module 34 of the second DST processing unit 16 facilitates transfer of the data 606 to the DSTN module as slices 608 and updates the directory to associate the data ID with the DSTN module 22 and to disassociate the data ID with the cache memory ID of the second DST processing unit 16. The DST client module 34 of the second DST processing unit 16 facilitates deletion of the data 606 from the cache memory 604 of the second DST processing unit 16.

Figure 47B:
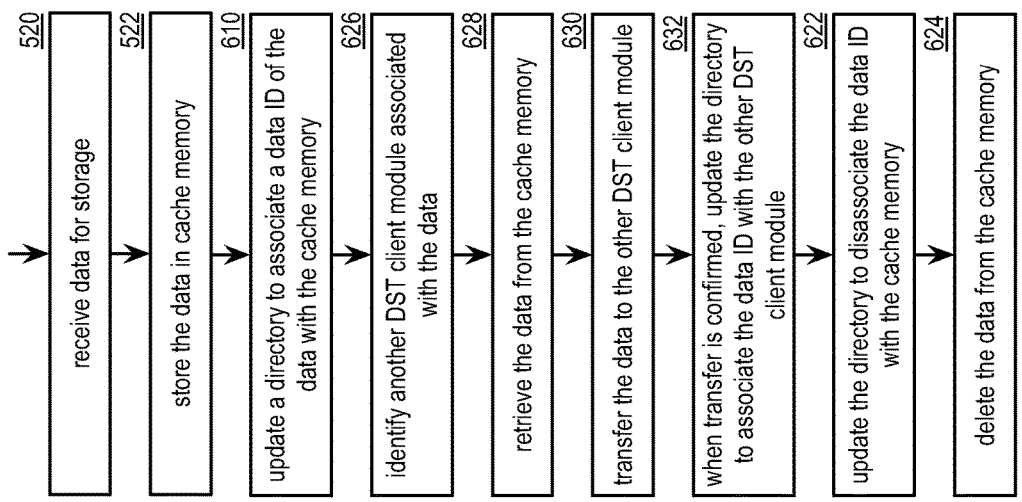
FIG. 47B is a flowchart illustrating another example of storing data in accordance with the present invention.

FIG. 47B is a flowchart illustrating another example of storing data, which includes similar steps to FIGS. 43B and 46B. The method begins with steps 520 and 522 of FIG. 43B where a processing module (e.g., of a distributed storage and task (DST) client module) receives data for storage and stores the data in cache memory. The method continues with step 610 of FIG. 46B where the processing module updates a directory to associate a data identifier (ID) of the data with the cache memory. The method continues at step 626 where the processing module identifies another DST client module associated with the data. The identifying may be based on one or more of a lookup, a query, a request, performing a deterministic function on the data ID, a random selection, a round-robin selection, and an error message.

The method continues at step 628 where the processing module retrieves the data from the cache memory. The method continues at step 630 where the processing module transfers the data to the other DST client module. When the transfer is confirmed (e.g., a time period has expired, a favorable acknowledgment has been received), the method continues at step 632 where the processing module updates the directory to associate the data ID with the other DST client module. The method continues with step 622 and 624 of FIG. 46B where the processing module updates the directory to disassociate the data ID with the cache memory and to delete the data from the cache memory.

In addition, the processing module may receive a data retrieval request that includes the data ID. The processing module identifies a storage location based on a directory lookup utilizing the data ID. The processing module retrieves the data from the storage location and outputs the data to a requesting entity. The retrieval includes generating read slice requests and decoding slices to reproduce the data when the data is not stored in the cache memory or in another cache memory.

Figure 48:
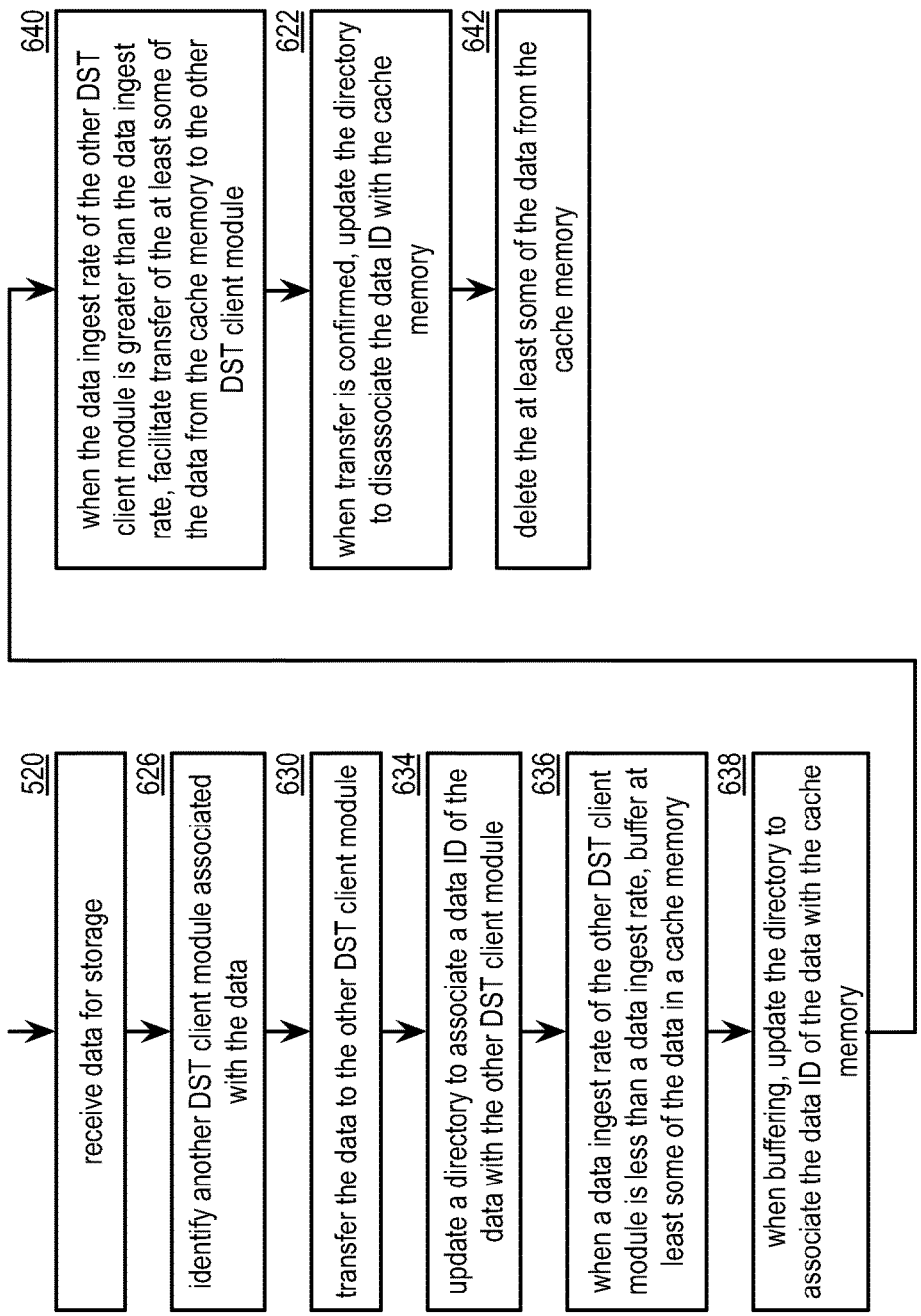
FIG. 48 is a flowchart illustrating another example of storing data in accordance with the present invention.

FIG. 48 is a flowchart illustrating another example of storing data, that includes similar steps to FIGS. 43B, 46B, and 47B. The method begins with step 520 of FIG. 43B where a processing module (e.g., of a distributed storage and task (DST) client module) receives data for storage and continues with step 626 and 630 of FIG. 47B where the processing module identifies another DST client module associated with the data and transfers the data to the other DST client module. The method continues at step 634 where the processing module updates a directory to associate a data identifier (ID) of the data with the other DST client module.

When a data ingest rate of the other DST client module is less than a data ingest rate, the method continues at step 636 where the processing module buffers at least some of the data in a cache memory. The processing module determines the data ingest rate of the other DST client module based on at least one of a query, an error message, a list, a test, and receiving the rate. The buffering includes identifying how much data buffer such that the ingest rates balance and the data interest rate of the other DST client module is greater than the data ingest rate.

When buffering, the method continues at step 638 where the processing module updates the directory to associate the data ID of the data with the cache memory. When the data ingest rate of the other DST client module is greater than the data ingest rate, the method continues at step 640 where the processing module facilitates transfer of at least some of the data from the cache memory to the other DST client module. The facilitating includes retrieving the data and sending the data to the other DST client module. When the transfer is confirmed, the method continues with step 622 of FIG. 46B where the processing module updates the directory to disassociate the data ID with the cache memory. The method continues at step 642 where the processing module deletes the at least some of the data from the cache memory.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more power connections, and one or more input(s), output(s), etc., to perform, when activated, one or more of its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is loss than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
generating, by a plurality of execution units of a dispersed storage network (DSN), a plurality of sets of a decode threshold number of encoded data slices from a plurality of data streams, wherein a first execution unit of the plurality of execution units produces a first encoded data slice for each set of the plurality of sets of the decode threshold number of encoded data slices from a first data stream of the plurality of data streams, and wherein, for a set of the plurality of sets of the decode threshold number of encoded data slices, the decode threshold number of encoded data slices is required to recover corresponding data segments of each of the plurality of data streams;
generating, by at least some of the plurality of execution units, a plurality of sets of partially encoded data slices from the plurality of a sets of a decode number of encoded data slices, wherein, when partially encoded data slices of a set of the plurality of sets of partially encoded data slices are processed, the processed partially encoded data slices represent redundancy encoded data slices, wherein the decode threshold number of encoded data slices of the set of the plurality of sets of the decode threshold number of encoded data slices combined with the redundancy encoded data slices forms a full set of encoded data slices for the corresponding data segment; and
sending, by the at least some of the plurality of execution units, the plurality of sets of partially encoded data slices to a set of execution units for storage therein.

2. The method of claim 1 further comprises:
determining, by the plurality of execution units, a common source name for the plurality of sets of the decode threshold number of encoded data slices;
generating, by the plurality of execution units, a plurality of sets of slice names for the plurality of sets of the decode threshold number of encoded data slices to include the common source name; and
generating, by the at least some of the plurality of execution units, another plurality of sets of slices names for the plurality of sets of partially encoded data slices to include the common source name.

3. The method of claim 2 further comprises:
updating a directory to associate data stream identifiers, the common source name, and ranges of slice names of the plurality of sets of slices names and the other plurality of slices names.

4. The method of claim 1 further comprises:
determining, by the plurality of execution units, a first common source name for a first portion of the plurality of sets of the decode threshold number of encoded data slices; and
determining, by the plurality of execution units, a second common source name for a second portion of the plurality of sets of the decode threshold number of encoded data slices.

5. The method of claim 1 further comprises:
receiving the plurality of data streams further by one of:
dividing a large data stream into the plurality of data streams; and
receiving the plurality of data streams from a plurality of related data sources.

6. The method of claim 1, wherein generating a partial encoded data slice of the plurality of sets of partial encoded data slices comprises:
obtaining, by an execution unit of the at least some of the plurality of execution units, an encoding matrix used in the generating of the plurality of sets of the decode threshold number of encoded data slices;
reducing, by the execution unit, the encoding matrix to a square matrix that includes rows corresponding to the decode threshold number of encoded data slices;
inverting, by the execution unit, the square matrix to produce an inverted matrix;
matrix multiplying, by the execution unit, the inverted matrix by a corresponding one of the decode threshold number of encoded data slices to produce a data vector; and
matrix multiplying, by the execution unit, the data vector with a row of the encoding matrix that corresponds to the corresponding one of the decode threshold number of encoded data slices to produce the partial encoded data slice.

7. The method of claim 1 further comprises:
dividing, by the first execution unit, the first data stream into a plurality of first data segments;
generating, by the first execution unit, a first data matrix to include a row of the plurality of first data segments;
matrix multiplying, by the first execution unit, the first data matrix with an encoding matrix to produce a first encoded matrix, wherein the first encoded data slice for each set of the plurality of sets of the decode threshold number of encoded data slices corresponds to data block of the first encoded matrix; and
storing, by the first execution unit, the first encoded data slice for each set of the plurality of sets of the decode threshold number of encoded data slices.

8. The method of claim 7 further comprises:
dividing, by a second execution unit of the plurality of execution units, a second data stream of the plurality of data streams into a plurality of second data segments;
generating, by the second execution unit, a second data matrix to include a row of the plurality of second data segments;
matrix multiplying, by the second execution unit, the second data matrix with the encoding matrix to produce a second encoded matrix, wherein second encoded data slice for each set of the plurality of sets of the decode threshold number of encoded data slices corresponds to data block of the second encoded matrix; and
storing, by the second execution unit, the second encoded data slice for each set of the plurality of sets of the decode threshold number of encoded data slices.

9. A dispersed storage system comprises:
a first module in execution units of a plurality of execution units, operable to cause the plurality of execution units to:
generate a plurality of sets of a decode threshold number of encoded data slices from a plurality of data streams, wherein a first execution unit of the plurality of execution units produces a first encoded data slice for each set of the plurality of sets of the decode threshold number of encoded data slices from a first data stream of the plurality of data streams, and wherein, for a set of the plurality of sets of the decode threshold number of encoded data slices, the decode threshold number of encoded data slices is required to recover corresponding data segments of each of the plurality of data streams;

a second module that, when operable in at least some of the plurality of execution units, causes the at least some of the plurality of execution units to:
generate a plurality of sets of partially encoded data slices from the plurality of a sets of a decode number of encoded data slices, wherein, when partially encoded data slices of a set of the plurality of sets of partially encoded data slices are processed, the processed partially encoded data slices represent redundancy encoded data slices, wherein the decode threshold number of encoded data slices of the set of the plurality of sets of the decode threshold number of encoded data slices combined with the redundancy encoded data slices forms a full set of encoded data slices for the corresponding data segment; and a third module that, when operable in the at least some of the plurality of execution units, causes the at least some of the plurality of execution units to:
send the plurality of sets of partially encoded data slices to a set of execution units for storage therein.

10. The dispersed storage system of claim 9 further comprises:
a fourth module that, when operable in the plurality of execution units, causes the plurality of execution units to:
determine a common source name for the plurality of sets of the decode threshold number of encoded data slices;
generate a plurality of sets of slice names for the plurality of sets of the decode threshold number of encoded data slices to include the common source name; and
generate another plurality of sets of slices names for the plurality of sets of partially encoded data slices to include the common source name.

11. The dispersed storage system of claim 10, wherein the fourth module that, when operable in the plurality of execution units, further causes the plurality of execution units to:
update a directory to associate data stream identifiers, the common source name, and ranges of slice names of the plurality of sets of slices names and the other plurality of slices names.

12. The dispersed storage system of claim 10, wherein the first module that, when operable in the first execution unit, further causes the first execution unit to:
divide the first data stream into a plurality of first data segments;
generate a first data matrix to include a row of the plurality of first data segments;
matrix multiply the first data matrix with an encoding matrix to produce a first encoded matrix, wherein first encoded data slice for each set of the plurality of sets of the decode threshold number of encoded data slices corresponds to data block of the first encoded matrix; and
store the first encoded data slice for each set of the plurality of sets of the decode threshold number of encoded data slices.

13. The dispersed storage system of claim 12, wherein the first module that, when operable in a second execution unit of the plurality of execution units, further causes the second execution unit to:
divide a second data stream of the plurality of data streams into a plurality of second data segments;
generate a second data matrix to include a row of the plurality of second data segments;
matrix multiply the second data matrix with the encoding matrix to produce a second encoded matrix, wherein second encoded data slice for each set of the plurality of sets of the decode threshold number of encoded data slices corresponds to data block of the second encoded matrix; and
store the second encoded data slice for each set of the plurality of sets of the decode threshold number of encoded data slices.

14. The dispersed storage system of claim 9 further comprises:
a fourth module that, when operable in the plurality of execution units, causes the plurality of execution units to:
determine a first common source name for a first portion of the plurality of sets of the decode threshold number of encoded data slices; and
determine a second common source name for a second portion of the plurality of sets of the decode threshold number of encoded data slices.

15. The dispersed storage system of claim 9 further comprises:
a fourth module that, when operable in the plurality of execution units, causes the plurality of execution units to:
receive the plurality of data streams further by one of:
dividing a large data stream into the plurality of data streams; and
receiving the plurality of data streams from a plurality of related data sources.

16. The dispersed storage system of claim 9, wherein the third module that, when operable in an execution unit of the at least some of the plurality of execution units, further causes the execution unit to generate the partial encoded data slice of the plurality of sets of partial encoded data slices by:
obtaining an encoding matrix used in the generating of the plurality of sets of the decode threshold number of encoded data slices;
reducing the encoding matrix to a square matrix that includes rows corresponding to the decode threshold number of encoded data slices;
inverting the square matrix to produce an inverted matrix;
matrix multiplying the inverted matrix by a corresponding one of the decode threshold number of encoded data slices to produce a data vector; and
matrix multiplying the data vector with a row of the encoding matrix that corresponds to the corresponding one of the decode threshold number of encoded data slices to produce the partial encoded data slice.

* * * * *